United States Patent
Yoon et al.

(10) Patent No.: US 11,535,637 B2
(45) Date of Patent: Dec. 27, 2022

(54) COMPOUND AND ORGANIC LIGHT EMITTING ELEMENT COMPRISING SAME

(71) Applicant: LG CHEM, LTD., Seoul (KR)

(72) Inventors: Hongsik Yoon, Daejeon (KR); Yujin Kang, Daejeon (KR); Wanpyo Hong, Daejeon (KR); Sang Duk Suh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 457 days.

(21) Appl. No.: 16/643,721

(22) PCT Filed: Dec. 26, 2018

(86) PCT No.: PCT/KR2018/016650
§ 371 (c)(1),
(2) Date: Mar. 2, 2020

(87) PCT Pub. No.: WO2019/132506
PCT Pub. Date: Jul. 4, 2019

(65) Prior Publication Data
US 2020/0216475 A1 Jul. 9, 2020

(30) Foreign Application Priority Data
Dec. 26, 2017 (KR) ........................ 10-2017-0179561

(51) Int. Cl.
*C07F 5/02* (2006.01)
*H01L 51/00* (2006.01)
*C09K 11/06* (2006.01)
*H01L 51/50* (2006.01)

(52) U.S. Cl.
CPC ................ *C07F 5/02* (2013.01); *C07F 5/027* (2013.01); *C09K 11/06* (2013.01); *H01L 51/008* (2013.01); *H01L 51/0072* (2013.01); *H01L 51/0073* (2013.01); *H01L 51/0074* (2013.01); *H01L 51/5012* (2013.01)

(58) Field of Classification Search
None
See application file for complete search history.

(56) References Cited

U.S. PATENT DOCUMENTS

| 7,274,141 B2 | 9/2007 | Leo et al. |
| 2005/0170204 A1 | 8/2005 | Vargas et al. |
| 2014/0058099 A1 | 2/2014 | Wakamiya et al. |

FOREIGN PATENT DOCUMENTS

| JP | 2008227088 | 9/2008 |
| JP | 2008270395 | 11/2008 |
| JP | 2009033067 | 2/2009 |
| JP | 5615261 | 10/2014 |
| KR | 20060133566 | 12/2006 |
| KR | 20140013001 | 2/2014 |
| WO | 2003012890 | 2/2003 |

OTHER PUBLICATIONS

Machine translated English version of WO 2010/104047 A, Takuji Hatakeyama et al., Sep. 16, 2010 (Year: 2010).*
Miyamoto et al., "Synthesis of Boron-Doped Polycyclic Aromatic Hydrocarbons by Tandem Intramolecular Electrophilic Arene Borylation," Org. Lett. 17(24):6158-6161 (2015).
Schickedanz et al., "A boron-doped helicene as a highly soluble, benchtop-stable green emitter," Chem. Commun. 51:15808-15810 (2015).

* cited by examiner

*Primary Examiner* — Dylan C Kershner
*Assistant Examiner* — Seokmin Jeon
(74) *Attorney, Agent, or Firm* — Dentons US LLP

(57) ABSTRACT

Provided are boron-containing polycyclic compounds of Chemical Formula 1:

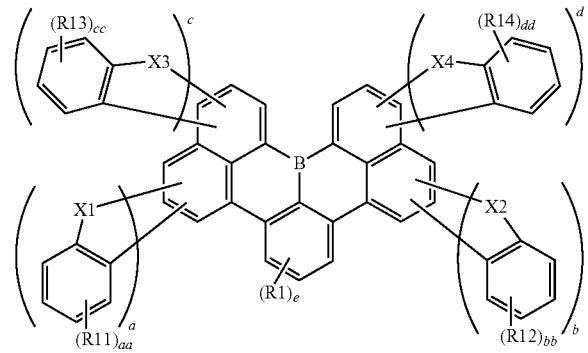

wherein X1 to X4 are identical to or different from one another and are each independently O, S, NR2 or CR3R4, and a to d are each 0 or 1, with the proviso that 1≤a+b+c+d, and the other substituents are as described in the specification. The compounds have a high electron accepting ability and excellent heat resistance, and can be highly purified by sublimation purification due to their high sublimation temperature. The compounds can form a stable interface with an electrode or an adjacent organic material layer of an organic light emitting device. Also provided is an organic light emitting device including the compound of Chemical Formula 1. The compound can lower driving voltage and lengthen lifetime of the organic light emitting device.

11 Claims, 1 Drawing Sheet

【FIG. 1】
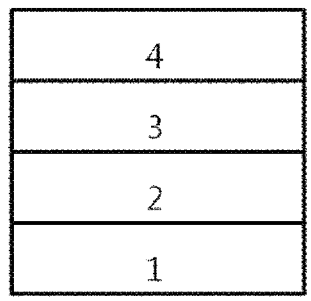
【FIG. 2】
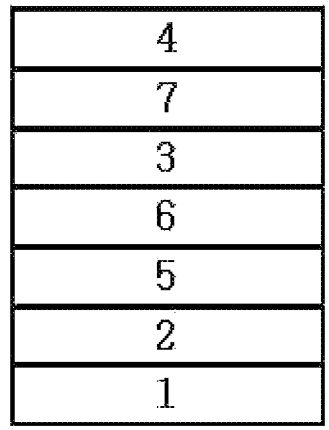
【FIG. 3】
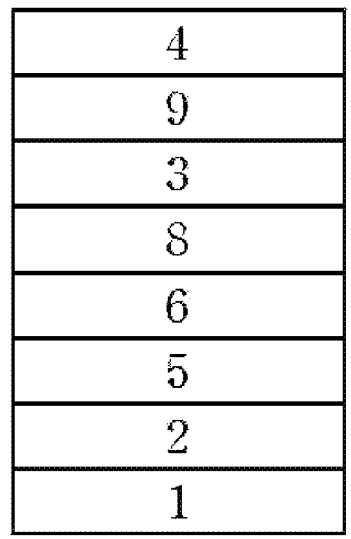

COMPOUND AND ORGANIC LIGHT EMITTING ELEMENT COMPRISING SAME

CROSS-REFERENCE TO RELATED APPLICATIONS

This application is a National Stage Application of International Application No. PCT/KR2018/016650 filed on Dec. 26, 2018, which claims priority to and the benefit of Korean Patent Application No. 10-2017-0179561, filed with the Korean Intellectual Property Office on Dec. 26, 2017, the entire contents of which are incorporated herein by reference.

TECHNICAL FIELD

The present specification relates to a compound and an organic light emitting device including the same.

BACKGROUND

An organic light emitting device has a configuration in which an organic thin film is disposed between two electrodes. Upon application of a voltage to such an organic light emitting device with a configuration, holes and electrons injected from two electrodes are combined and paired in an organic thin film. When such electron-pair pairs are decayed, light is emitted. The organic thin film can have a single or multiple layer structure, if necessary.

Materials for organic thin films can have a light emission function, if necessary. For example, a material for organic thin films can be a compound capable of forming a light emitting layer alone, or a compound capable of serving as a host or a dopant of a host-dopant-based light emitting layer. In addition, the material for organic thin films can be a compound capable of performing a function such as a hole injection, hole transport, electron blocking, hole blocking, electron transport or electron injection function.

There is a continuous demand for development of materials for organic thin films in order to improve the performance, lifetime or efficiency of an organic light emitting device.

BRIEF DESCRIPTION

Technical Problem

The present specification is directed to providing a compound and an organic light emitting device including the same.

Technical Solution

One embodiment of the present specification provides a compound of Chemical Formula 1:

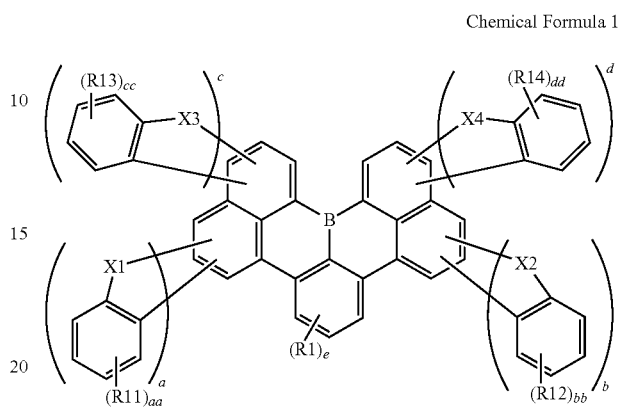

Chemical Formula 1 wherein:

X1 to X4 are identical to or different from one another and are each independently O, S, NR2 or CR3R4, and a to d are each 0 or 1, with the proviso that 1≤a+b+c+d;

R1 and R11 to R14 are identical to or different from one another and are each independently hydrogen, deuterium, a nitrile group, a substituted or unsubstituted alkyl group, a substituted or unsubstituted cycloalkyl group, a substituted or unsubstituted aryl group, or a substituted or unsubstituted heterocyclic group;

e is an integer of 0 to 3, wherein, when e is 2 or more, each R1 is identical to or different from each other;

aa, bb, cc and dd are each an integer of 0 to 4, wherein, when aa, bb, cc and dd are 2 or more, the substituents in parentheses are identical to or different from one another;

R2 is a substituted or unsubstituted aryl group or a substituted or unsubstituted heterocyclic group; and R3 and R4 are identical to or different from each other and are each independently a substituted or unsubstituted alkyl group, a substituted or unsubstituted aryl group, or a substituted or unsubstituted heterocyclic group.

In addition, another embodiment of the present specification provides an organic light emitting device including: a first electrode; a second electrode facing the first electrode; and at least one organic material layer interposed between the first electrode and the second electrode, wherein the at least one organic material layer contains the compound described above.

Advantageous Effects

The compound according to an embodiment of the present specification can be used as a material for an organic material layer in an organic light emitting device. The compound according to at least one embodiment of the present specification can advantageously improve efficiency, and low driving voltage and lifetime characteristics of the organic light emitting device. In particular, the compound according to an embodiment of the present specification can be used as a material for an organic material layer between electrodes.

More specifically, the compound according to an embodiment of the present specification has a structure having a high electron accepting ability and is excellent in heat resistance, so that an appropriate deposition temperature can be maintained in the fabrication of an organic light emitting device. In addition, the compound can be highly purified by a sublimation purification method due to high sublimation temperature, and does not contaminate a film forming machine for deposition or an organic light emitting element in the process of fabricating organic light emitting devices.

DESCRIPTION OF DRAWINGS

FIG. 1 illustrates an example of an organic light emitting device in which a substrate 1, an anode 2, a light emitting layer 3 and a cathode 4 are sequentially laminated;

FIG. 2 illustrates an organic light emitting device in which a substrate 1, an anode 2, a hole injection layer 5, a hole transport layer 6, a light emitting layer 3, an electron transport layer 7 and a cathode 4 are sequentially laminated; and FIG. 3 illustrates an organic light emitting device in which a substrate 1, an anode 2, a hole injection layer 5, a hole transport layer 6, an electron blocking layer 8, a light emitting layer 3, an electron injection and transport layer 9 and a cathode 4 are sequentially laminated.

1: Substrate
2: Anode
3: Light emitting layer
4: Cathode
5: Hole injection layer
6: Hole transport layer
7: Electron transport layer
8: Electronic blocking layer
9: Electron injection and transport layer

DETAILED DESCRIPTION

Hereinafter, the present specification will be described in more detail.

An embodiment of the present specification provides the compound of Chemical Formula 1 above.

In the present specification, compounds having various energy bandgaps can be synthesized by introducing various substituents into the core structure as described above. Typically, it is easy to control the energy band gap by introducing a substituent into a core structure having a large energy band gap. On the other hand, when a core structure has a small energy band gap, it is difficult to control the energy band gap by introduction of a substituent. In addition, in the present specification, the HOMO and LUMO energy levels of the compound can be controlled by introducing various substituents into the core structure as described above.

In addition, a compound having the intrinsic characteristics of substituent introduced can be synthesized by introducing various substituents into the core structure as described above. For example, a material satisfying the requirements of each organic material layer can be synthesized by introducing, into the core structure, substituents mainly used for a hole injection layer material, a hole transport material, a light emitting layer material and an electron transport layer material utilized for the fabrication of organic light emitting devices.

Accordingly, the present inventors have found that the compound having such characteristics can lower driving voltage and lengthen lifetime, when applied to a material for an organic light emitting device, in particular, a light emitting layer. In addition, the compound can be more easily deposited, compared to a material having a low molecular weight and a high sublimation property, and can form a stable interface with an electrode or an adjacent organic material layer.

According to the present specification, examples of substituents will be described below, but the present specification is not limited thereto.

The term "substitution" means that a hydrogen atom bonded to a carbon atom of a compound is changed to another substituent, and the position of substitution is not limited as long as it is a position at which the hydrogen atom is substituted, that is, a position at which a substituent can substitute, and when two or more substituents substitute, the two or more substituents can be identical to or different from each other.

The term "substituted or unsubstituted" in the present specification means being substituted by one or more substituents selected from the group consisting of deuterium, a halogen group, a nitrile group, a nitro group, an alkyl group, a cycloalkyl group, a silyl group, an amine group, an aryl group, and a heteroaryl group, or being substituted by a substituent linking two or more substituents among the substituents illustrated above, or having no substituents. For example, "a substituent linking two or more substituents" can be a biphenyl group. That is, the biphenyl group can be an aryl group or can be construed as a substituent linking two phenyl groups.

In the present specification, examples of the halogen group include fluorine, chlorine, bromine and iodine.

In the present specification, the alkyl group can be linear or branched, or the number of carbon atoms of the alkyl group is not particularly limited, but is preferably 1 to 50. Specifically, examples of the alkyl group include, but are not limited to, methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, 5-methylhexyl and the like.

In the present specification, the cycloalkyl group is not particularly limited and the number of carbon atoms thereof is preferably 3 to 30. Specifically, examples of the cycloalkyl group include, but are not limited to, cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butyl-cyclohexyl, cycloheptyl, cyclooctyl and the like.

In the present specification, specifically, examples of the silyl group include, but are not limited to, a trimethylsilyl group, a triethylsilyl group, a t-butyl-dimethylsilyl group, a vinyldimethylsilyl group, a propyl-dimethylsilyl group, a triphenylsilyl group, a diphenylsilyl group, a phenylsilyl group and the like.

In the present specification, specifically, the amine group can be selected from the group consisting of $-NH_2$, a monoalkylamine group, a dialkylamine group, an N-alkylarylamine group, a monoarylamine groups, a diarylamine group, an N-arylheteroarylamine group, an N-alkyl-heteroarylamine group, a monoheteroarylamine group, and a diheteroarylamine group. The number of carbon atoms of the cycloalkyl group is not particularly limited and is preferably 1 to 30. Specifically, examples of the amine group include, but are not limited to, a methylamine group, a dimethylamine group, an ethylamine group, a diethylamine group, a phenylamine group, a naphthylamine group, a biphenylamine group, an anthracenyl-amine group, a 9-methyl-anthracenylamine group, a diphenylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenyl-phenanthrenylamine group; an N-biphenyl-phenanthrenylamine group, an N-phenylfluorenylamine group, an N-phenylterphenylamine group, an N-phenanthrenyl-fluorenylamine group, an N-biphenyl-fluorenylamine group and the like.

When the aryl group is a monocyclic aryl group, the number of carbon atoms thereof is not particularly limited, but is preferably 6 to 30. Specifically, examples of the monocyclic aryl group include, but are not limited to, a phenyl group, a biphenyl group, a terphenyl group and the like.

When the aryl group is a polycyclic aryl group, the number of carbon atoms thereof is not particularly limited, but is preferably 10 to 24. Specifically, examples of the polycyclic aryl group include, but are not limited to, a naphthyl group, an anthracenyl group, a phenanthryl group, a pyrenyl group, a perylenyl group, a chrysenyl group, a fluorenyl group and the like.

In the present specification, the heterocyclic group includes at least one heteroatom, which is an atom excluding carbon. Specifically, the heteroatom can include at least one selected from the group consisting of N, O, Se, Si and S. The number of carbon atoms of the heterocyclic group is not particularly limited, but is preferably 2 to 60, or 2 to 30. Examples of the heterocyclic group include, but are not limited to, a thiophene group, a furanyl group, a pyrrolyl group, an imidazolyl group, a thiazolyl group, an oxazolyl group, an oxadiazolyl group, a triazolyl group, a pyridyl group, a bipyridyl group, a pyrimidyl group, a triazinyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a dibenzocarbazolyl group, a benzothiophenyl group, a dibenzothiophenyl group, a benzofuranyl group, a dibenzofuranyl group, a benzosilolyl group, a dibenzosilolyl group, a phenanthrolinyl group, an isoxazolyl group, a thiadiazolyl group, a phenothiazinyl group,
a phenoxazinyl group

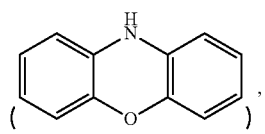

a dihydrodibenzazepine group

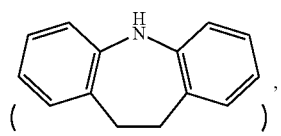

and condensates thereof.

In the present specification, the "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, among substituents, "adjacent groups are bonded together to form a ring" can mean that adjacent groups are bonded together to form a substituted or unsubstituted hydrocarbon ring, or a substituted or unsubstituted heterering.

In an embodiment of the present specification, Chemical Formula 1 given above can be any one of the following Chemical Formulae 2 to 7:

Chemical Formula 2

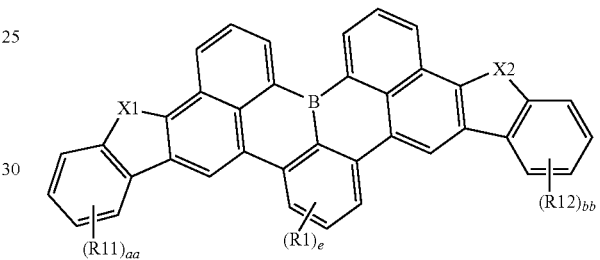

Chemical Formula 3

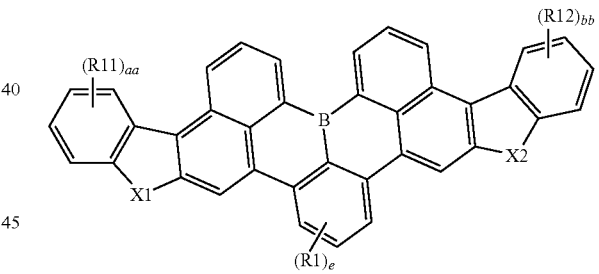

Chemical Formula 4

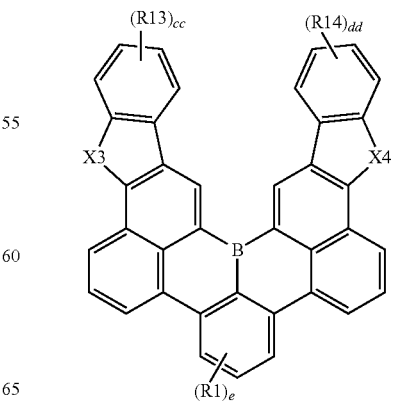

Chemical Formula 5
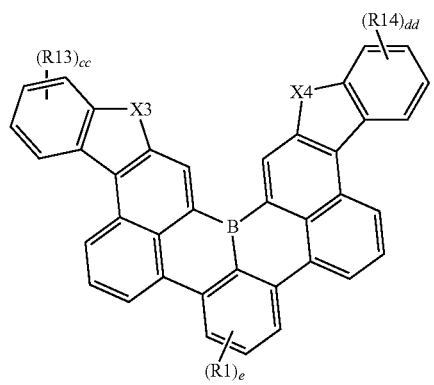
Chemical Formula 6
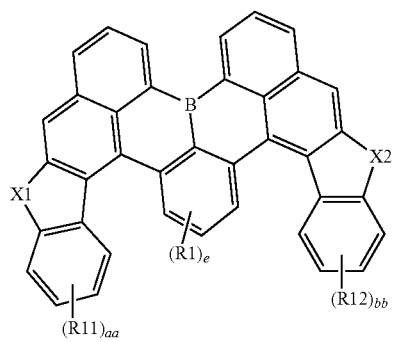
Chemical Formula 7
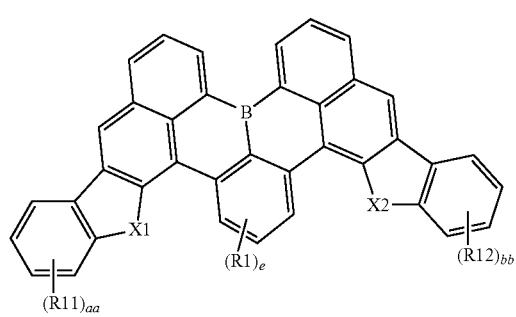
In Chemical Formulae 2 to 7, X1 to X4, R1, R11 to R14, aa, bb, cc, dd and e are defined as in Chemical Formula 1 above.
In an embodiment of the present specification, Chemical Formula 1 given above can be any one of the following Chemical Formulae 8 to 12:
Chemical Formula 8
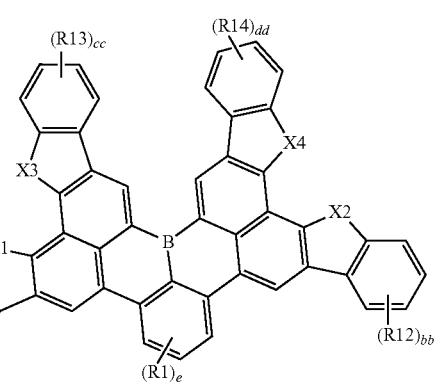
Chemical Formula 9
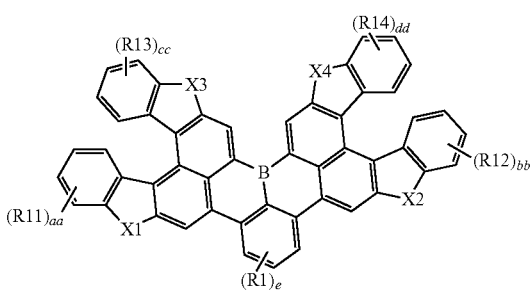
Chemical Formula 10
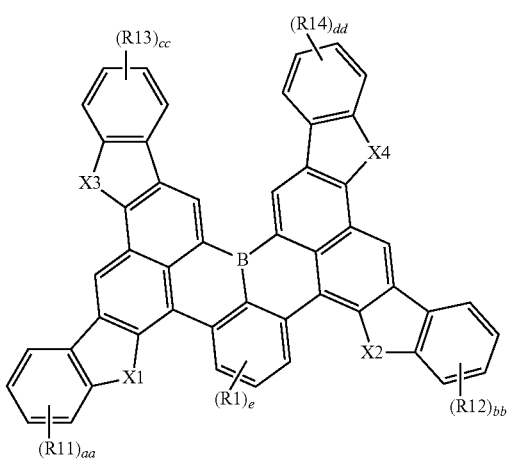
Chemical Formula 11
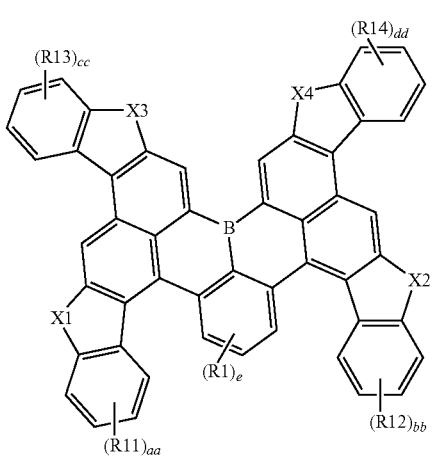

-continued

Chemical Formula 12

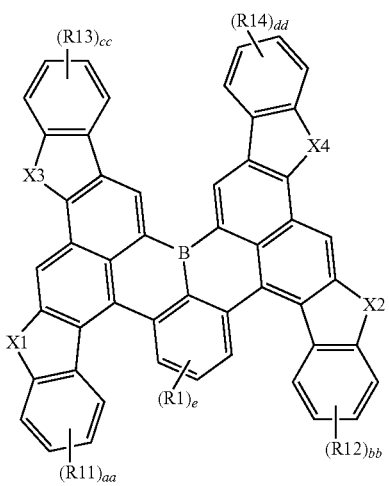

In Chemical Formulae 8 to 12, X1 to X4, R1, R11 to R14, aa, bb, cc, dd and e are defined as in Chemical Formula 1 above.

In an embodiment of the present specification, Chemical Formula 1 is the following Chemical Formula 1-1:

Chemical Formula 1-1

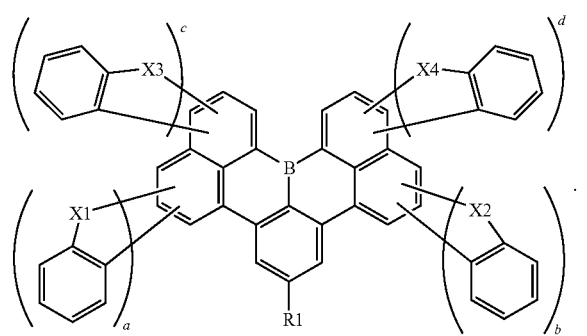

In Chemical Formula 1-1, X1 to X4, R1 and a to d are defined as in Chemical Formula 1 above.

In one embodiment of the present specification, R1 is hydrogen, a substituted or unsubstituted alkyl group, or a nitrile group.

In one embodiment of the present specification, R1 is hydrogen, a substituted or unsubstituted alkyl group having 1 to carbon atoms, or a nitrile group.

In one embodiment of the present specification, R1 is hydrogen, a substituted or unsubstituted alkyl group having 1 to 10 carbon atoms, or a nitrile group.

In one embodiment of the present specification, R1 is hydrogen, a methyl group, an ethyl group, a propyl group, a butyl group, or a nitrile group.

In one embodiment of the present specification, R1 is hydrogen, a methyl group, a tert-butyl group or a nitrile group.

In one embodiment of the present specification, X1 to X4 are identical to or different from one another and are each independently O, S, NR2, or CR3R4, R2 is an aryl group substituted or unsubstituted by a deuterium, a nitrile group or an alkyl group, and R3 and R4 are an alkyl group or an aryl group.

In one embodiment of the present specification, X1 to X4 are identical to or different from one another and are each independently O, S, NR2, or CR3R4, R2 is an aryl group substituted or unsubstituted by a deuterium, a nitrile group or an alkyl group, and R3 and R4 are an alkyl group.

In one embodiment of the present specification, X1 to X4 are identical to or different from one another and are each independently O, S, NR2, or CR3R4, R2 is a phenyl group substituted or unsubstituted by deuterium, a nitrile group, a methyl group, or a butyl group; or a naphthyl group substituted or unsubstituted by a deuterium, a nitrile group, a methyl group or a butyl group; and R3 and R4 are a methyl group or a phenyl group.

In one embodiment of the present specification, X1 to X4 are identical to or different from one another and are each independently O, S, NR2, or CR3R4, R2 is a phenyl group substituted or unsubstituted by deuterium, a nitrile group, a methyl group or a butyl group, and R3 and R4 are methyl groups.

In one embodiment of the present specification, X1 to X4 are identical to or different from one another and are each independently O, S, NR2, or CR3R4, R2 is a phenyl group substituted or unsubstituted by deuterium, a nitrile group or a tert-butyl group, and R3 and R4 are methyl groups.

In one embodiment of the present specification, R2 is a phenyl group substituted or unsubstituted by a deuterium, a nitrile group, or an alkyl group.

In one embodiment of the present specification, R2 is a phenyl group substituted or unsubstituted by a deuterium, a nitrile group, or a butyl group.

In one embodiment of the present specification, R3 and R4 are methyl groups.

In one embodiment of the present specification, the compound of Chemical formula 1 is selected from the following compounds:

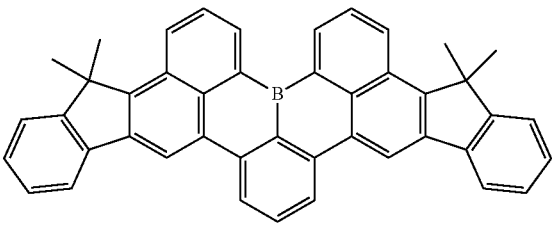

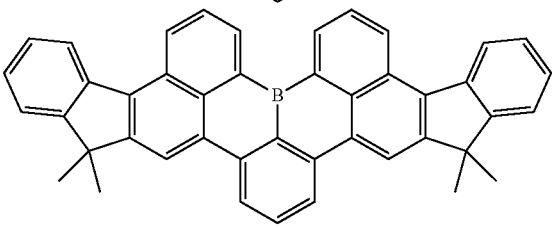

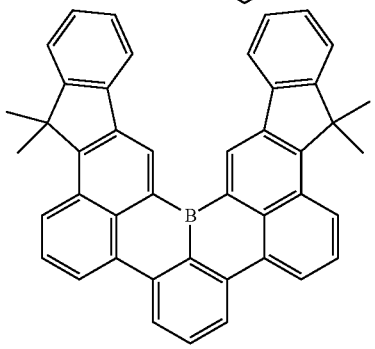

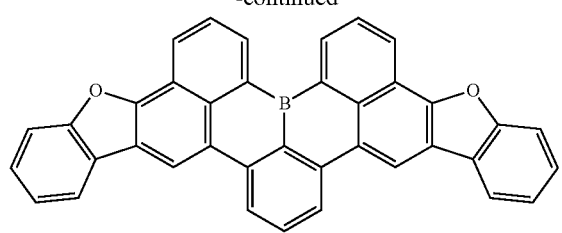
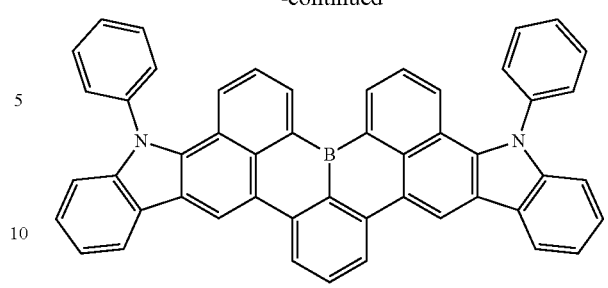
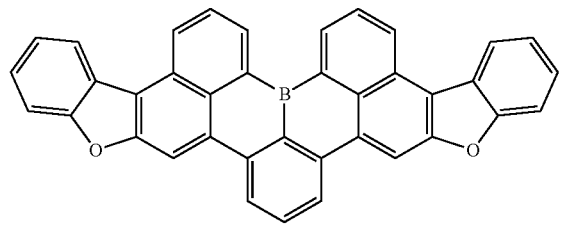
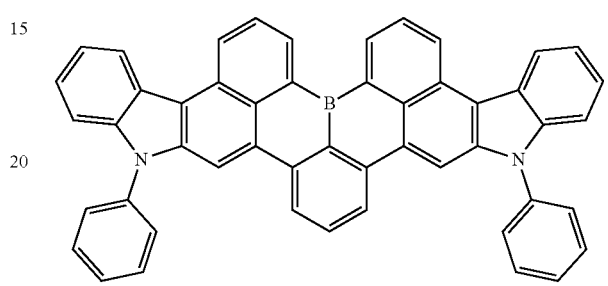
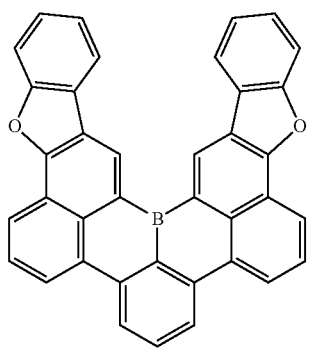
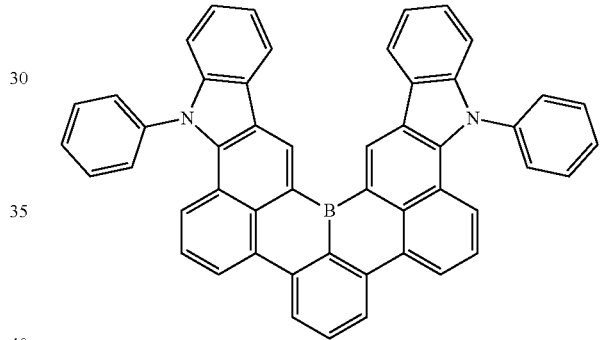
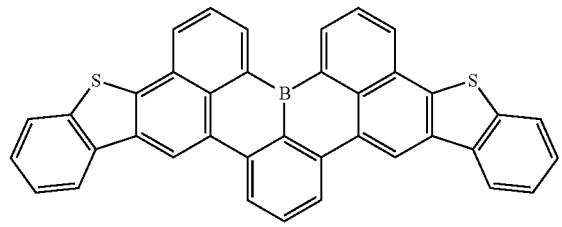
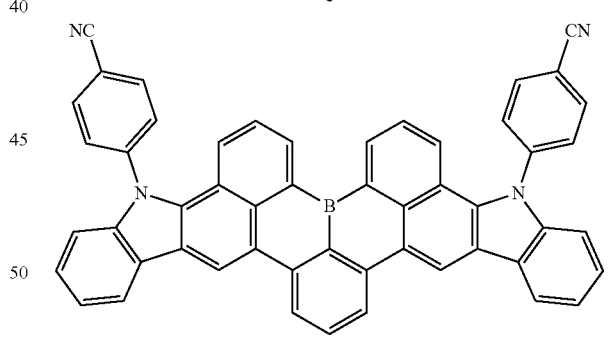
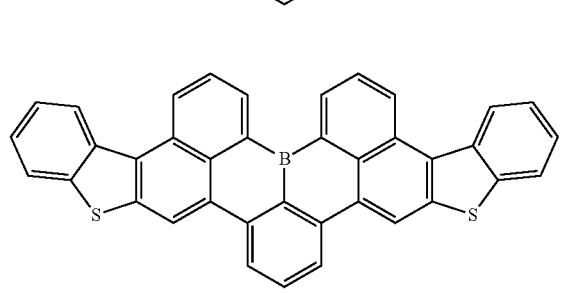
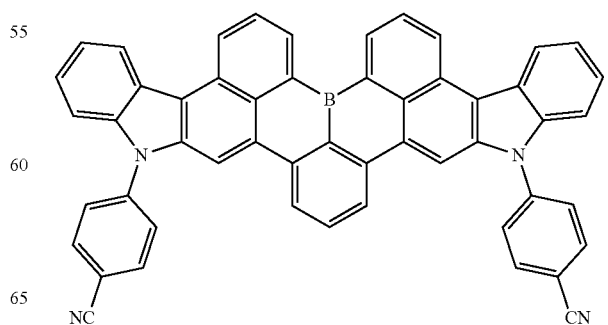
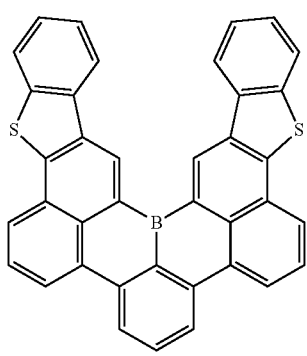

13
-continued
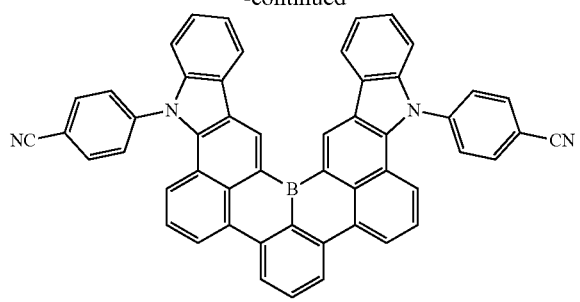
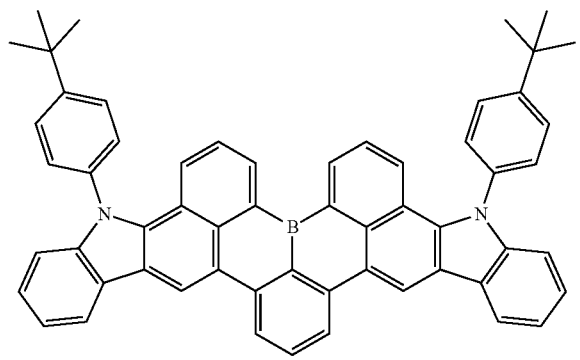
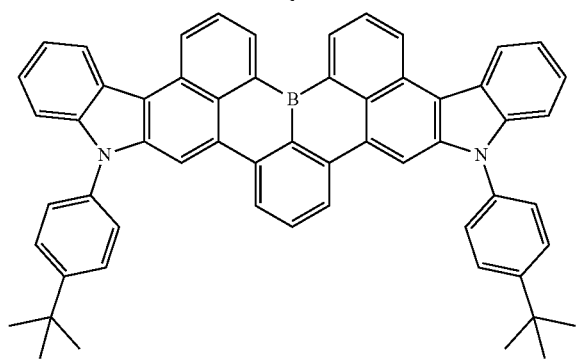
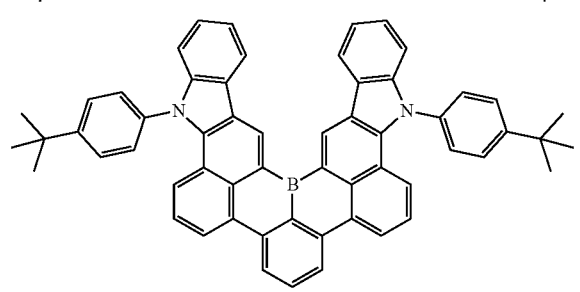
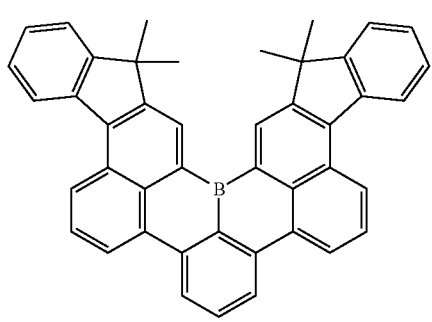
14
-continued
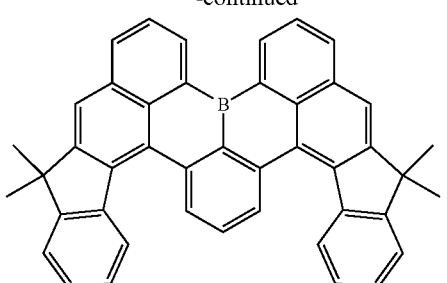
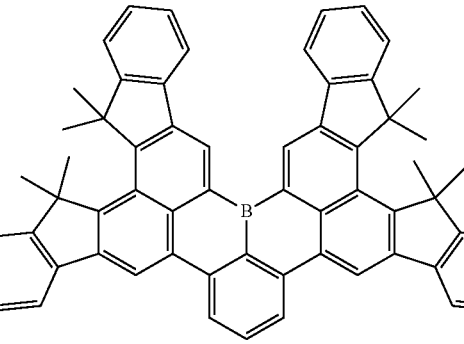
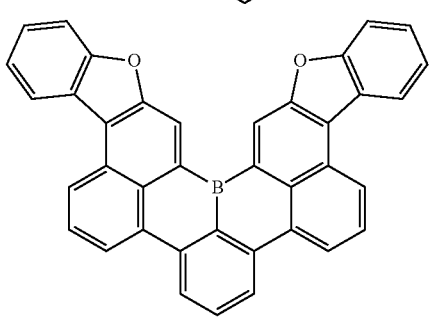
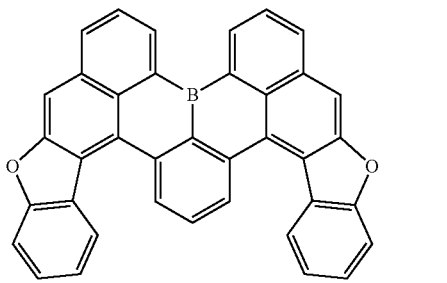
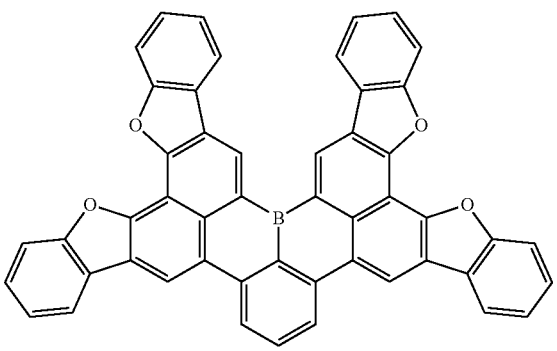

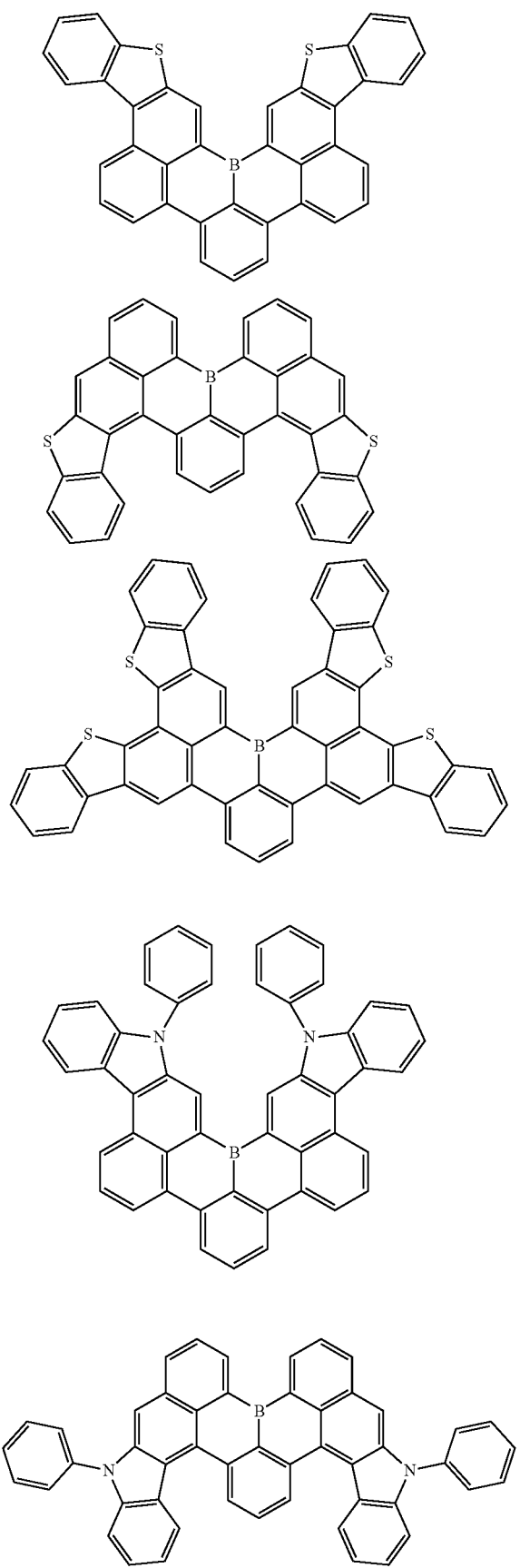

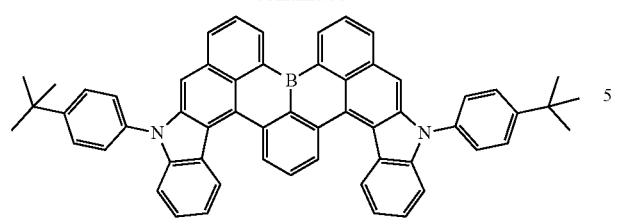
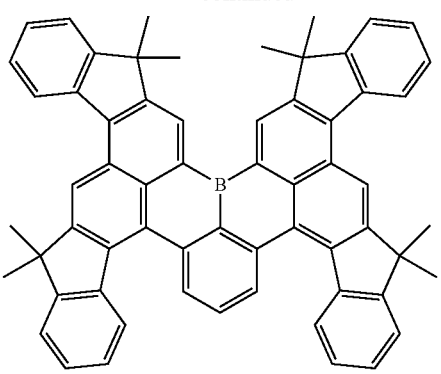
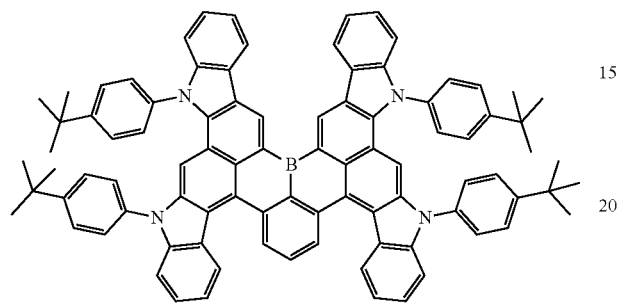
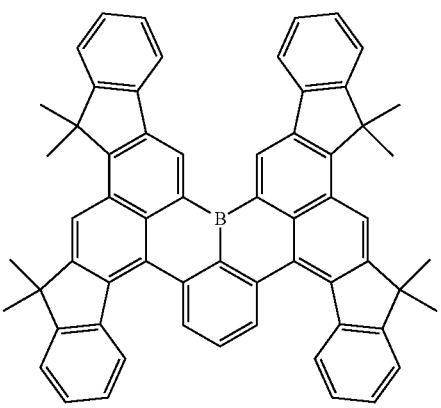
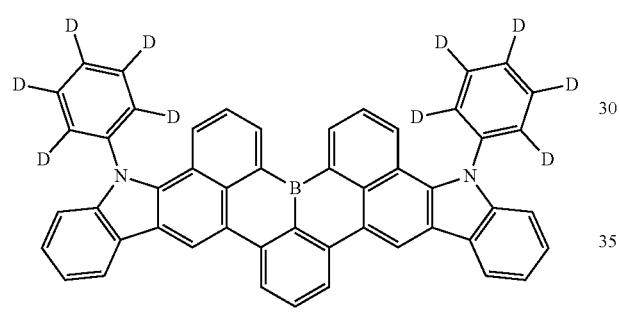
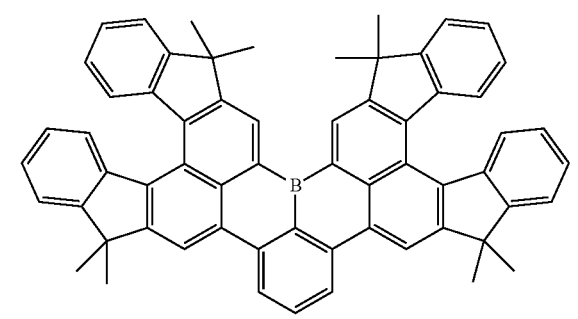
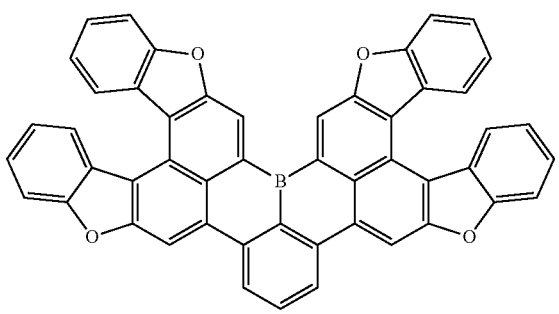
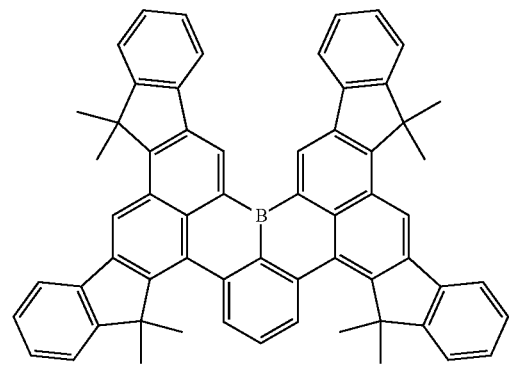
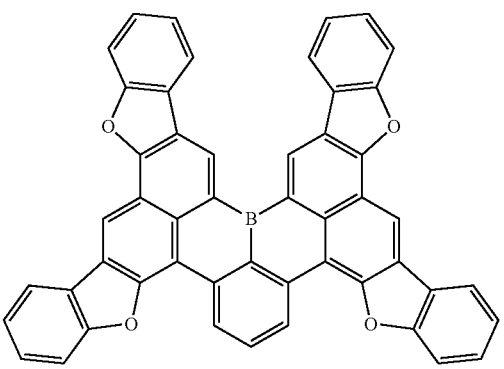

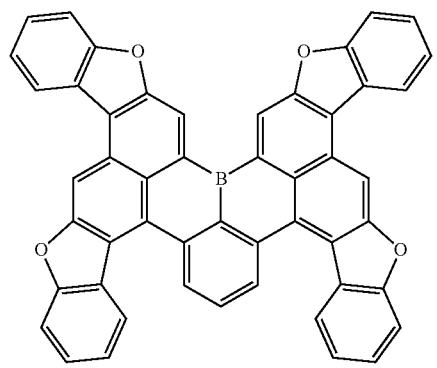
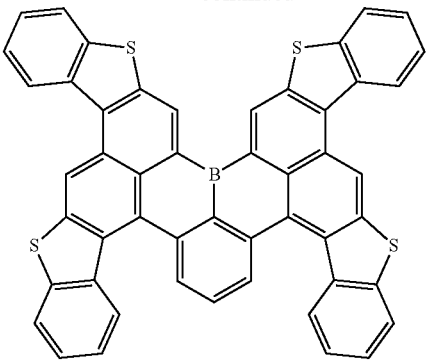
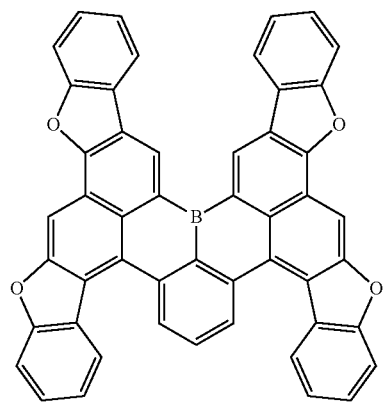
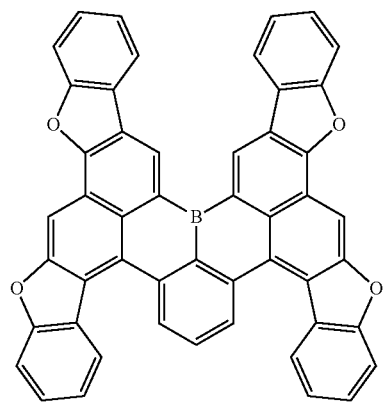
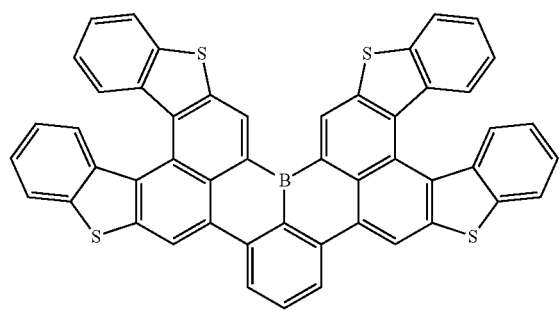
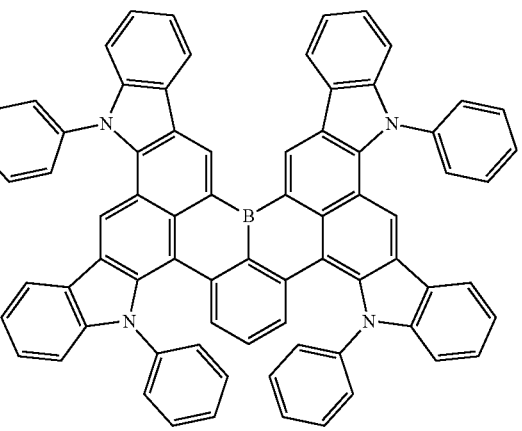
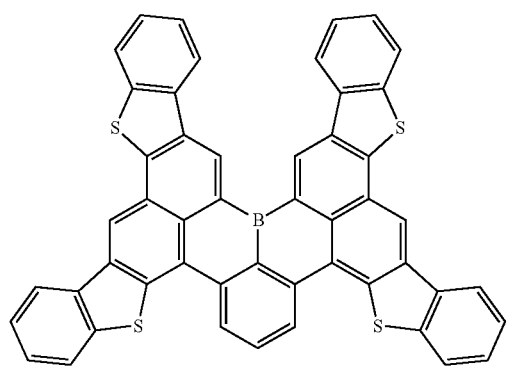

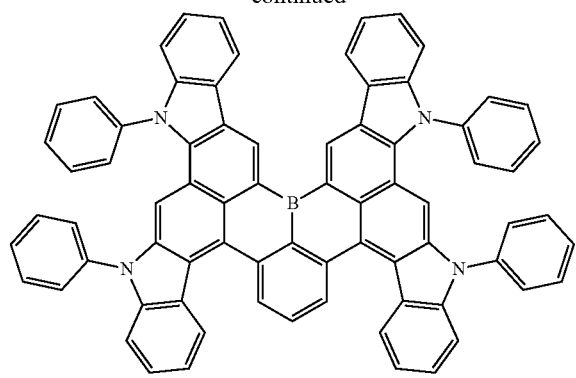
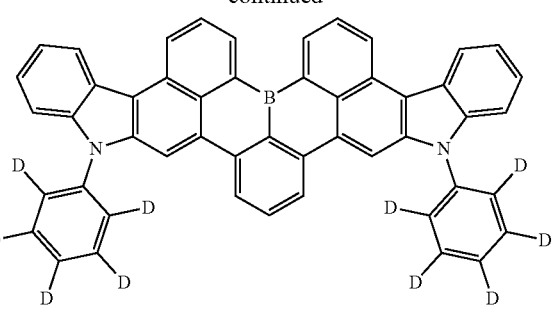
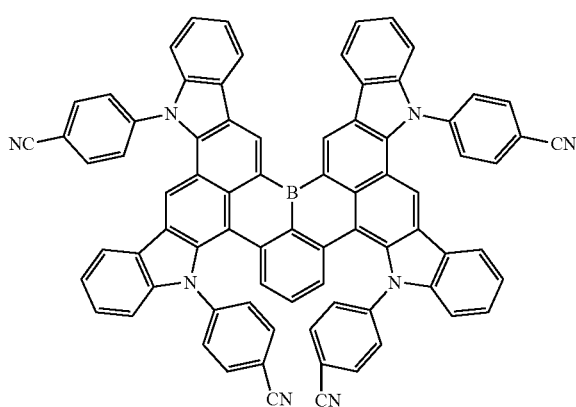
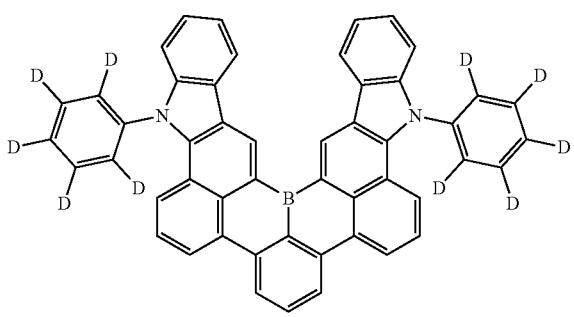
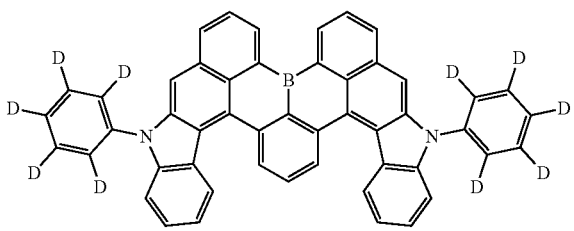
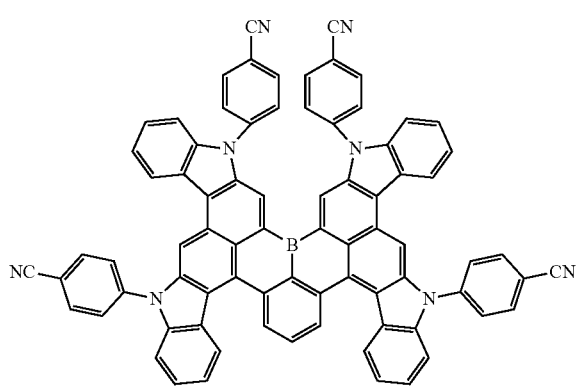
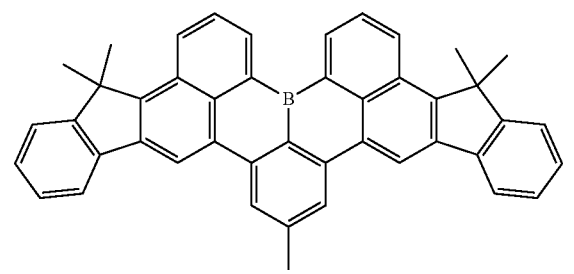
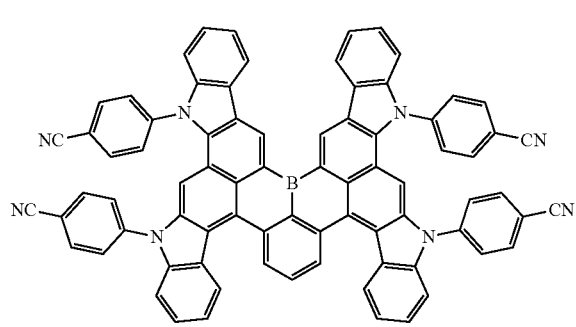
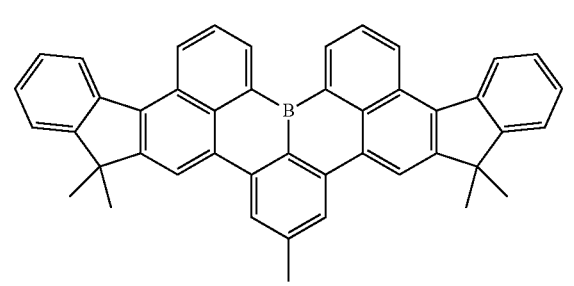

23
-continued
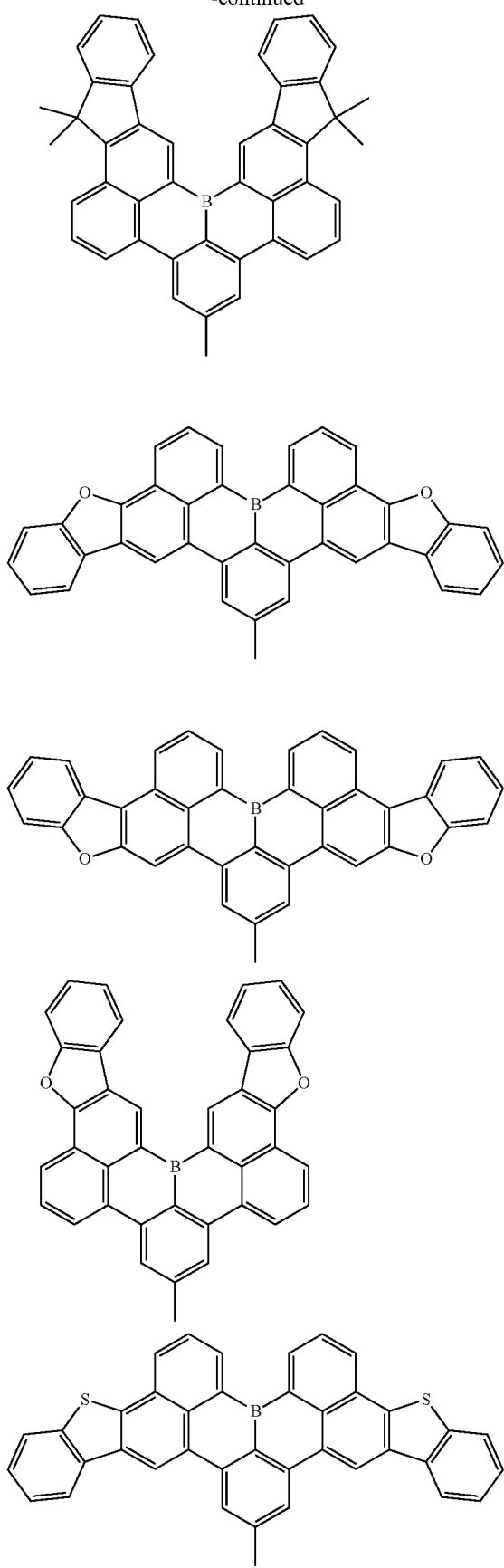
24
-continued
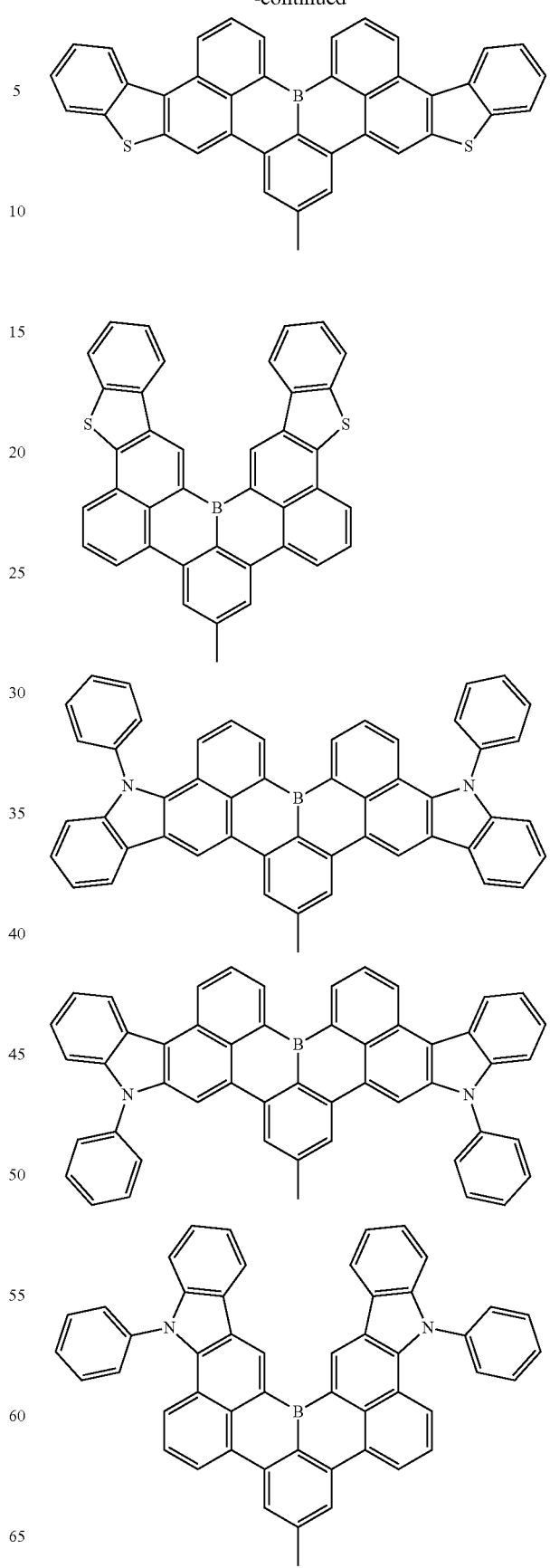

-continued
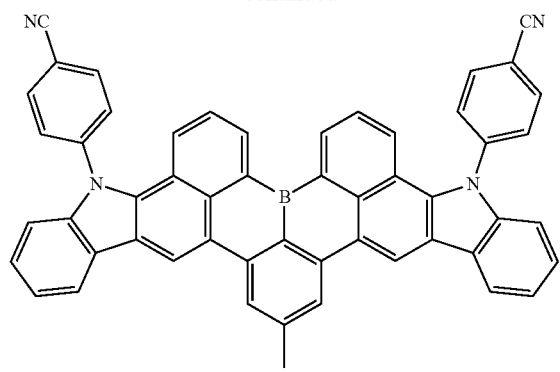
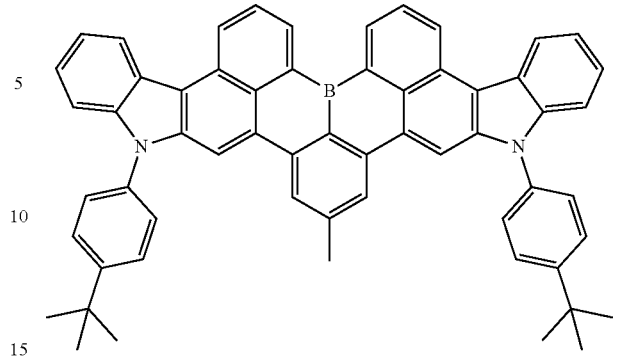
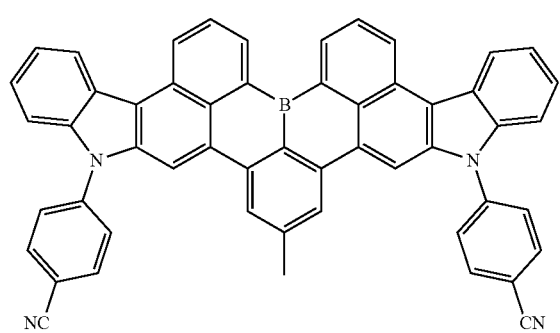
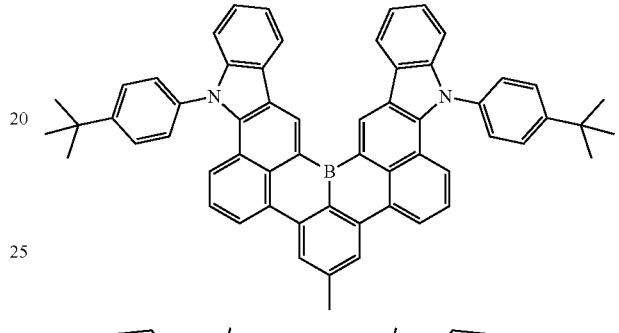
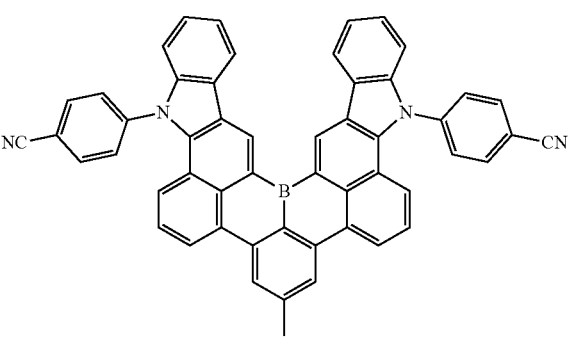
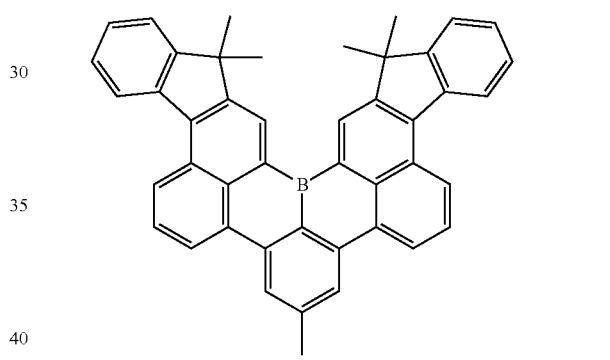
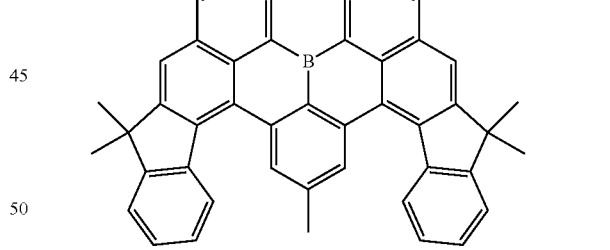
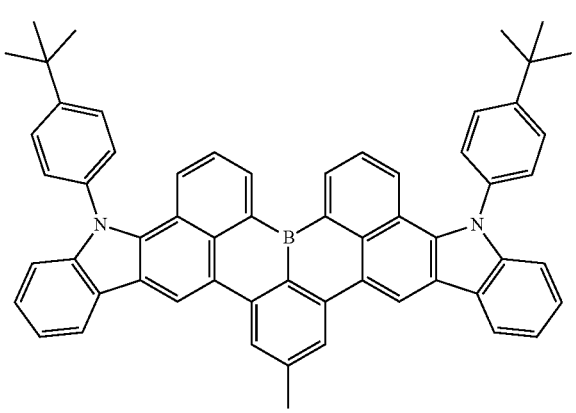
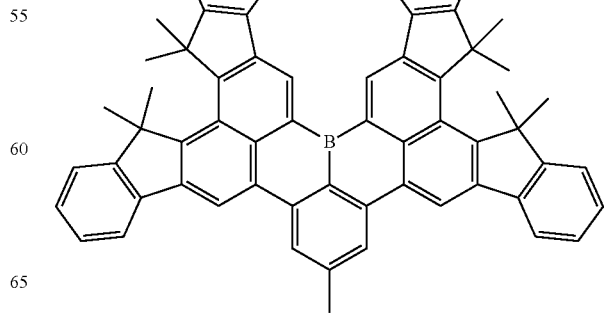

27
-continued
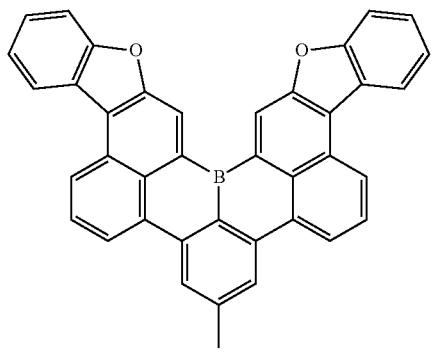
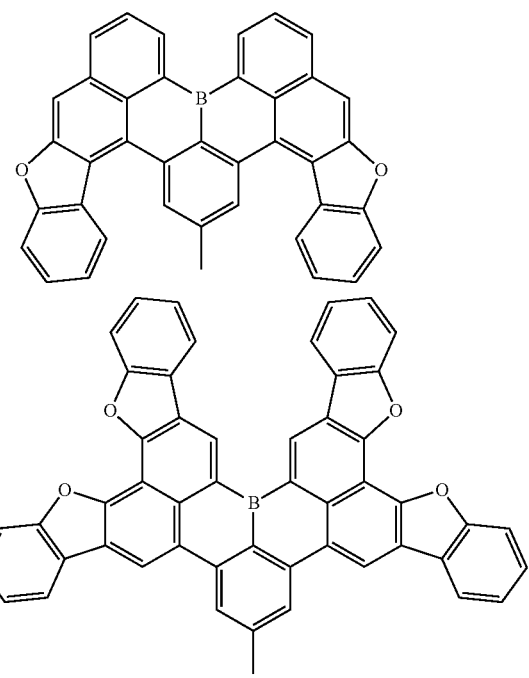
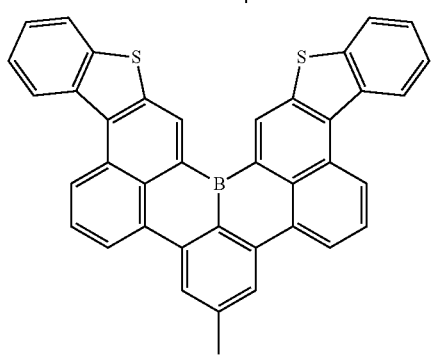
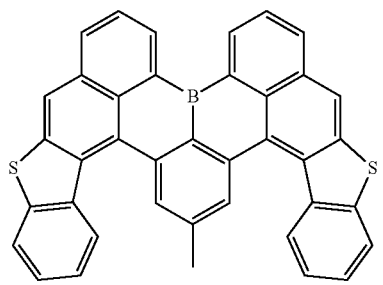
28
-continued
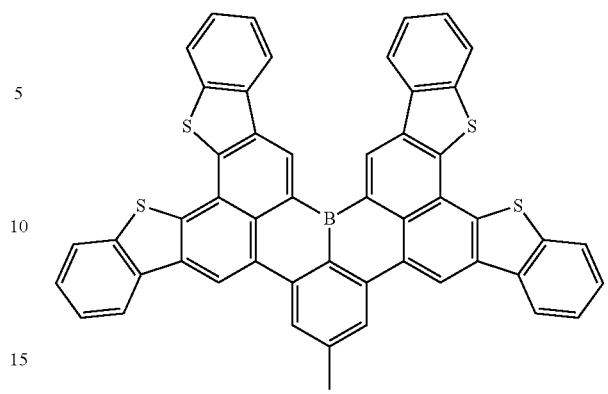
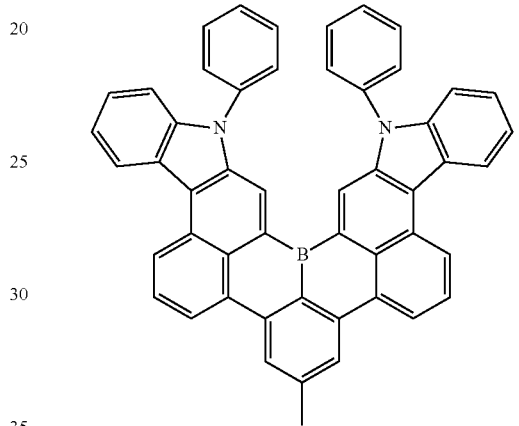
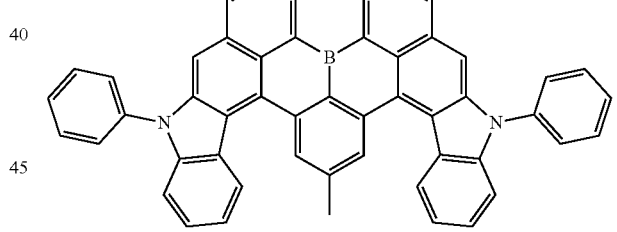
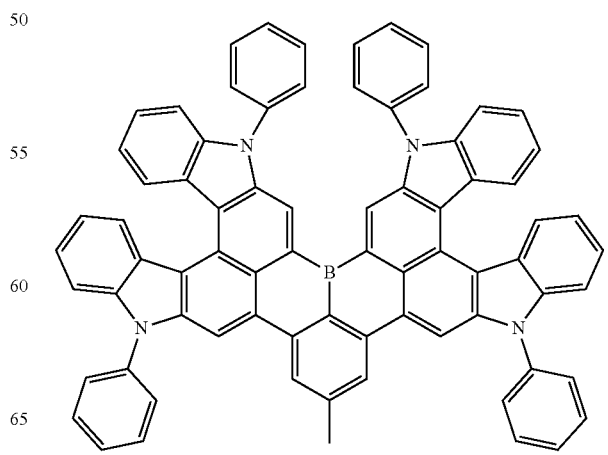

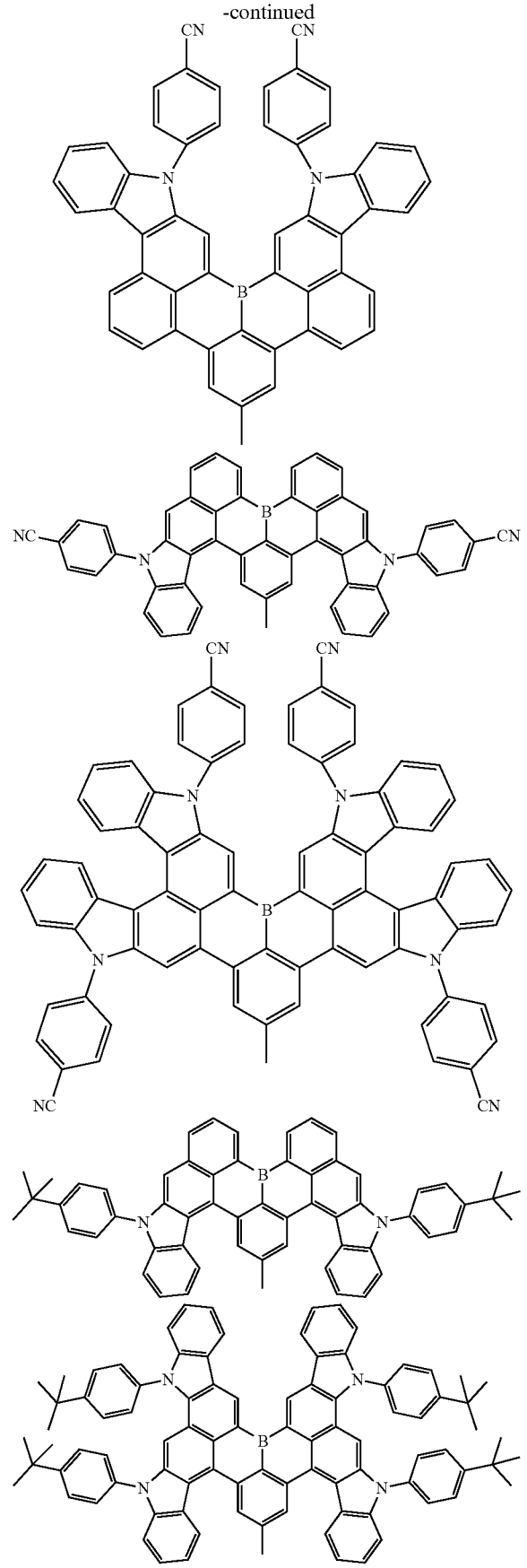
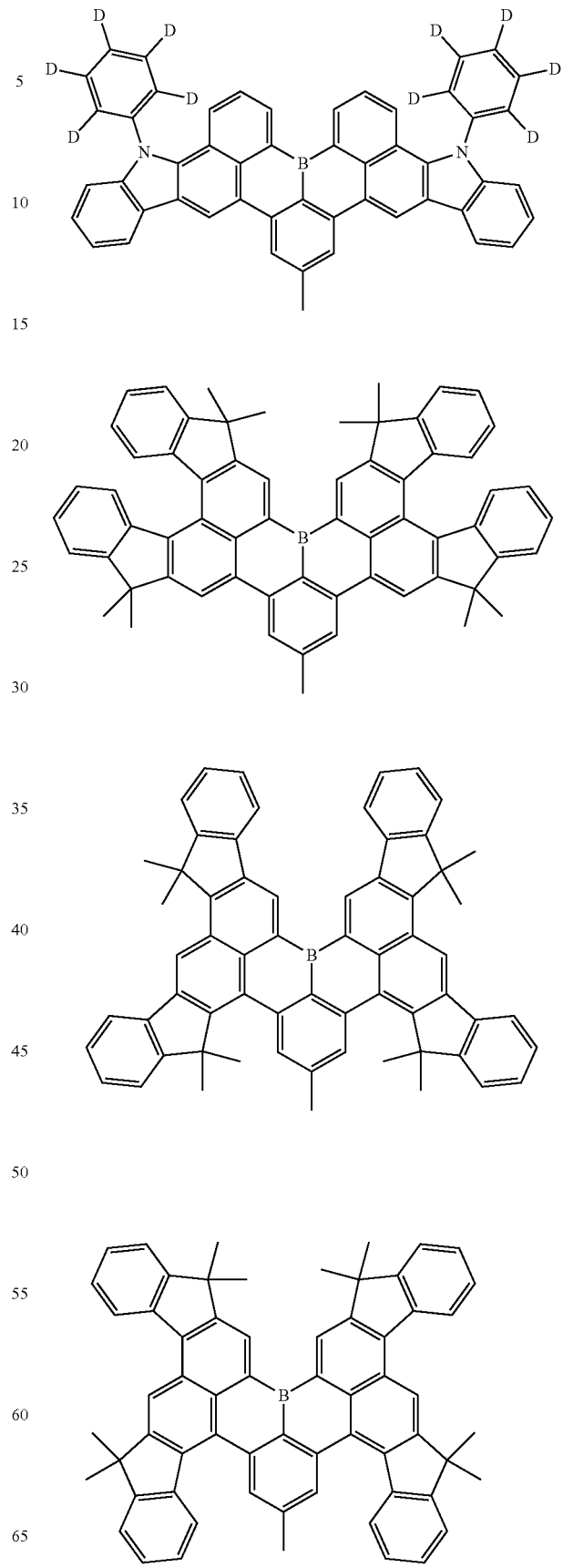

31
-continued
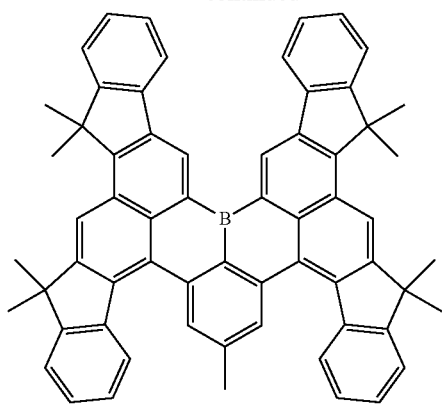
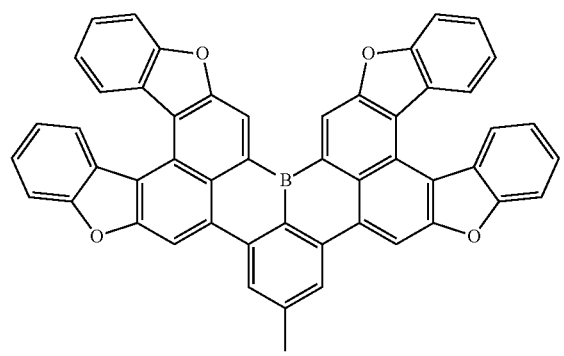
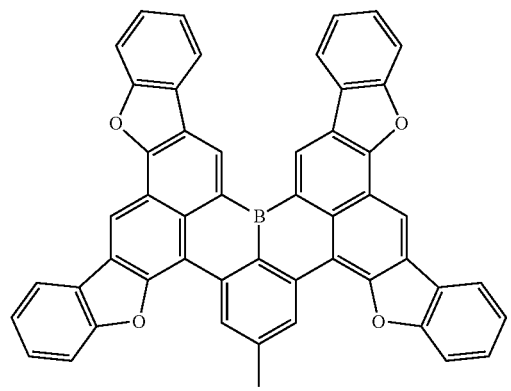
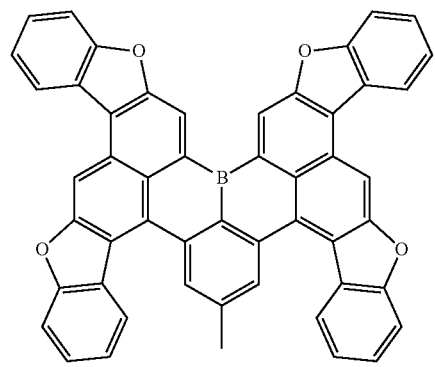
32
-continued
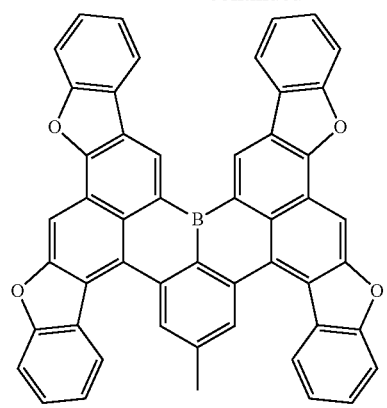
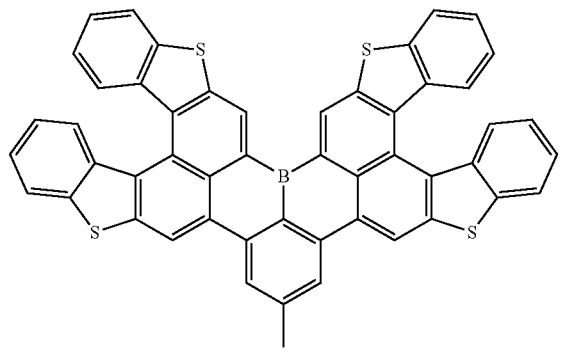
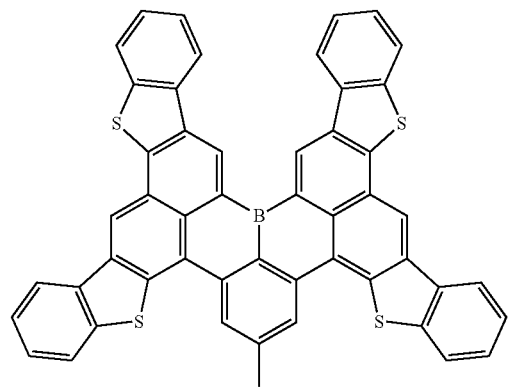
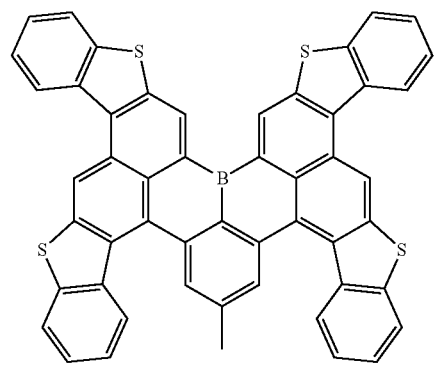

33
-continued
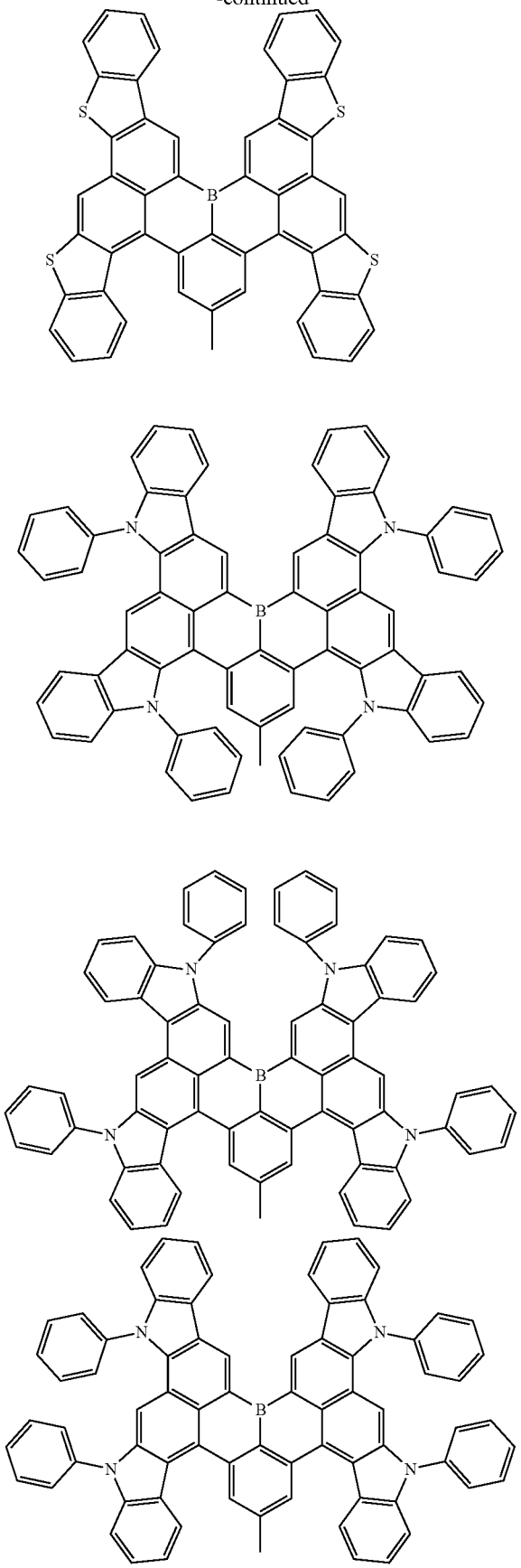
34
-continued
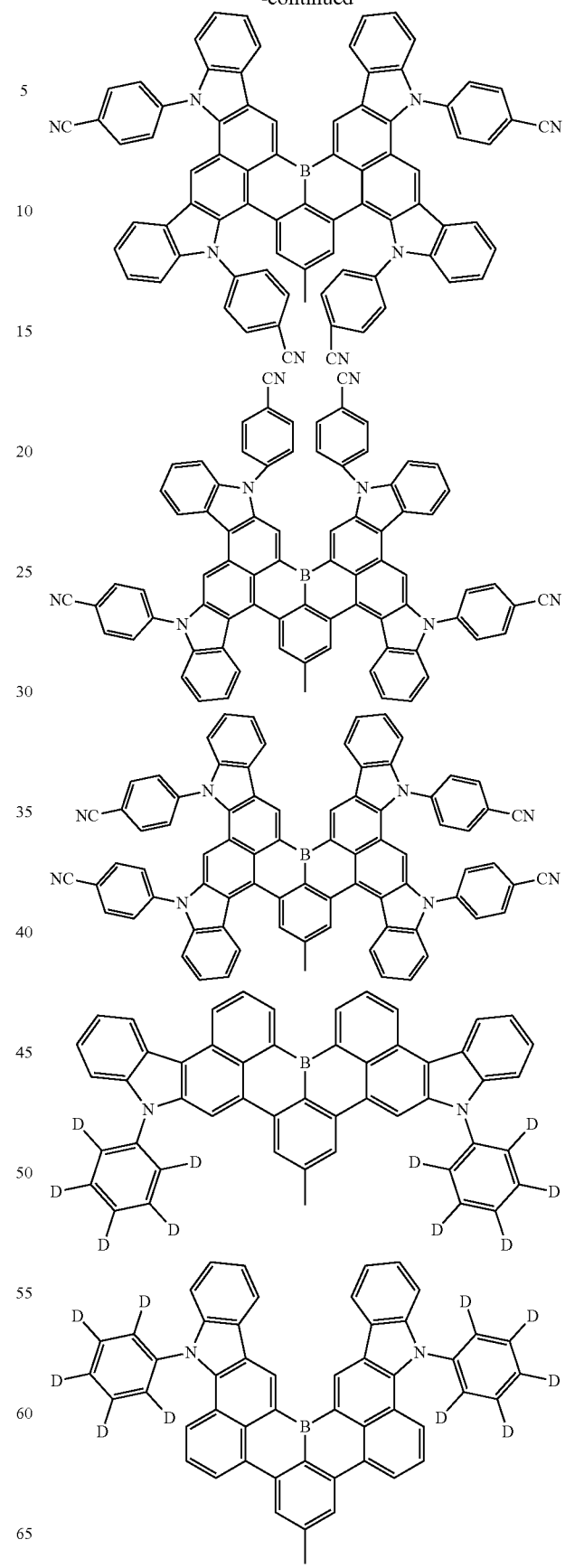

-continued
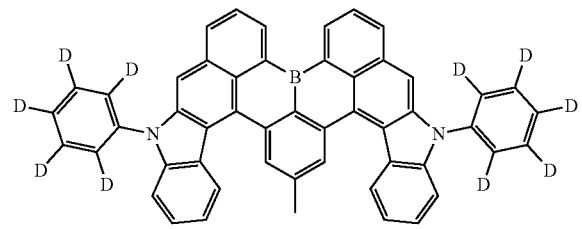
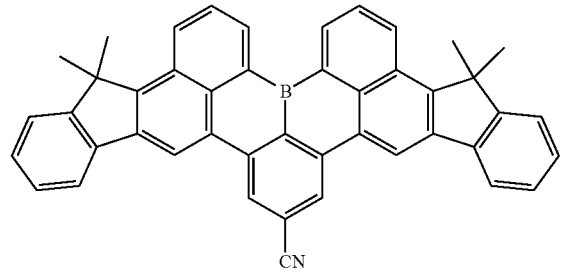
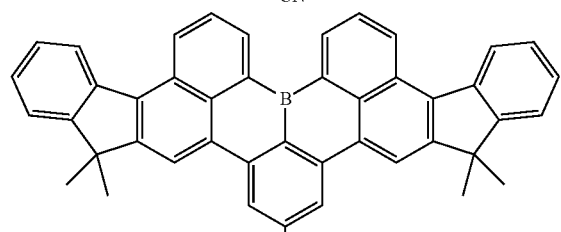
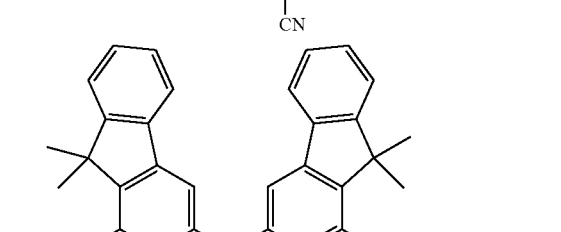
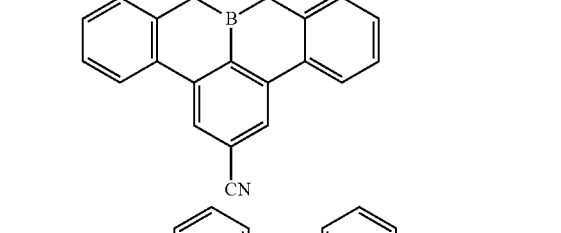
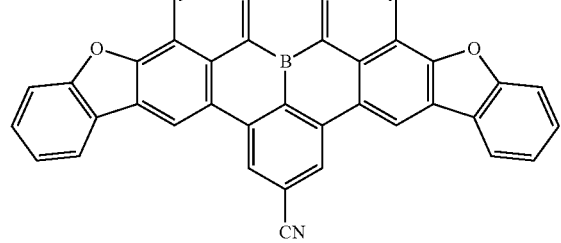
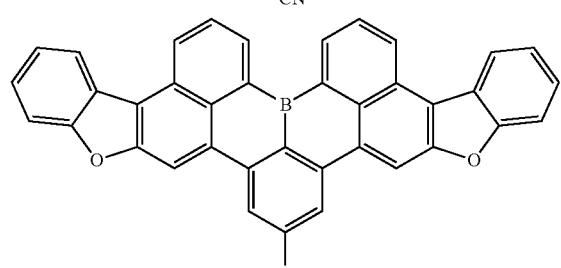
-continued
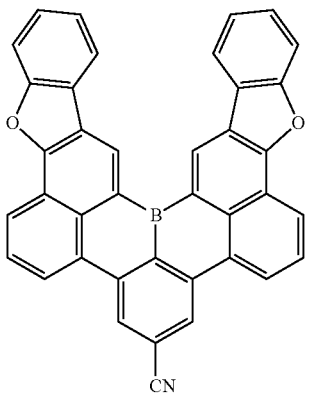
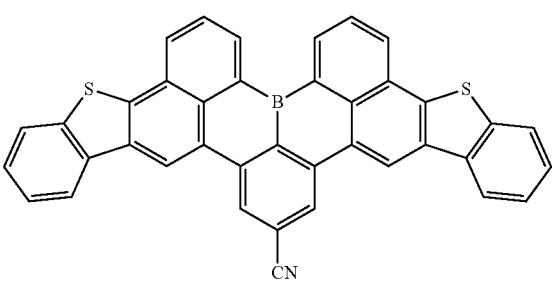
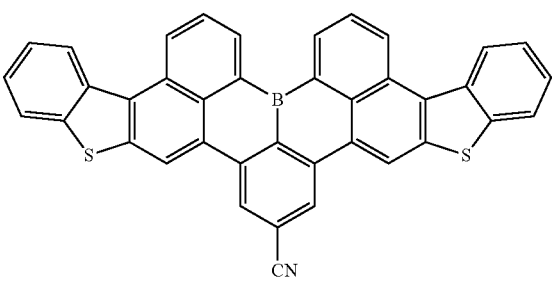
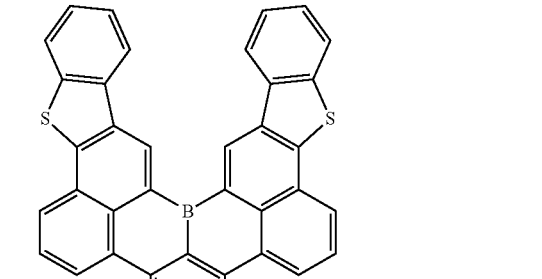
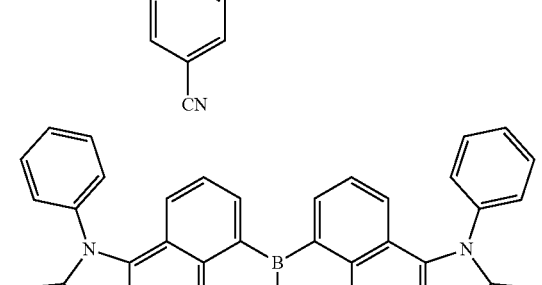
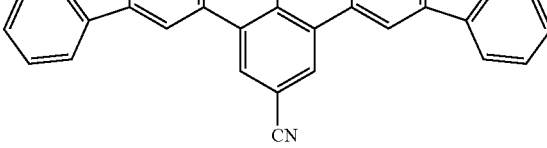

37
-continued
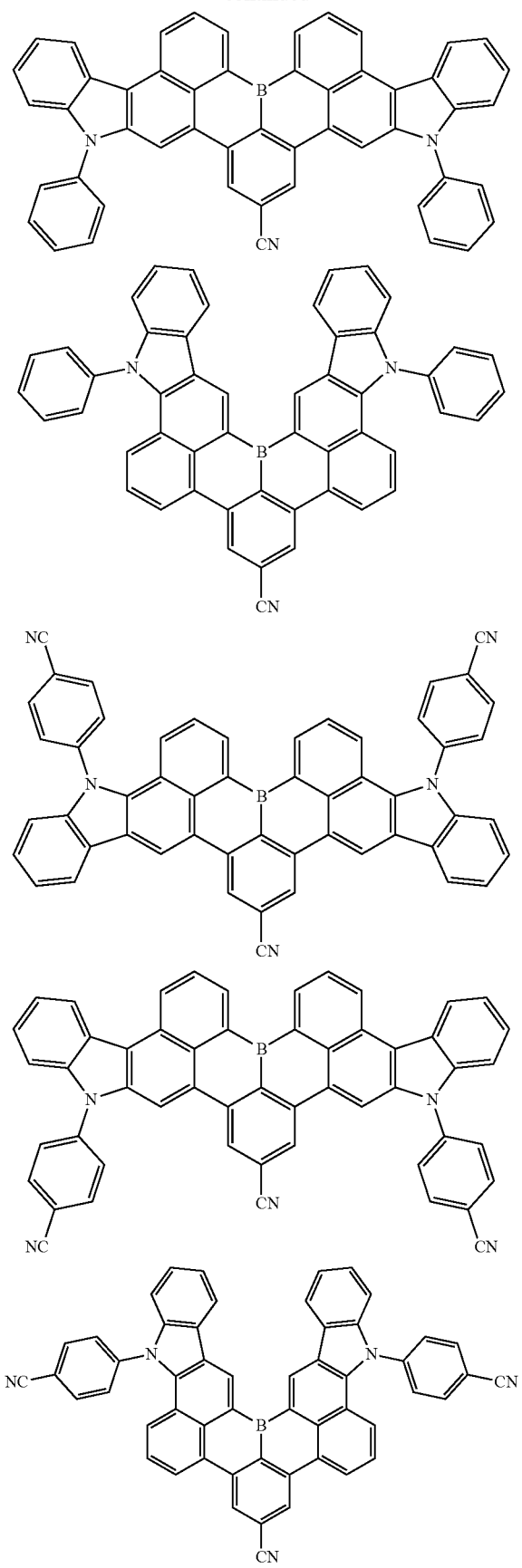
38
-continued
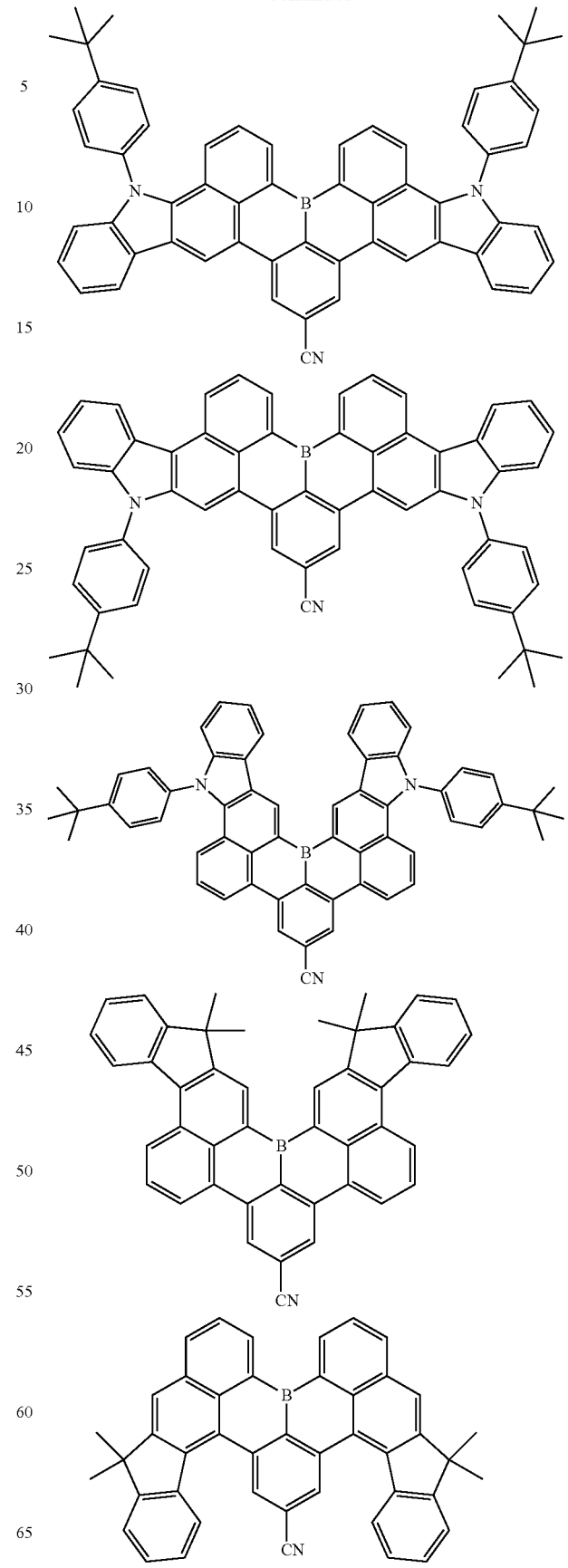

39
-continued
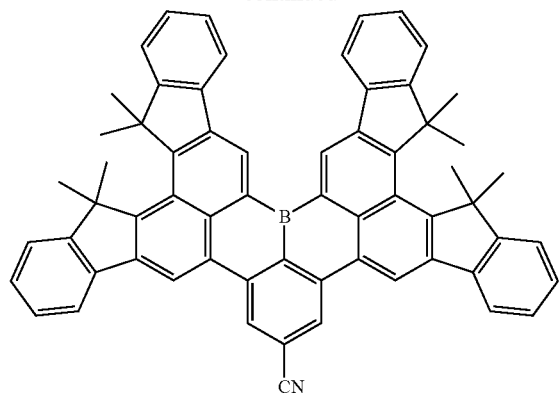
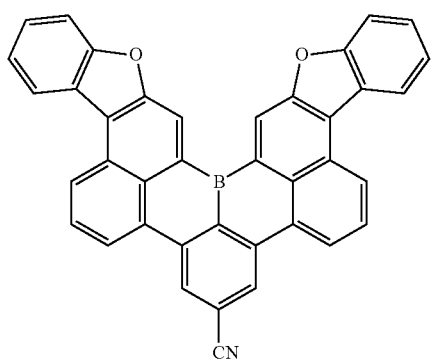
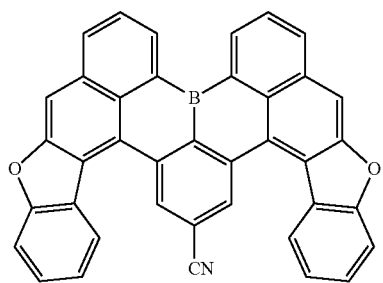
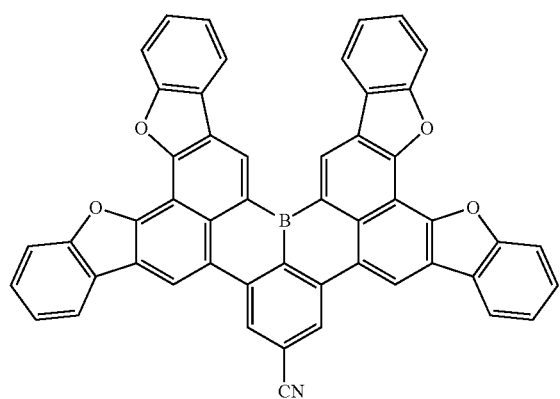
40
-continued
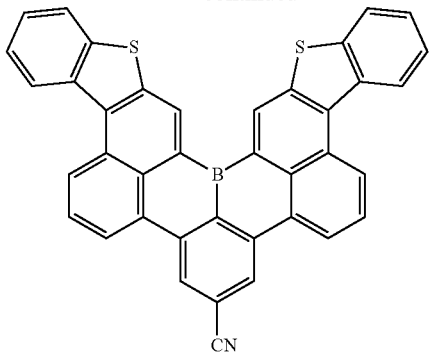
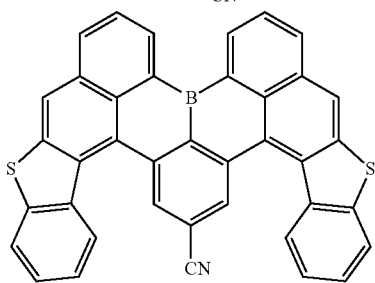
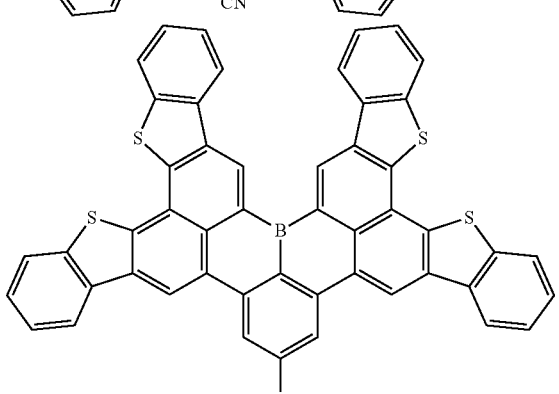
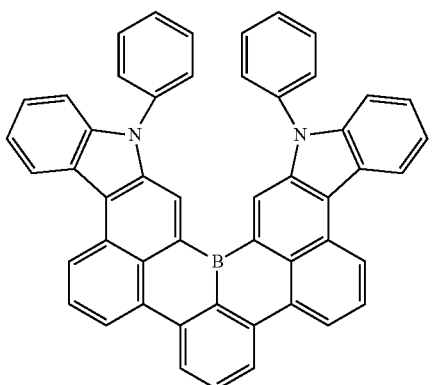
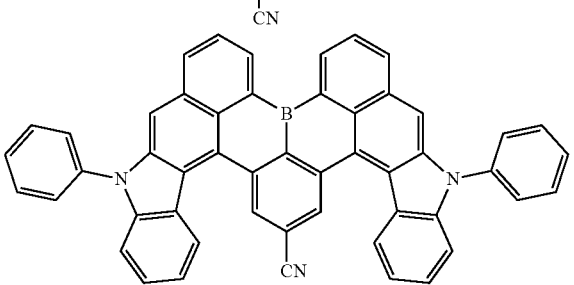

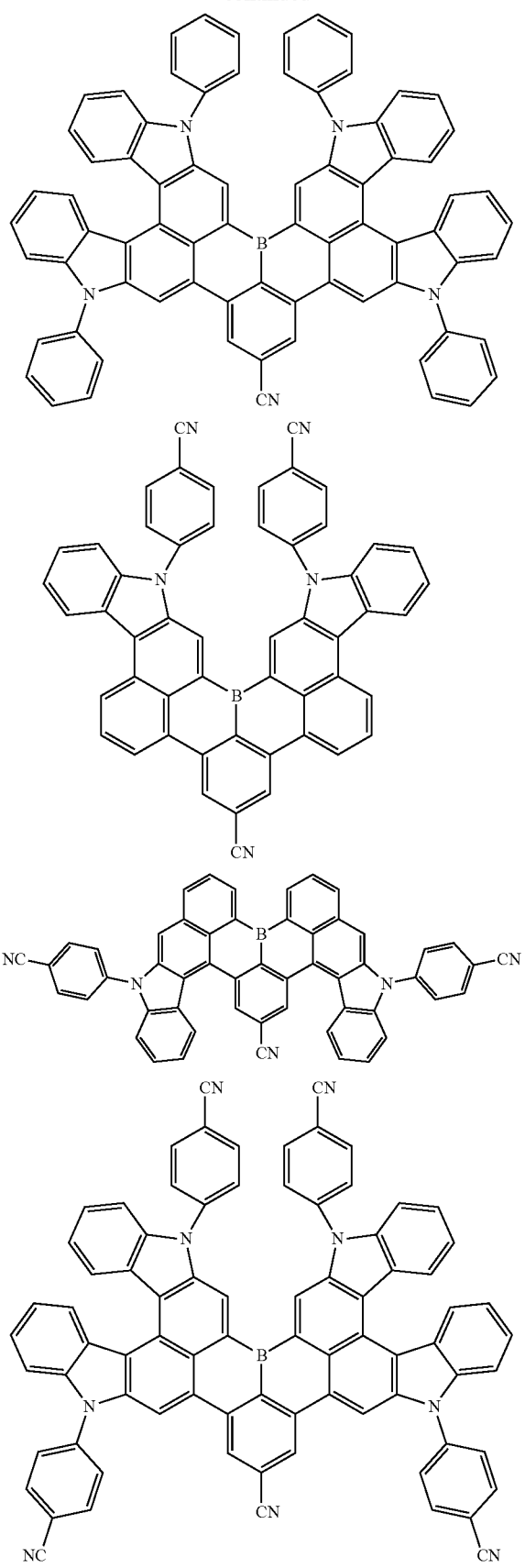
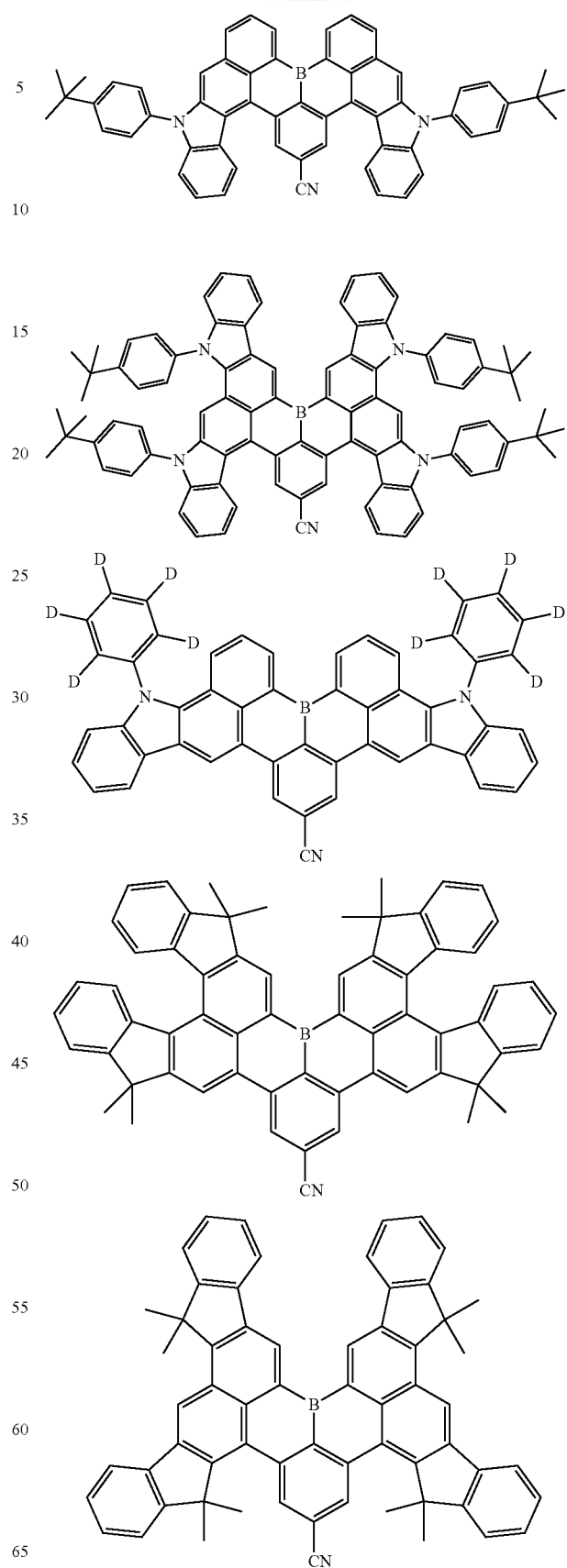

43
-continued
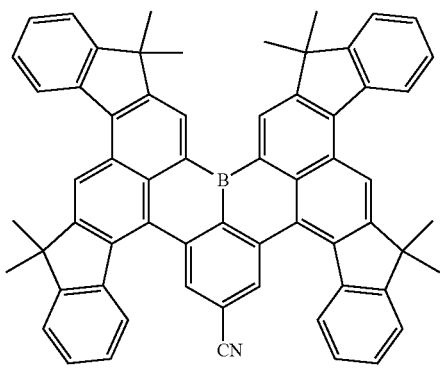
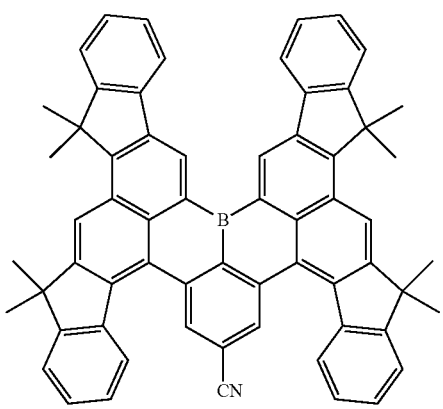
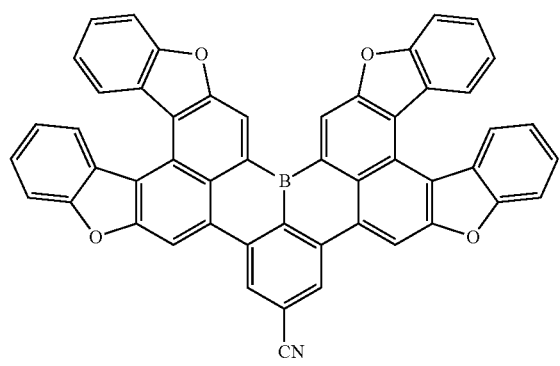
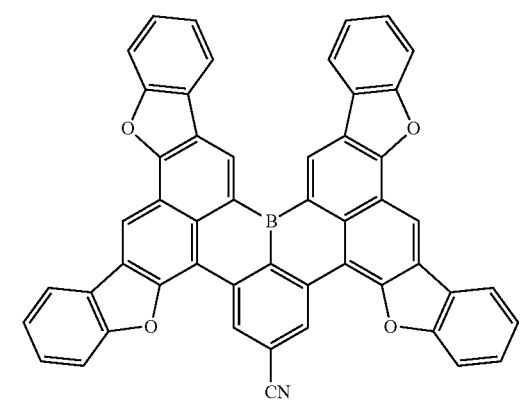
44
-continued
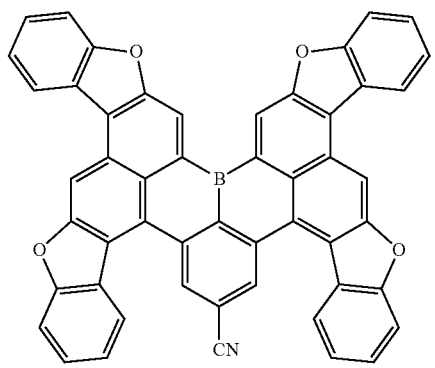
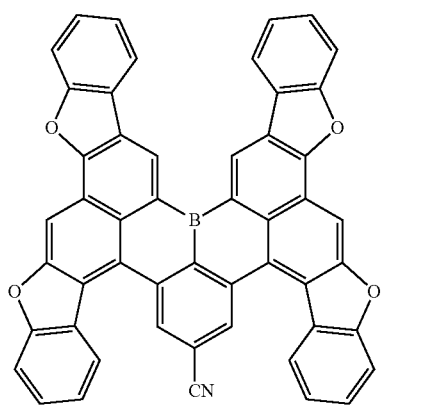
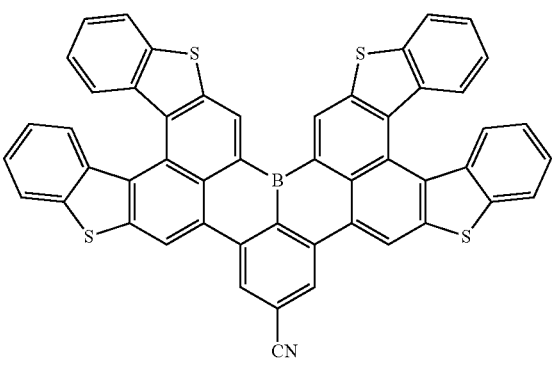
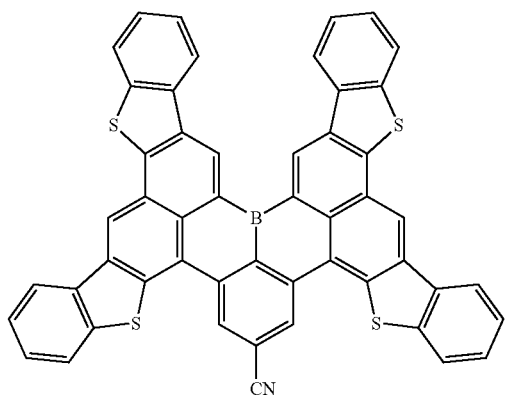

45
-continued
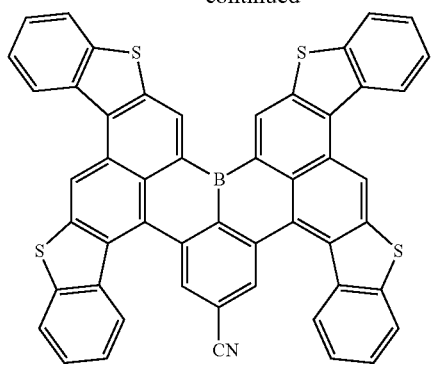
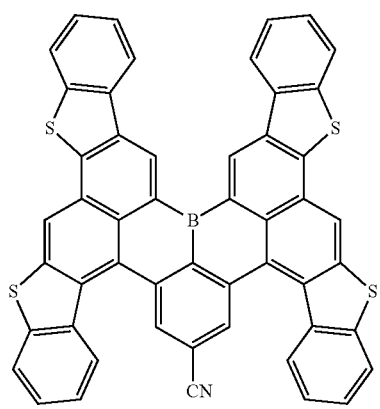
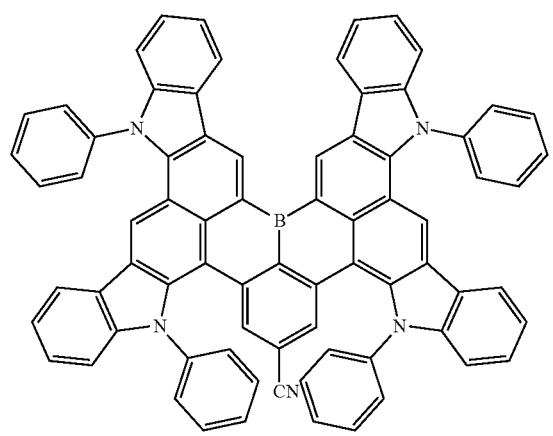
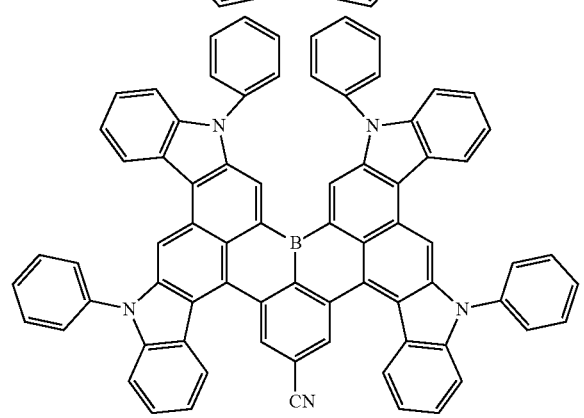
46
-continued
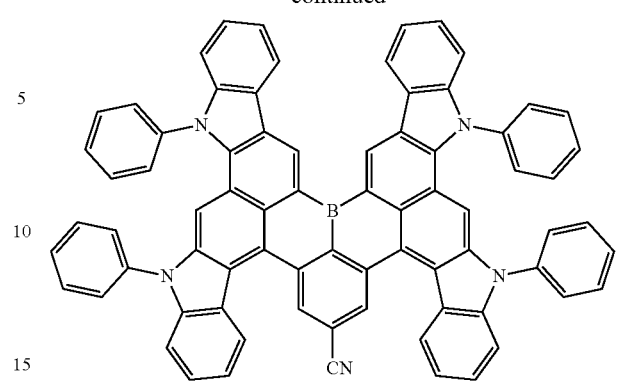
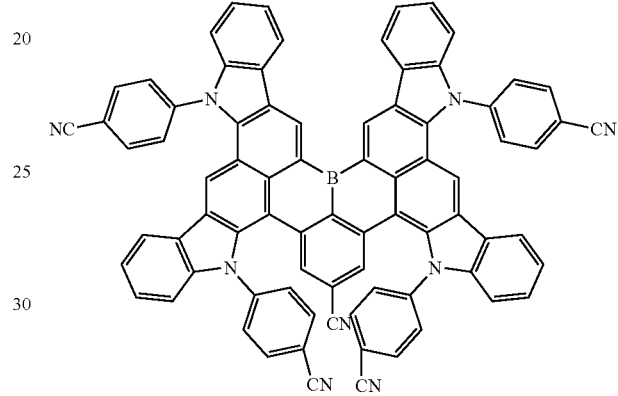
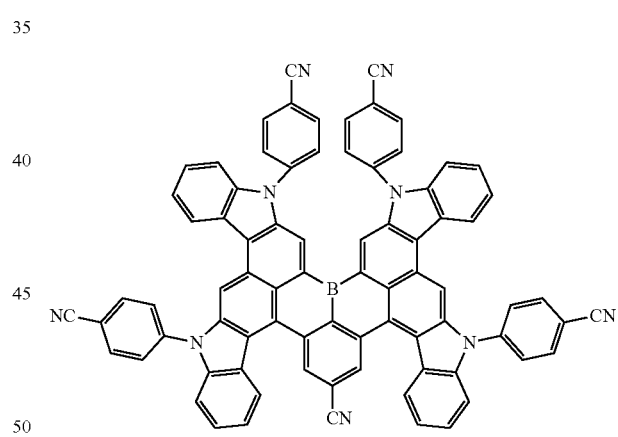
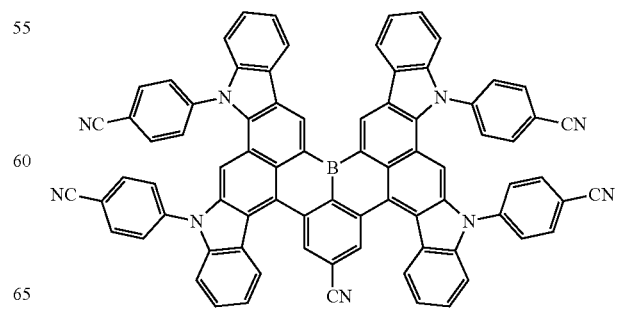

47
-continued
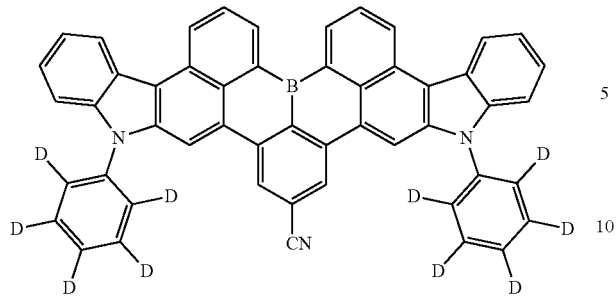
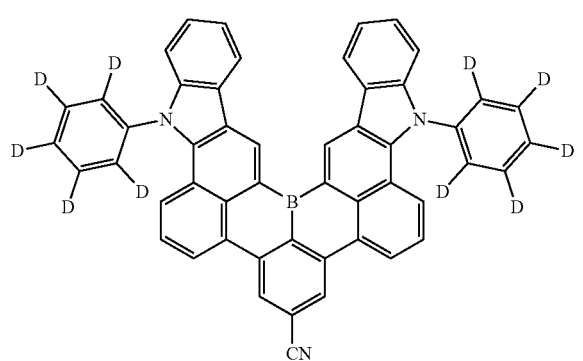
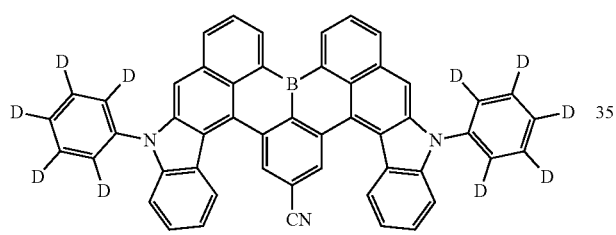
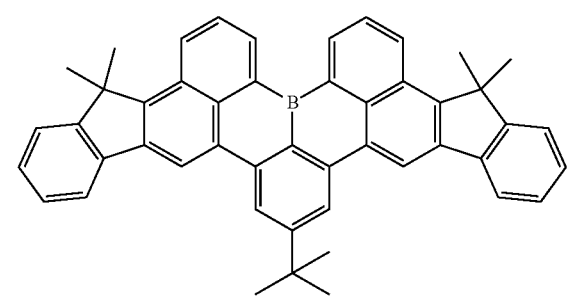
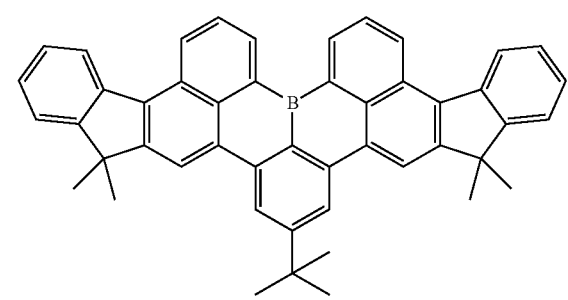
48
-continued
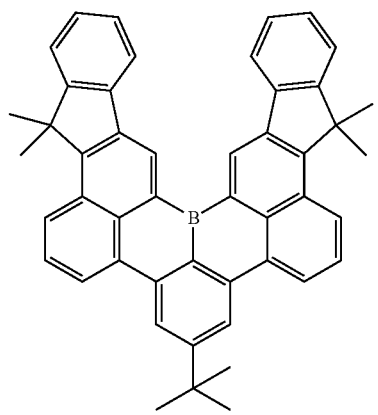
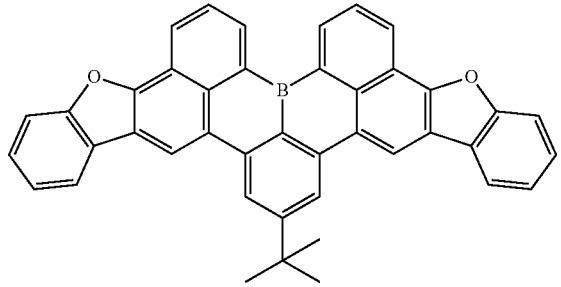
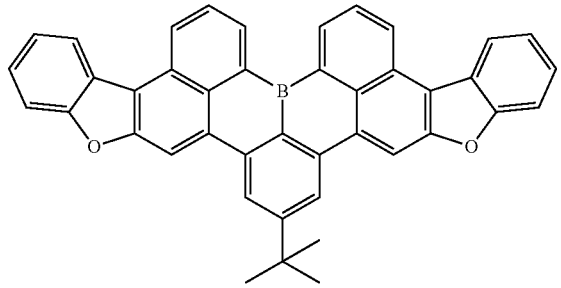
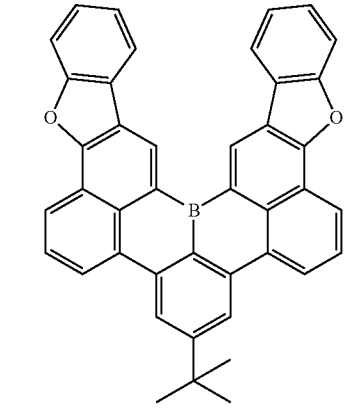
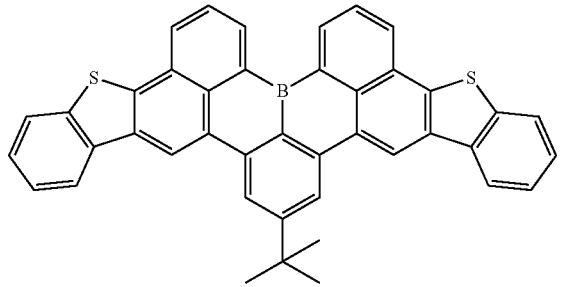

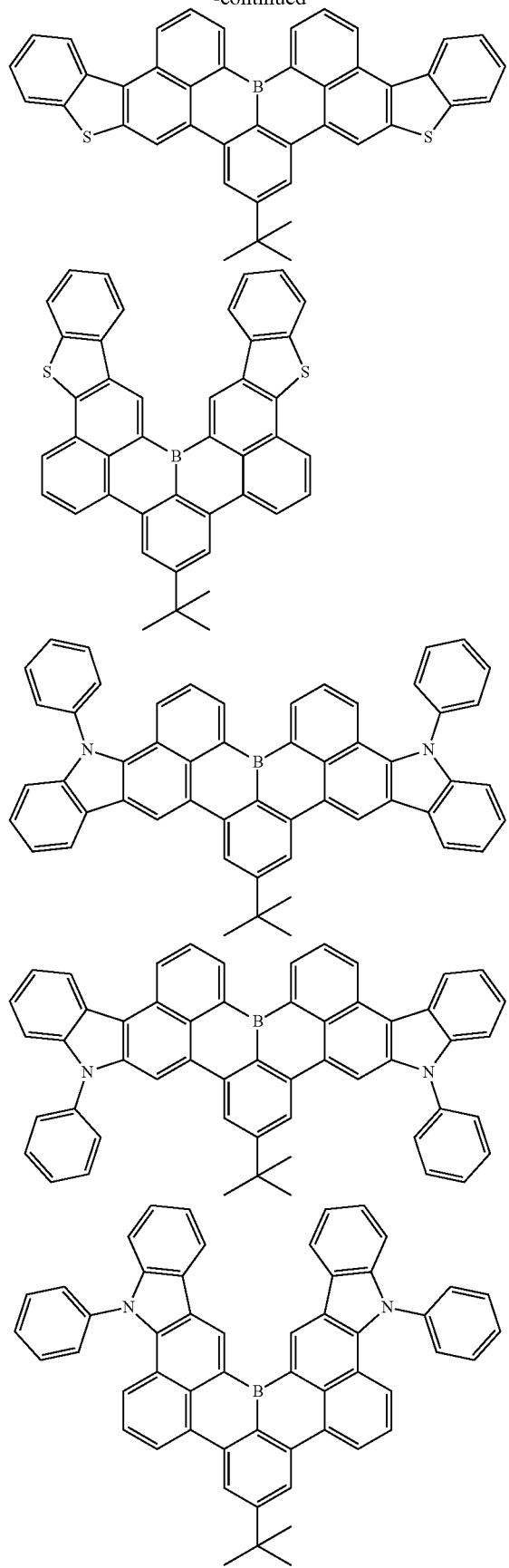
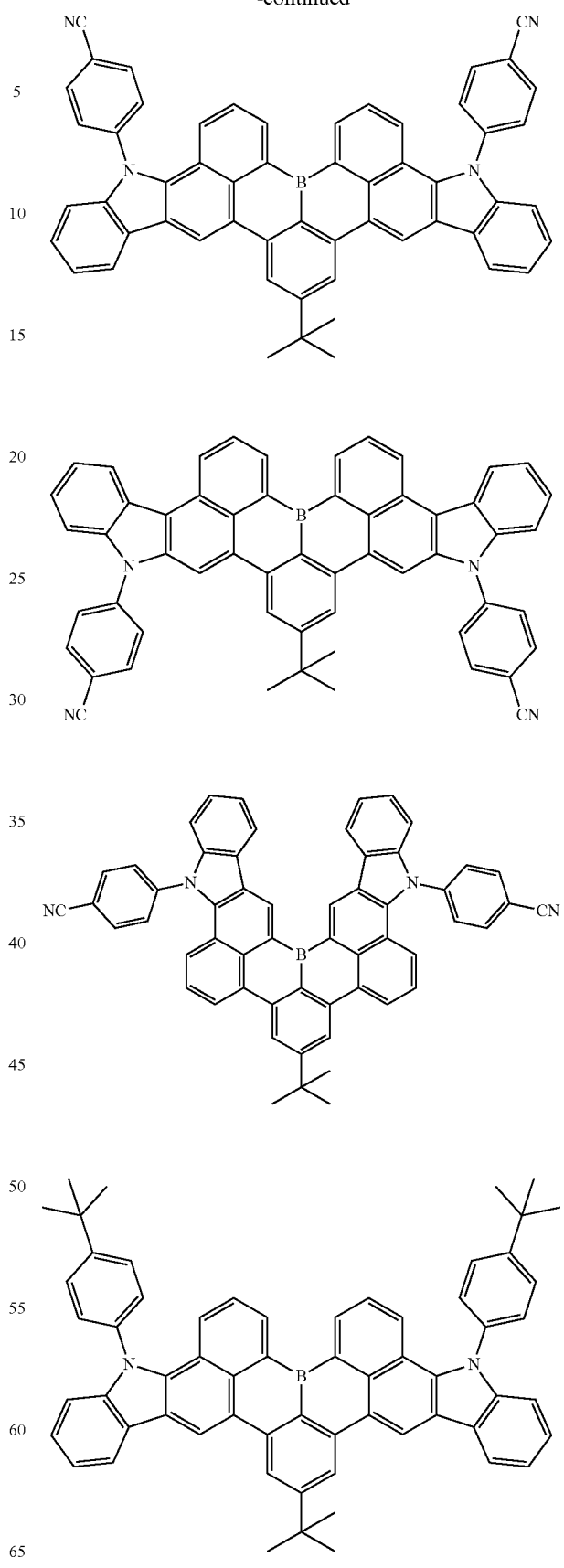

51
-continued
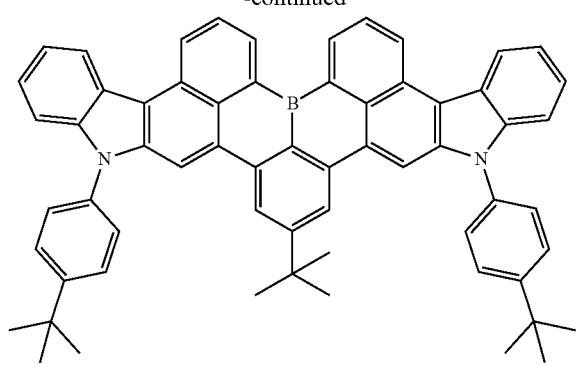
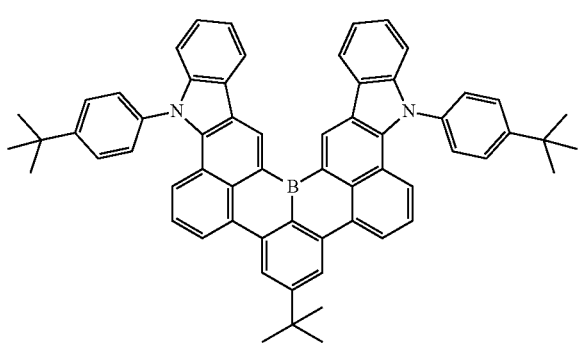
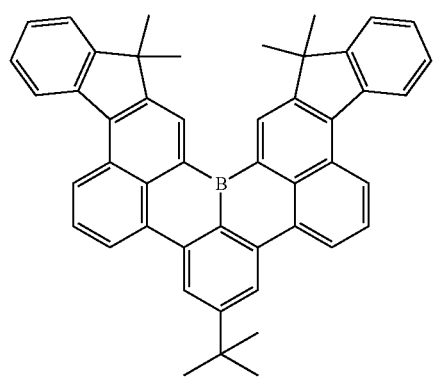
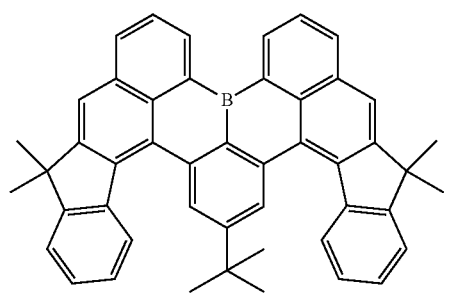
52
-continued
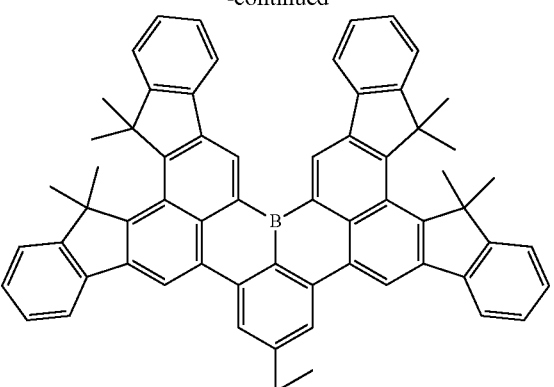
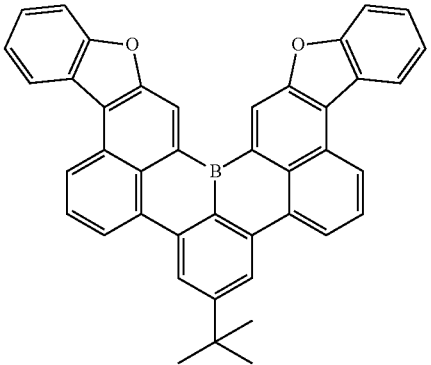
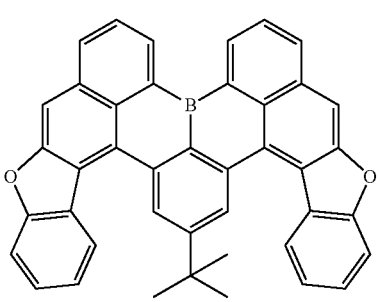
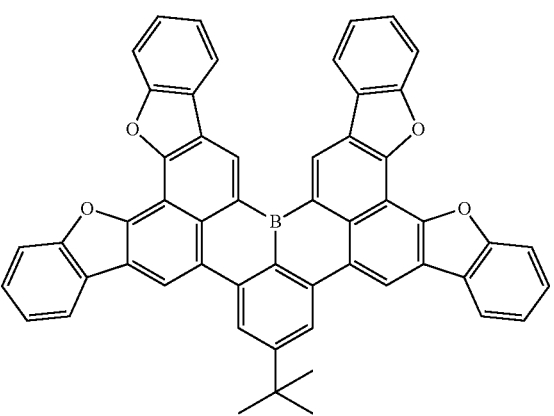

53
-continued
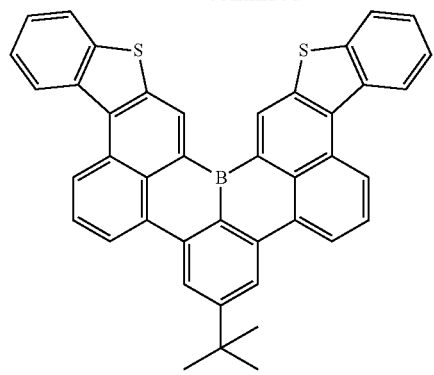
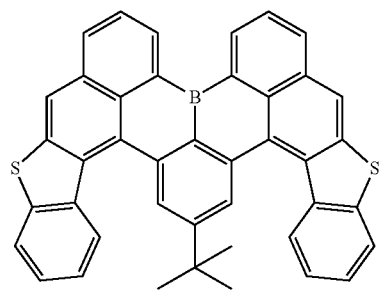
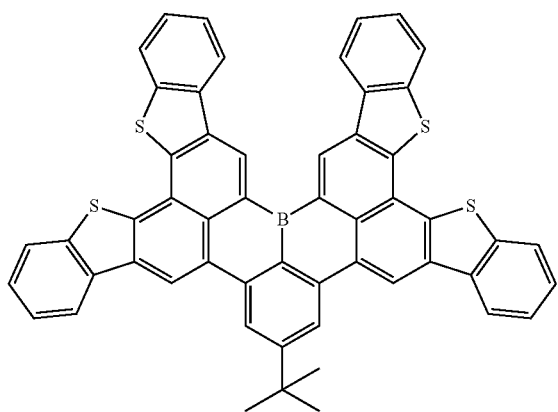
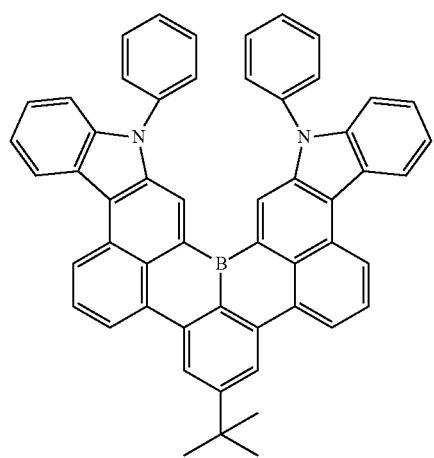
54
-continued
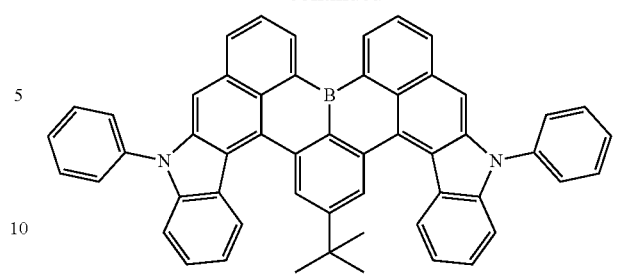
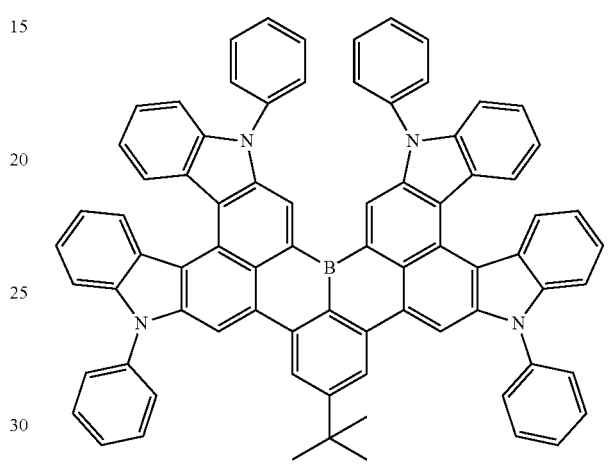
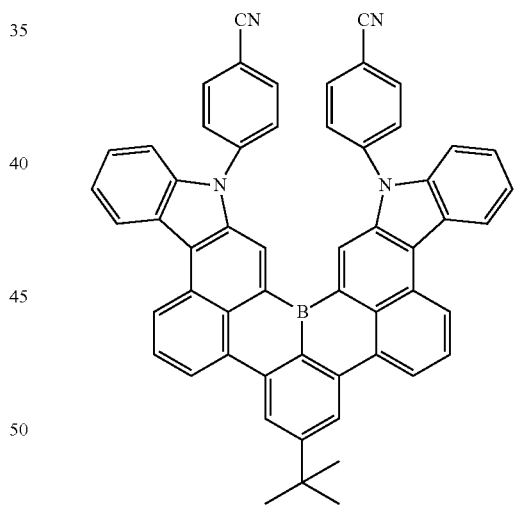
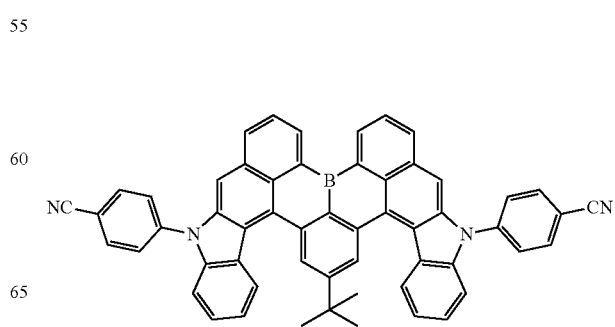

55
-continued
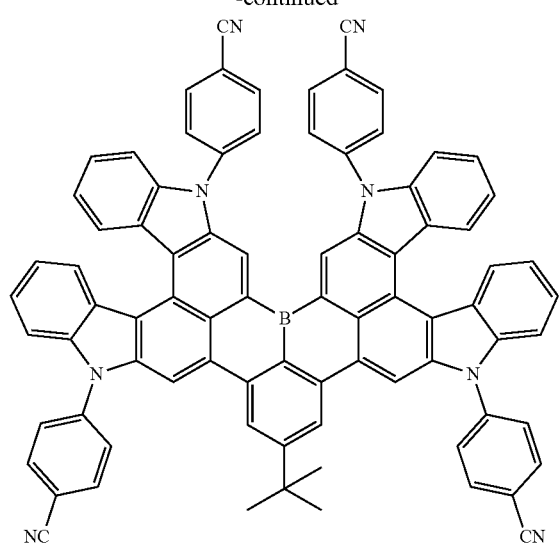
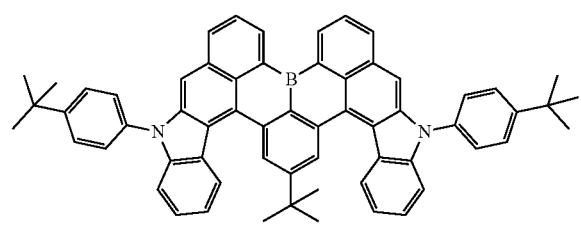
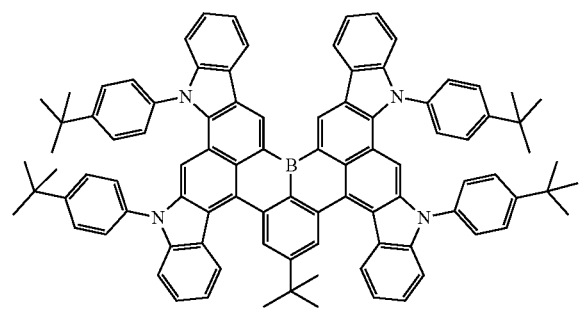
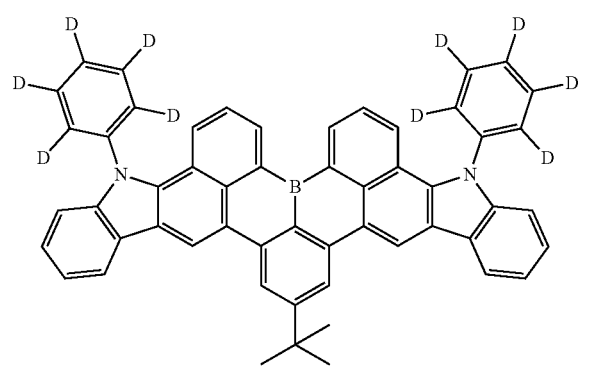
56
-continued
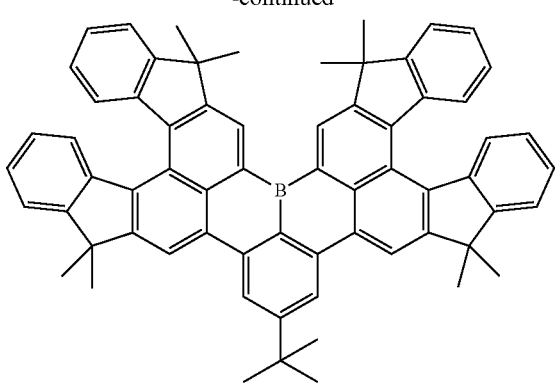
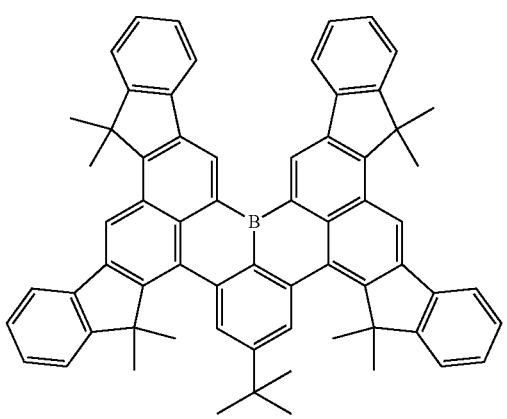
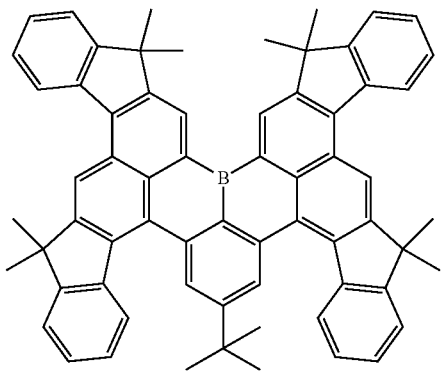
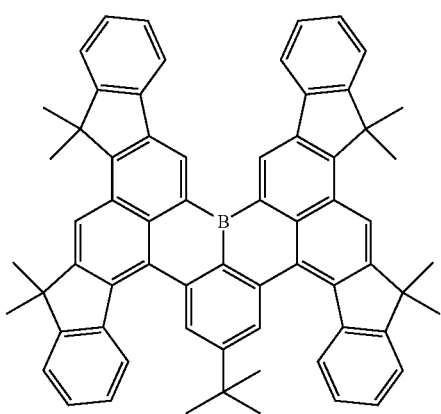

57
-continued
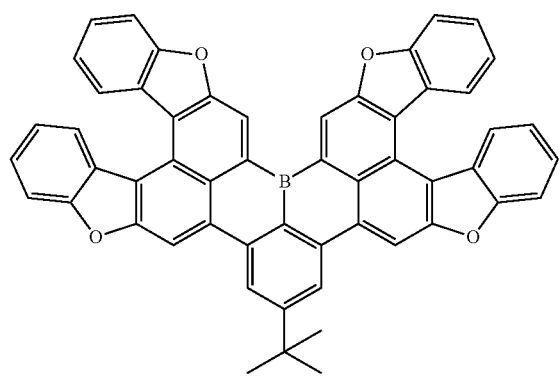
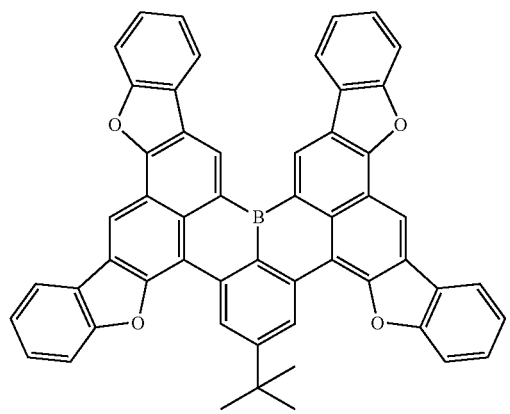
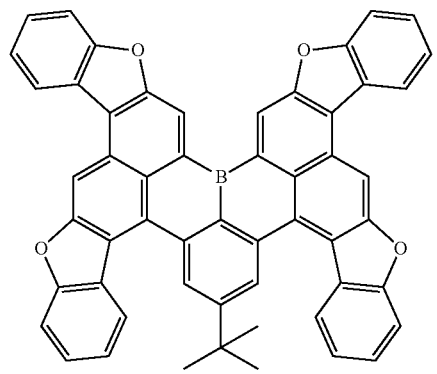
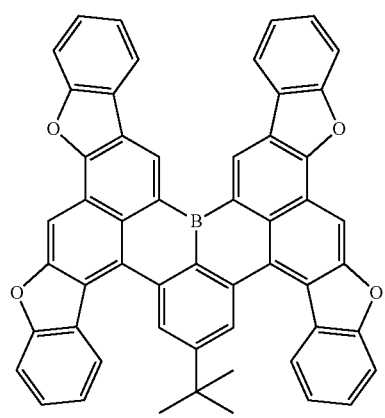
58
-continued
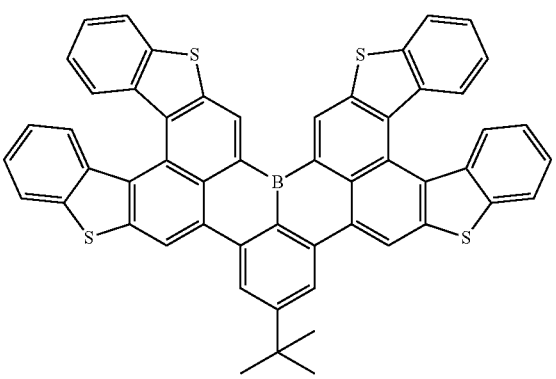
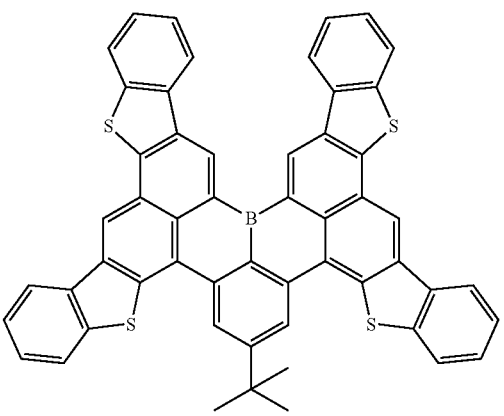
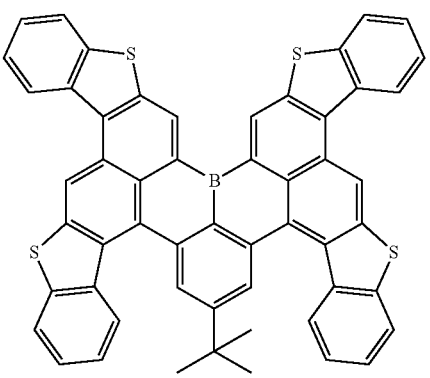
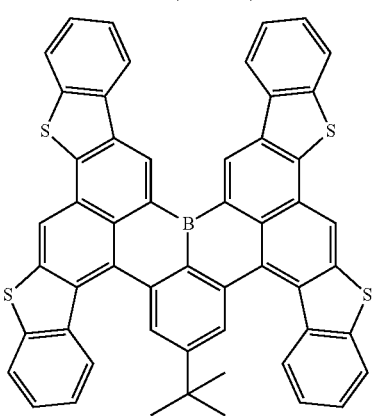

-continued
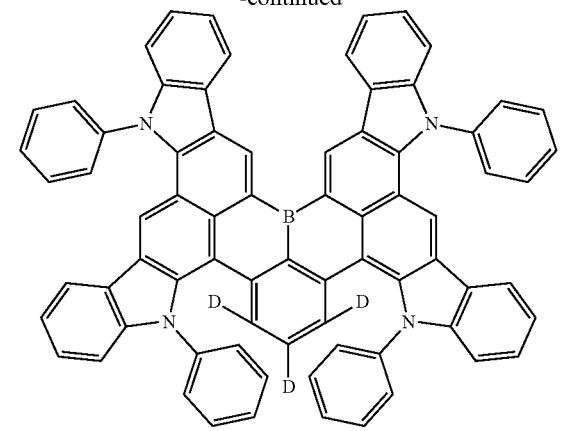
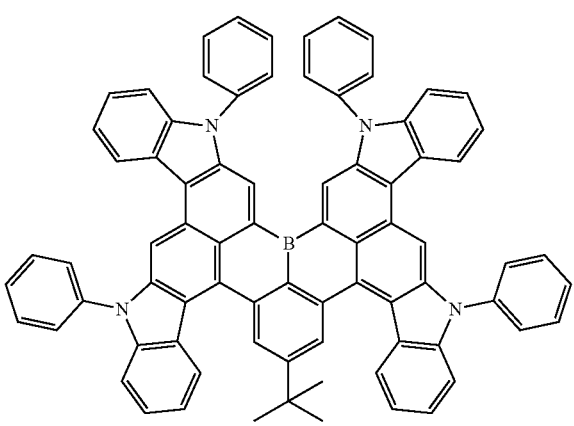
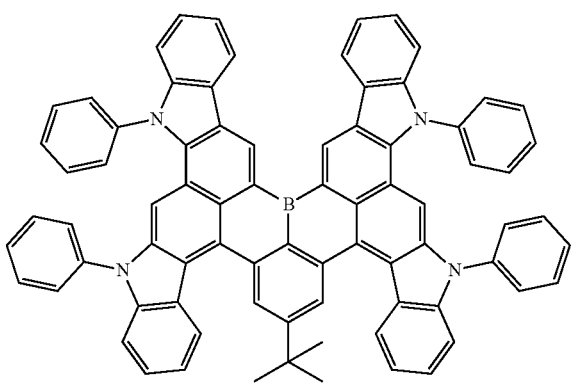
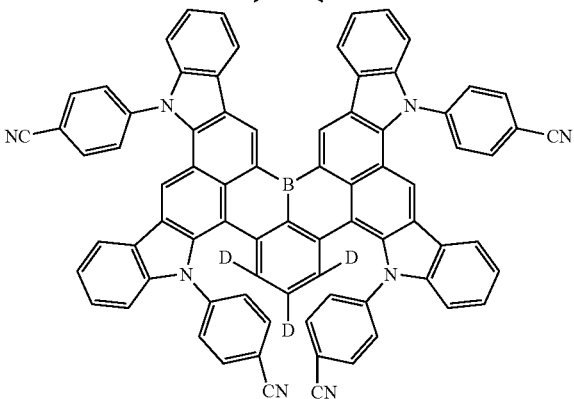
-continued
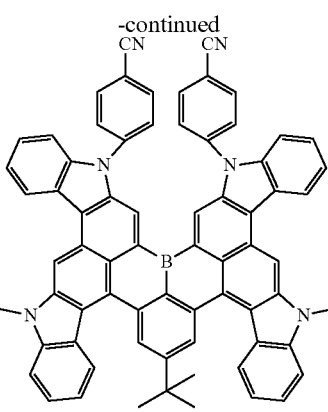
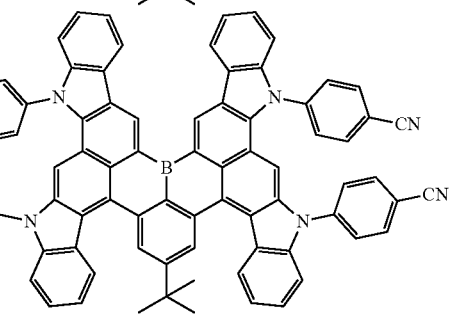
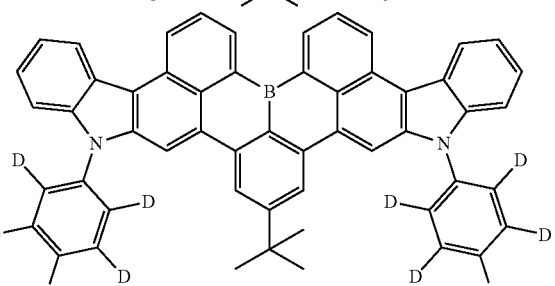
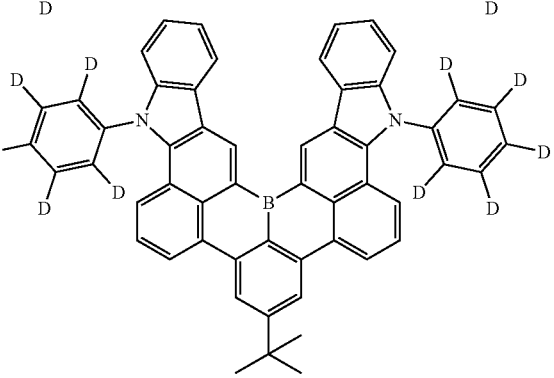
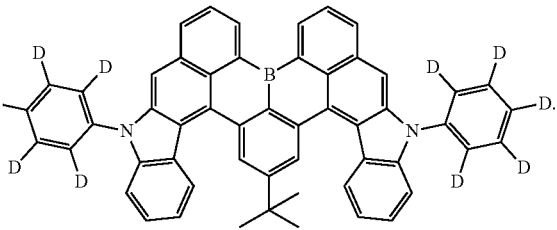
Also, the present specification provides an organic light emitting device including the aforementioned compound.
In one embodiment of the present specification provides an organic light emitting device including: a first electrode; a second electrode facing the first electrode; and at least one organic material layer interposed between the first electrode and the second electrode, wherein the at least one organic material layer contains the compound described above.

In the present specification, it will be understood that, when one member is referred to as being "on" another member, it can directly contact the other member or an intervening member can also be present therebetween.

In the present specification, it will be understood that, when a portion is referred to as "including" one element, the portion can further include another element and does not preclude the presence thereof, unless clearly indicates otherwise.

The organic material layer of the organic light emitting device according to the present specification can have a single layer structure, or a multiple layer structure in which two or more organic material layers are laminated. In a representative example of the organic light emitting device according to the present specification, the organic light emitting device can have, as the organic material layer, a structure including a hole injection layer, a hole transport layer, a light emitting layer, an electron transport layer, an electron injection layer, or the like. However, the structure of the organic light emitting device is not limited thereto and can include a smaller number of organic material layers.

In one embodiment of the present specification, the organic material layer includes a light emitting layer, and the light emitting layer contains the compound.

In one embodiment of the present specification, the organic material layer includes a light emitting layer, and the light emitting layer is a blue light emitting layer.

In one embodiment of the present specification, the organic material layer includes a light emitting layer, and the light emitting layer is a green light emitting layer.

In one embodiment of the present specification, the organic material layer includes a light emitting layer, and the light emitting layer contains the compound as a dopant.

In one embodiment of the present specification, the organic material layer includes a light emitting layer, and the light emitting layer contains the compound and a host compound.

In one embodiment of the present specification, the organic layer includes a light emitting layer, and the light emitting layer contains the compound and the host compound in a weight ratio of 1:1 to 1:99.

In one embodiment of the present specification, the organic layer includes a light emitting layer, and the light emitting layer contains the compound and the host compound in a weight ratio of 1:1 to 1:50.

In one embodiment of the present specification, the organic layer includes a light emitting layer, and the light emitting layer contains the compound and two different host compounds.

As described above, when two different hosts are used as the host of the light emitting layer, the lifetime and efficiency of the device are improved.

In one embodiment of the present specification, any one of the two different host compounds is an assistant dopant or sensitizer.

At this time, the compound serving as the assistant dopant or sensitizer receives holes and electrons from the host to form an exciton, and functions to transfer the formed exciton to a fluorescent dopant.

In a general organic light emitting device, a ratio of the numbers of excitons formed in the singlet and triplet is 25:75 (singlet:triplet), and fluorescent emission, phosphorescent emission and thermally activated delayed-phosphorescent emission can be divided depending on the type of light emission depending on movement of excitons. The phosphorescent emission means that excitons fall from the triplet excited state into the ground state, resulting in emission of light. The fluorescent emission means that excitons fall from the singlet excited state to the ground state, resulting in emission of light. The thermally activated delayed-fluorescent emission means that reversed intersystem crossing (RISC) is induced from the triplet excited state to the singlet excited state and excitons move from the singlet excited state to the excited state, resulting in emission of fluorescent light.

According to one embodiment of the present specification, the triplet energy level of the compound serving as an assistant dopant or sensitizer is 2.1 eV or more, preferably 2.1 eV or more and 3.0 eV or less, 2.2 eV or more and 3.0 eV or less, or 2.4 eV or more and 2.9 eV or less. When the triplet energy level of the compound of Chemical Formula 1 satisfies the range defined above, electrons are readily injected and the formation ratio of excitons increases, so that the luminous efficiency is advantageously increased.

According to one embodiment of the present specification, the difference between the singlet energy level and the triplet energy level of the compound serving as an assistant dopant or sensitizer is 0 eV or more and 0.3 eV or less, preferably 0 eV or more and 0.2 eV or less. When the difference between the singlet energy level and the triplet energy level of the compound serving as an assistant dopant or sensitizer satisfies the range defined above, the excitons formed in the triplet are shifted to the singlet state at an increasing rate and an increasing speed due to the reversed intersystem crossing (RISC), the time at which the excitons stay in the triplet is shortened, so that the efficiency and lifetime of the organic light emitting device can be improved.

In the present specification, the triplet energy can be measured using a spectroscopic instrument capable of measuring fluorescence and phosphorescence. Regarding the measurement conditions, a 10-6M solution is prepared using toluene or THF as a solvent at a cryogenic temperature using liquefied nitrogen, and the spectra emitted from the triplet is analyzed and identified, excluding the spectra emitted from the singlet, from the emission spectrum, when emitting light from a light source with an absorption wavelength band of a material to the solution. When the electrons are reversed from the light source, the time at which electrons stay in the triplet state becomes much longer than the time at which electrons stay in the singlet state, so that the two components can be separated at a cryogenic temperature.

In the present specification, the singlet energy is measured using a fluorescent device, and the light source is applied at room temperature, unlike the measurement method of triplet energy described above. In one embodiment of the present specification, the compound, excluding the assistant dopant, among the host compound, can be selected from the following structural formulas, but is not limited thereto.

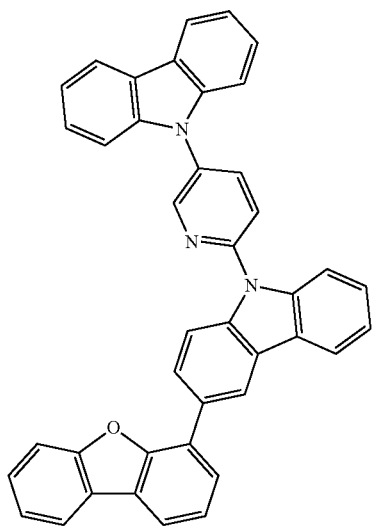
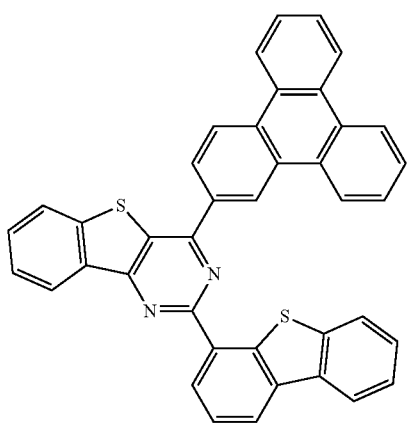
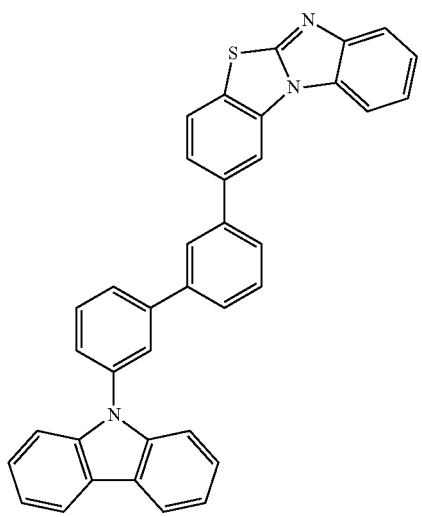
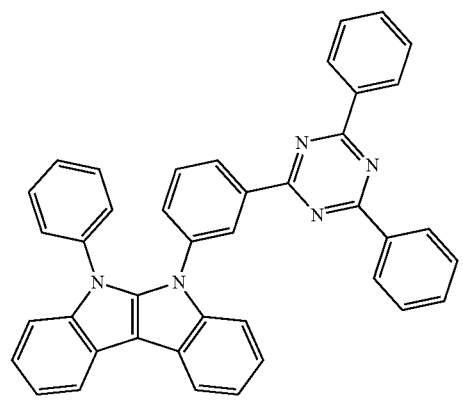
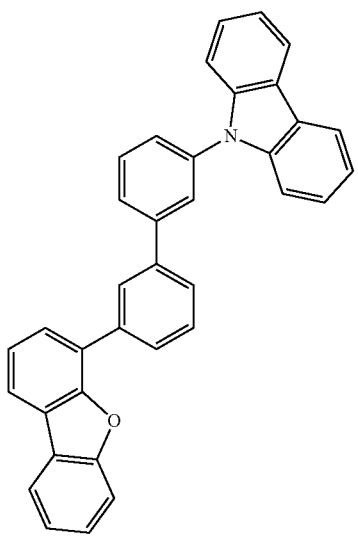
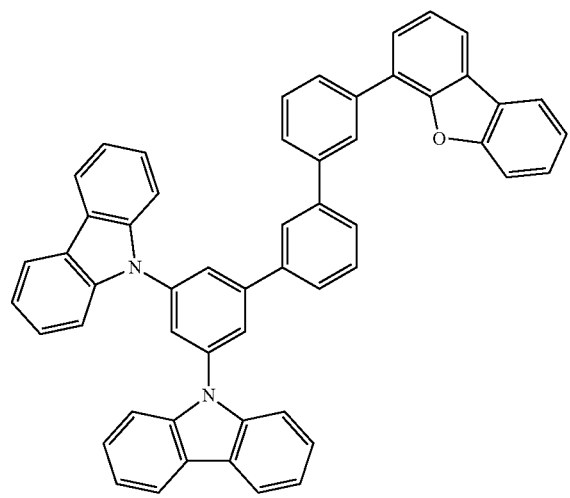

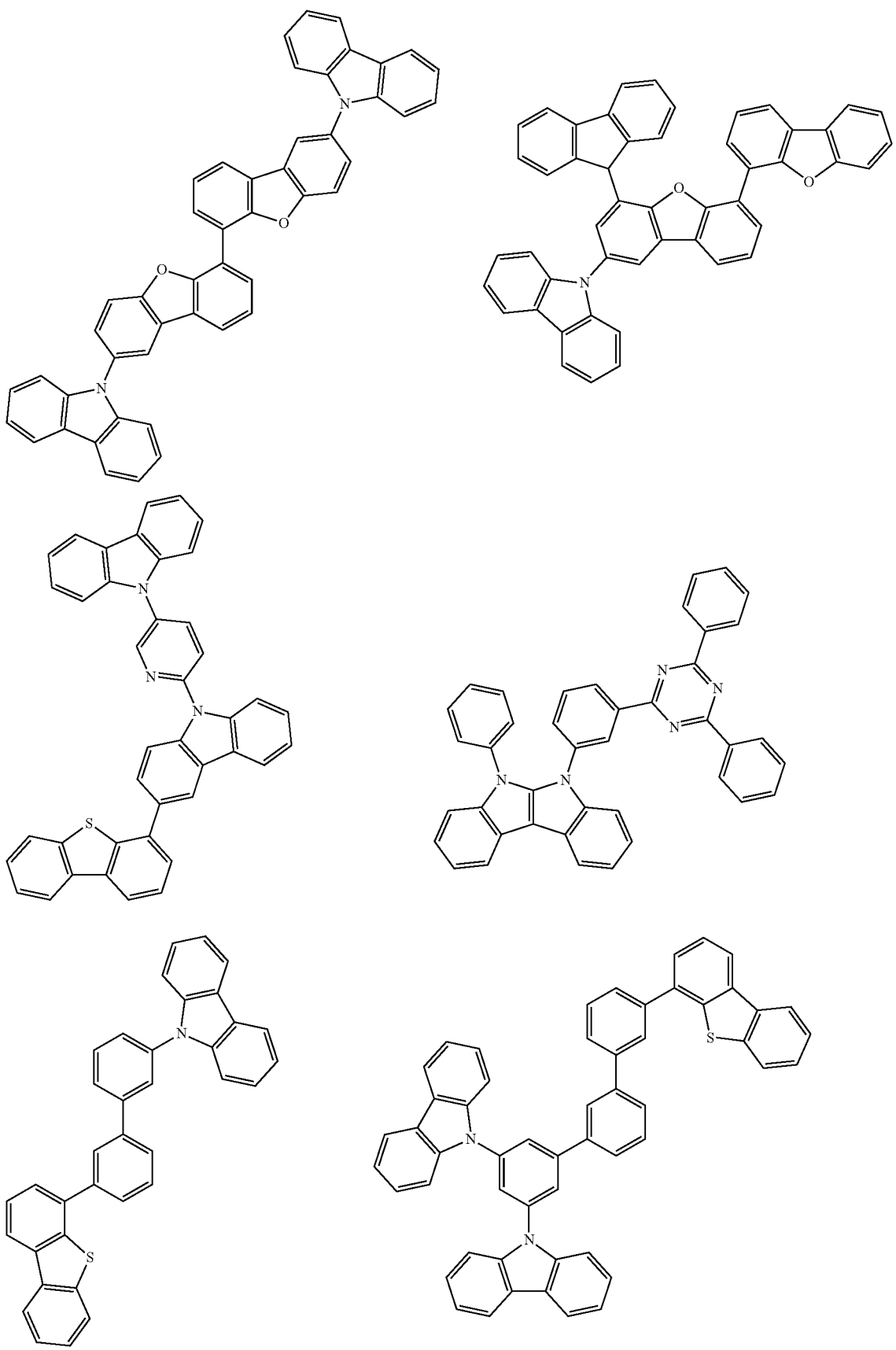

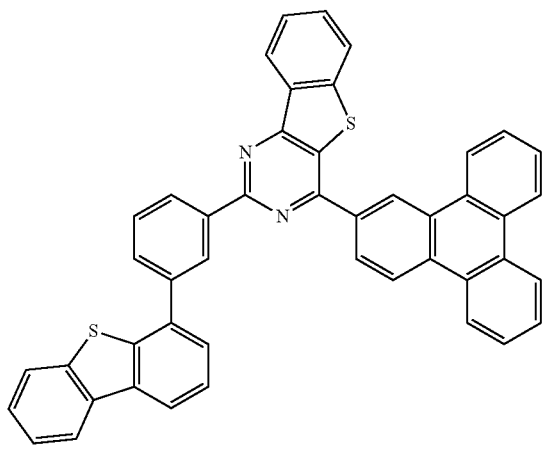
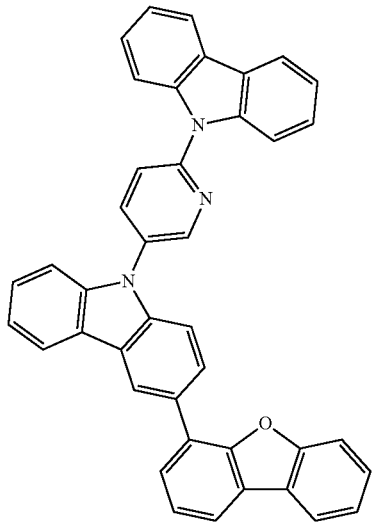
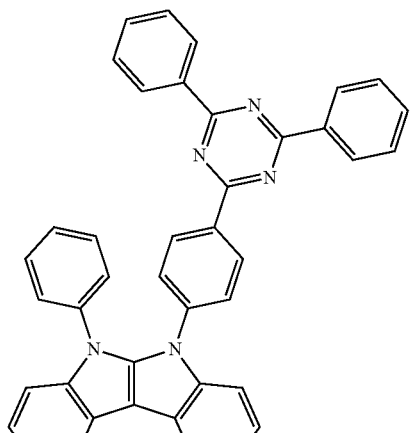
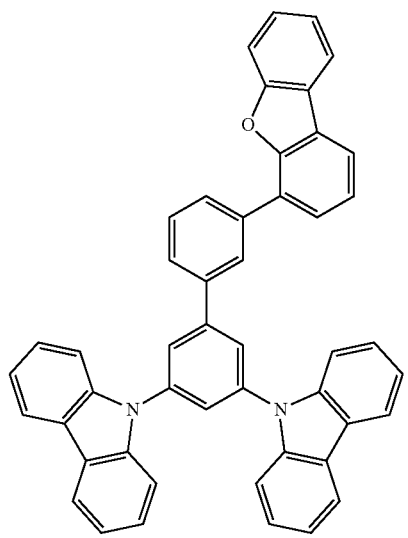
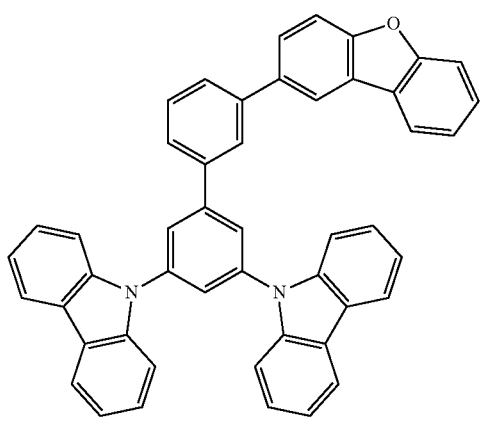
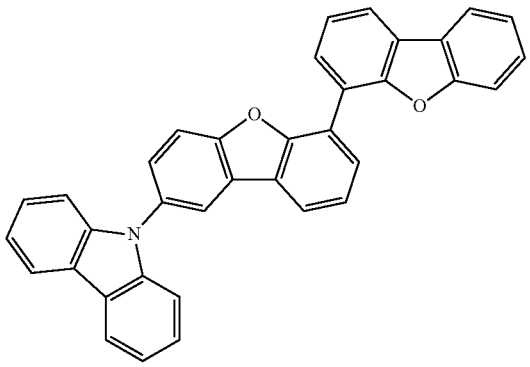

-continued
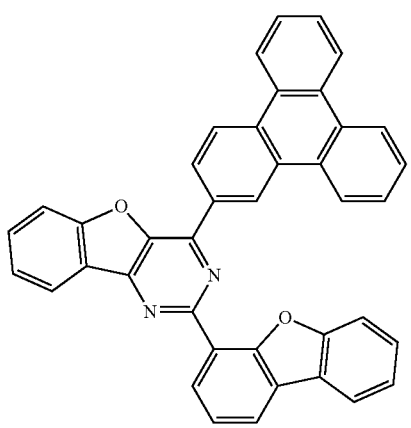
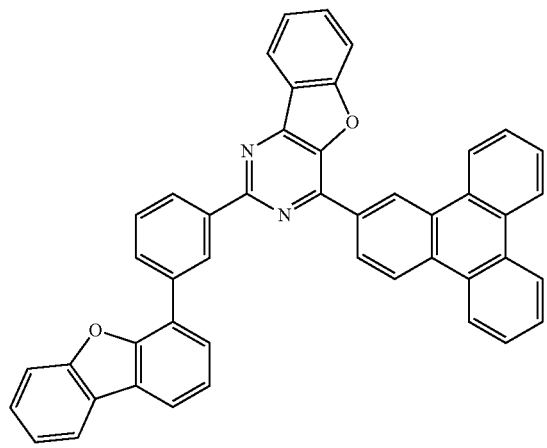
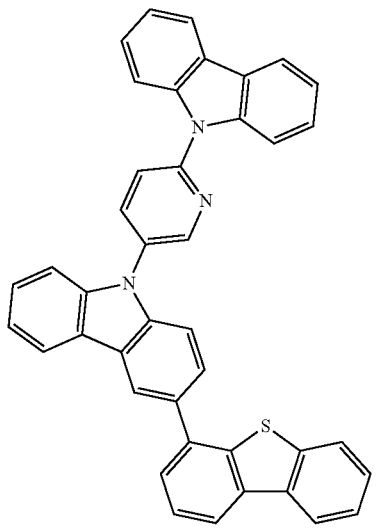
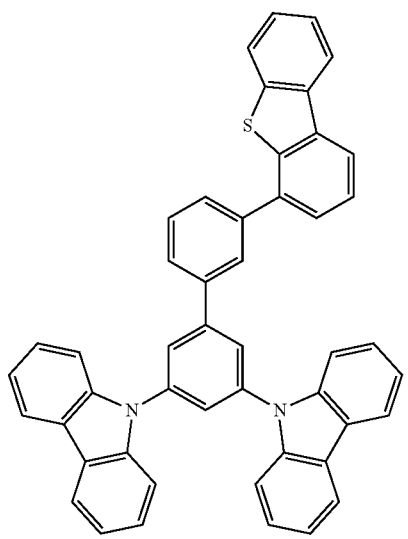
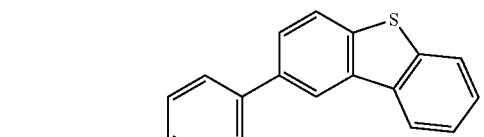
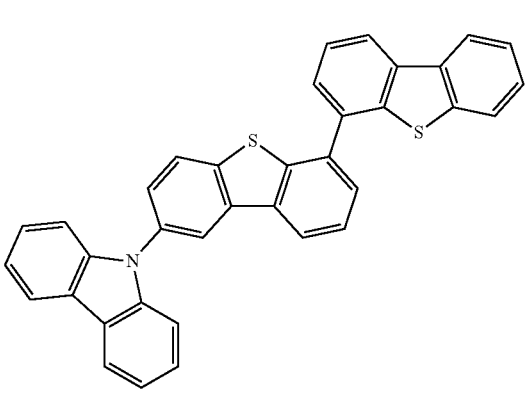
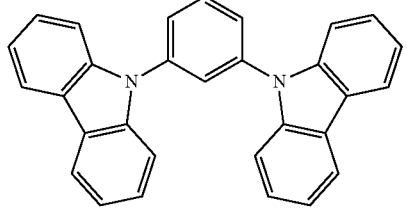
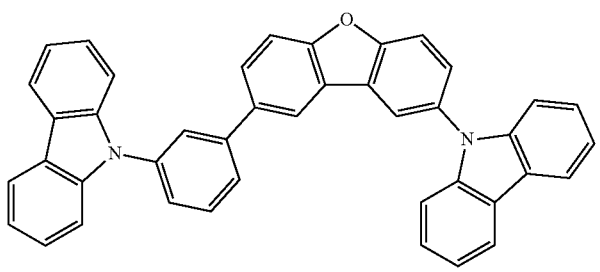

-continued
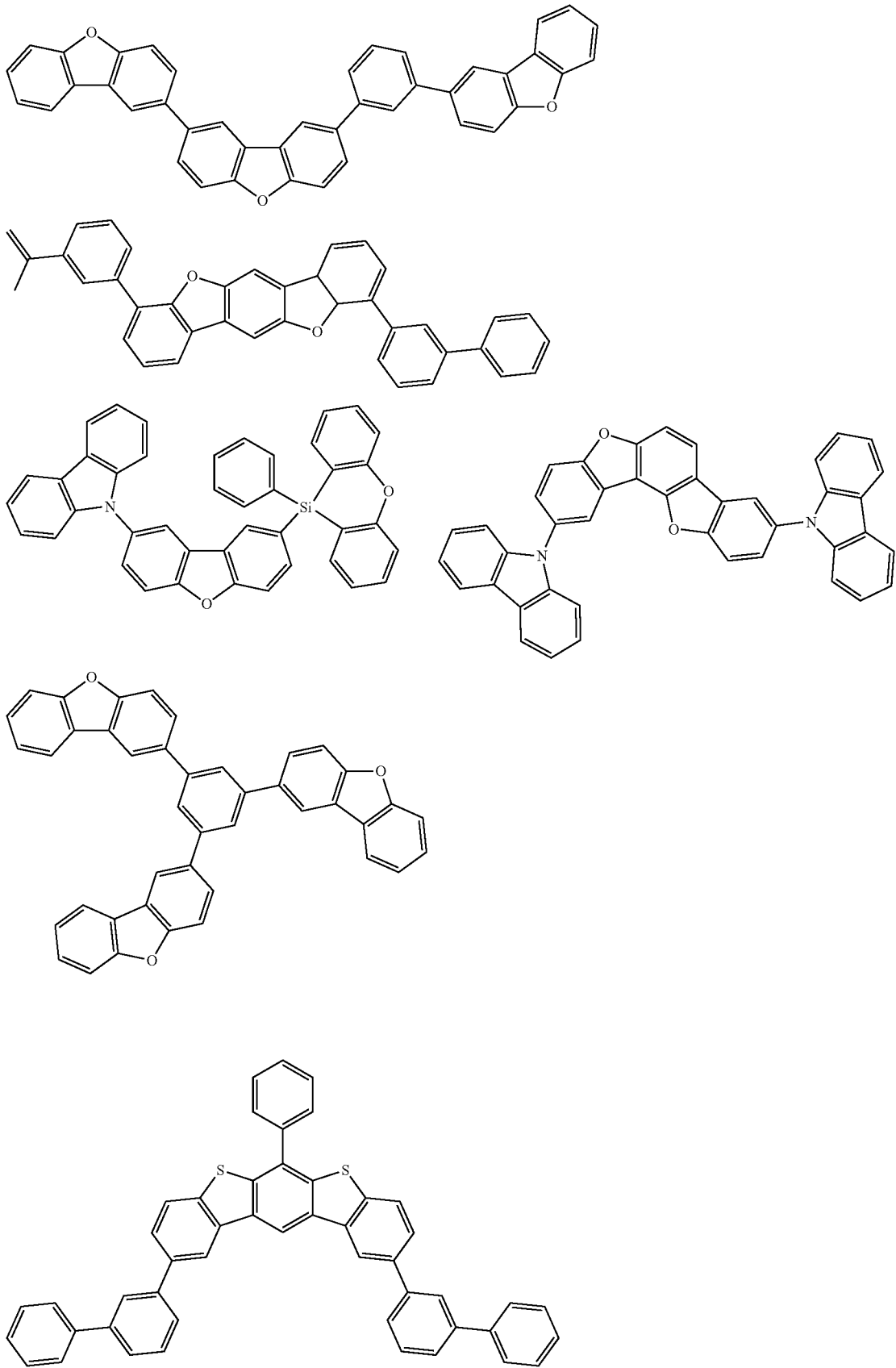

-continued
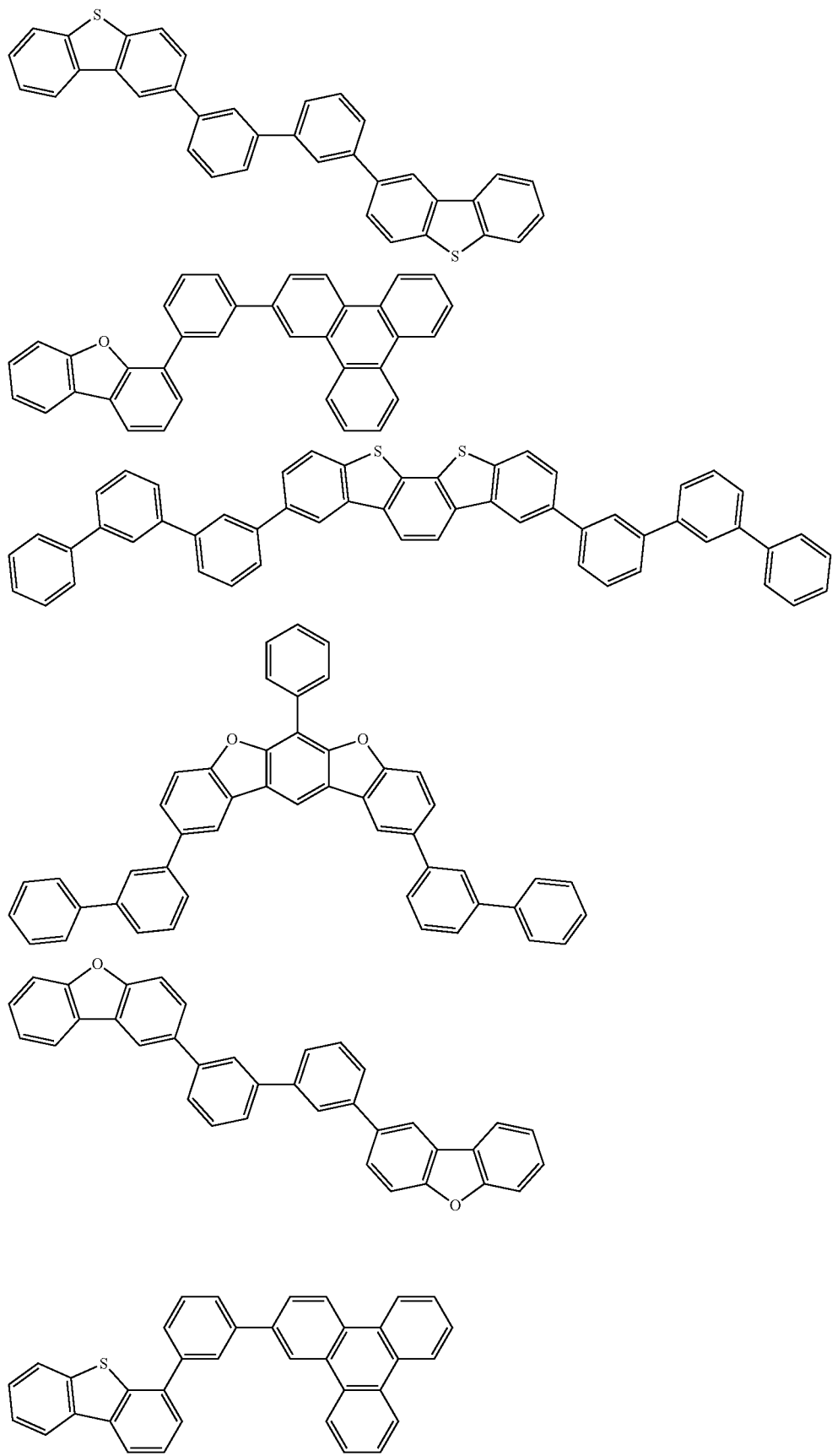

-continued
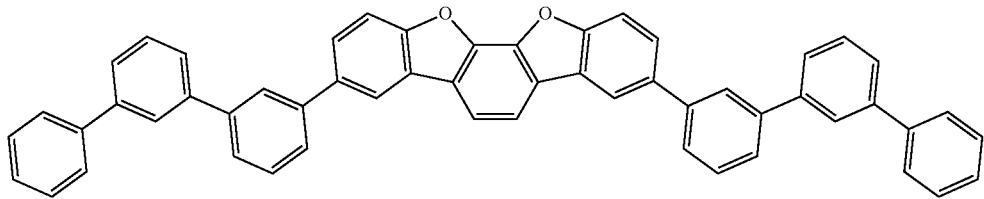
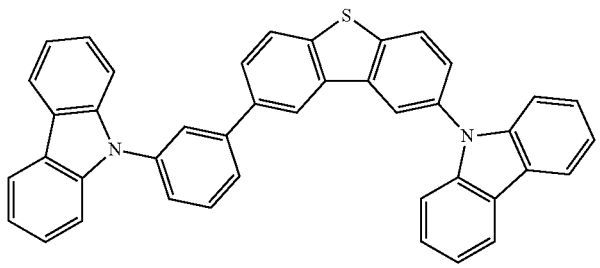
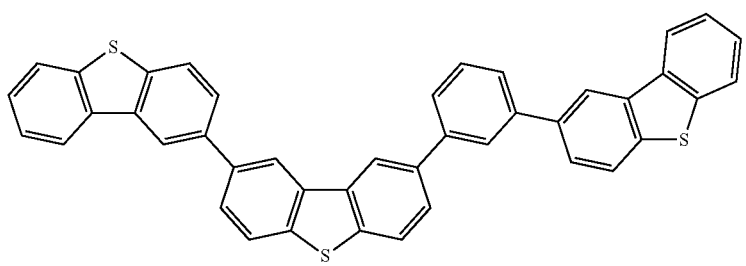
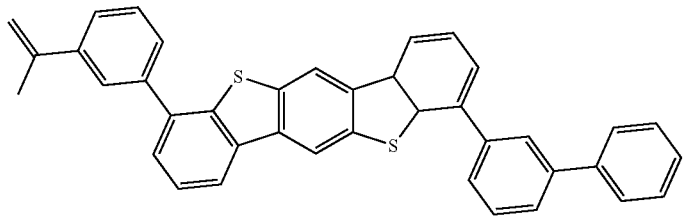
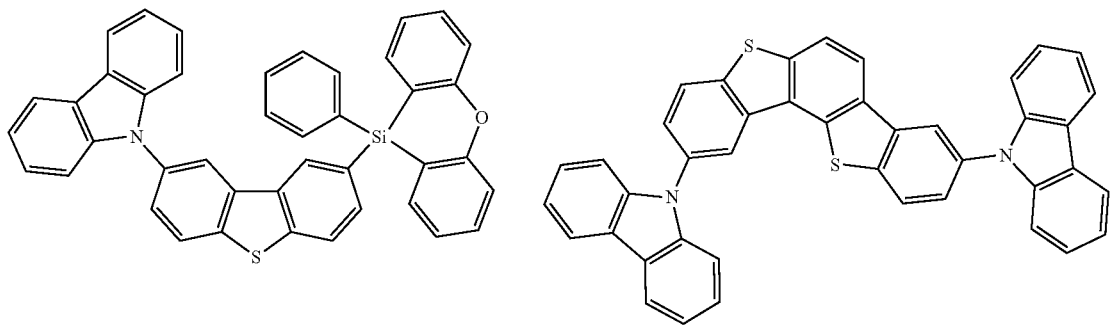
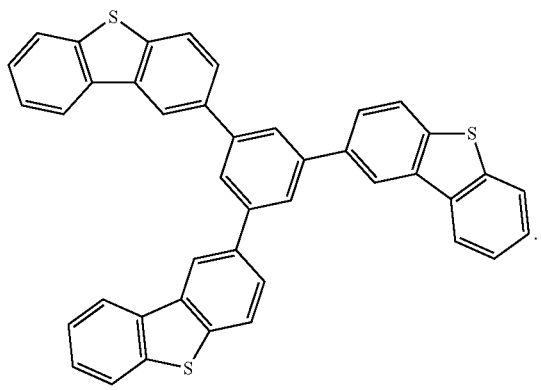

In one embodiment of the present specification, the organic material layer can include a hole injection layer or a hole transport layer, and the hole injection layer or the hole transport layer can contain the compound described above.

In one embodiment of the present specification, the organic material layer can include a hole injection layer, a hole transport layer or a hole injection and transport layer, and the hole injection layer, the hole transport layer or the hole injection and transport layer can contain the compound described above.

In one embodiment of the present specification, the organic material layer can include an electron transport layer or an electron injection layer, and the electron transport layer or the electron injection layer can contain the compound described above.

In one embodiment of the present specification, the organic material layer can include an electron injection layer, an electron transport layer or an electron injection and transport layer, and the electron injection layer, the electron transport layer or the electron injection and transport layer can contain the compound described above.

In one embodiment of the present specification, the organic material layer can include an electron blocking layer or a hole blocking layer, and the electron blocking layer or the hole blocking layer can contain the compound described above.

In one embodiment of the present specification, the organic light emitting device includes: a first electrode; a second electrode facing the first electrode; a light emitting layer interposed between the first electrode and the second electrode; and two or more organic material layers interposed between the light emitting layer and the first electrode, or between the light emitting layer and the second electrode, wherein at least one of the two or more organic material layers contains the compound described above.

In one embodiment of the present specification, the two or more organic material layers can include two or more layers selected from an electron transport layer, an electron injection layer, an electron injection and transport layer performing two functions of electron transport and injection, and a hole blocking layer.

In one embodiment of the present application, the organic material layer includes two or more electron transport layers, and at least one of the two or more electron transport layers includes the compound described above. Specifically, in one embodiment of the present specification, the compound can be contained in one of the two or more electron transport layers, and can be contained in each of two or more electron transport layers.

In addition, in the embodiment of the present application, when the compound is contained in each of the two or more electron transport layers, the materials other than the compound described above can be identical to or different from each other.

In one embodiment of the present application, the organic material layer further includes a hole injection layer or a hole transport layer containing a compound having an arylamino group, a carbazolyl group or a benzocarbazolyl group, in addition to the organic compound layer containing the compound.

In another embodiment, the organic light emitting device can be a normal-type organic light emitting device in which an anode, at least one organic material layer and a cathode are sequentially laminated on a substrate.

In another embodiment, the organic light emitting device can be an inverted type organic light emitting device in which a cathode, at least one organic material layer and an anode are sequentially laminated on a substrate.

For example, the structure of an organic light emitting device according to one embodiment of the present application is illustrated in FIG. 1 and FIG. 2.

FIG. 1 shows a structure of an organic light emitting device in which a substrate 1, an anode 2, a light emitting layer 3, and a cathode 4 are sequentially laminated. In such a structure, the compound can be contained in the light emitting layer 3.

FIG. 2 illustrates a structure of an organic light emitting device in which a substrate 1, an anode 2, a hole injection layer 5, a hole transport layer 6, a light emitting layer 3, an electron transport layer 7 and a cathode 4 are sequentially laminated. In such a structure, the compound can be contained in at least one of the hole injection layer 5, the hole transport layer 6, the light emitting layer 3 and the electron transport layer 7.

FIG. 3 illustrates a structure of an organic light emitting device in which a substrate 1, an anode 2, a hole injection layer 5, a hole transport layer 6, an electron blocking layer 8, a light emitting layer 3, an electron injection and transport layer 9 and a cathode 4 are sequentially laminated. In such a structure, the compound can be contained in at least one of the light emitting layer 3, but the present invention is not limited thereto.

In such a structure, the compound can be contained in at least one of the hole injection layer, the hole transport layer, the light emitting layer and the electron transport layer.

The organic light emitting device of the present specification can be fabricated using materials and methods well-known in the art, except that at least one organic material layer contains the compound according to the present specification, that is, the compound described above.

When the organic light emitting device includes a plurality of organic material layers, the organic material layers can be formed with identical or different materials.

For example, the organic light emitting device according to the present specification can be fabricated by sequentially depositing a first electrode, an organic material layer and a second electrode on a substrate. At this time, the organic light emitting device can be fabricated by depositing a metal, a metal oxide having conductivity, or an alloy thereof on the substrate using a physical vapor deposition (PVD) method such as sputtering or e-beam evaporation to form an anode, forming, on the anode, an organic material layer including a hole injection layer, a hole transport layer, a light emitting layer and an electron transport layer, and then depositing a material for a cathode thereon. Apart from such a method, the organic light emitting device can be fabricated by sequentially depositing a cathode material, an organic material layer and an anode material on a substrate.

In addition, the compound of Chemical Formula 1 can be produced into the organic material layer not only by a vapor deposition method, but also by a solution application method, during the fabrication of the organic light emitting device. Here, the solution application method means spin coating, dip coating, doctor blading, inkjet printing, screen printing, spraying, roll coating or the like, but is not limited thereto.

Apart from such a method, the organic light emitting device can be fabricated by sequentially depositing a cathode material, an organic material layer and an anode material on a substrate (PCT Application Publication No. WO2003/012890), but the fabrication method is not limited thereto.

In one embodiment of the present specification, the first electrode can be an anode and the second electrode can be a cathode.

In another embodiment, the first electrode can be a cathode and the second electrode can be an anode.

Generally, the anode material is preferably a material having a high work function to facilitate injection of holes into the organic material layer. Specifically, examples of the anode material that can be used in the present specification include, but are not limited to: metals such as vanadium, chromium, copper, zinc and gold, or alloys thereof; metal oxides such as zinc oxide, indium oxide, indium tin oxide (ITO) and indium zinc oxide (IZO); combinations of a metal with oxide such as ZnO:Al or $SnO_2$:Sb; conductive polymers such as poly(3-methyl-thiophene), poly[3,4-(ethylene-1,2-dioxy)thiophene] (PEDOT), polypyrrole and polyaniline; and the like.

Generally, the cathode material is preferably a material that has a low work function to facilitate injection of electrons into the organic material layer. Specific examples of the cathode material that can be used in the present specification include, but are not limited to, metals such as magnesium, calcium, sodium, potassium, titanium, indium, yttrium, lithium, gadolinium, aluminum, silver, tin and lead, or alloys thereof; multilayer structure materials such as LiF/Al and $LiO_2$/Al; and the like. The hole injection layer is a layer that injects holes from an electrode, and the hole injection material is preferably a compound that has an ability to transport holes, thus has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably between the work function of an anode material and the HOMO of an adjacent organic material layer. Specific examples of the hole injection material include, but are not limited to, metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like.

The hole transport layer is a layer that receives holes from a hole injection layer and transports the holes to a light emitting layer, and the hole transfer material is preferably a material that is capable of receiving holes from an anode or a hole injection layer, moving the holes to a light emitting layer and having high mobility for the holes. Specific examples of the hole transfer material include, but are not limited to, arylamine-based organic materials, conductive polymers, block copolymers having conjugated parts and non-conjugated parts together, and the like.

The light emitting material is a material that is capable of receiving holes and electrons from the hole transport layer and the electron transport layer, respectively, and emitting visible light by combination between the holes and electrons, and is preferably a material of Chemical Formula 1 having excellent quantum efficiency for fluorescence.

The light emitting layer can include a host material, a sensitizer having thermally activated delayed fluorescence, and a light emitting material of Chemical Formula 1 according to the present specification.

The host material includes a fused aromatic ring derivative, a heteroring-containing compound or the like. Specifically, examples of the fused aromatic ring derivative include, but are not limited to, anthracene derivatives, pyrene derivatives, naphthalene derivatives, pentacene derivatives, phenanthrene compounds, fluoranthene compounds and the like, and examples of the heteroring-containing compound include, but are not limited to, carbazole compounds, dibenzofuran derivatives, ladder-type furan compounds, pyrimidine derivatives and the like.

The sensitizer having thermally activated delayed fluorescence is a material having $\Delta E_{ST}$ (difference between singlet energy and triplet energy) less than 0.2 eV.

The electron transport layer is a layer that receives electrons from the electron injection layer and transports the electrons to the light emitting layer and the electron transport material is preferably a material that is capable of favorably receiving electrons from the cathode and transporting the electrons to the light emitting layer and has high mobility for electrons. Specifically, examples of the electron transport material include, but are not limited to: Al complexes of 8-hydroxyquinoline, complexes including $Alq_3$, organic radical compounds, hydroxyflavone-metal complexes, and the like. The electron transport layer can be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transport electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specifically, examples of the electron injection material include, but are not limited to, fluorenone, anthraquinodimethane, diphenoquinone, thiopyran dioxide, oxazole, oxadiazole, triazole, imidazole, perylene tetracarboxylic acid, fluorenylidene methane, anthrone and the like, and derivatives thereof, metal complex compounds, nitrogen-containing 5-membered ring derivatives, and the like.

Examples of the metal complex compound include, but are not limited to, 8-hydroxyquinolinato lithium, bis(8-hydroxy-quinolinato)zinc, bis(8-hydroxyquinolinato)copper, bis(8-hydroxyquinolinato)manganese, tris(8-hydroxyquinolinato)-aluminum, tris (2-methyl-8-hydroxyquinolinato)aluminum, tris (8-hydroxyquinolinato) gallium, bis(10-hydroxybenzo[h]quinolinato)-beryllium, bis (10-hydroxybenzo[h]iquinolinato)zinc, bis(2-methyl-8-quinolinato)chlorogallium, bis(2-methyl-8-quinolinato) (o-cresolato) gallium, bis (2-methyl-8-quinolinato) (1-naphtholato)-aluminum, bis (2-methyl-8-quinolinato) (2-naphtholato) gallium and the like.

The hole blocking layer is a layer that blocks access of holes to the cathode and can be formed under the same conditions as the hole injection layer. Specifically, examples of the hole blocking layer include, but are not limited to, oxadiazole derivatives, triazole derivatives, phenanthroline derivatives, BCP, aluminum complexes and the like.

The organic light emitting device according to the present specification can be a top-emission type, a bottom-emission type or a dual-emission type depending on the materials used.

The compound of Chemical Formula 1 and the organic light emitting device including the same will be described in detail with reference to the following Examples. However, the following examples are provided only for illustration of the present specification and should not be construed as limiting the scope of the present specification.

The method for preparing the substance of the present specification starts with the synthesis of an intermediate into which halide is introduced using substituted or unsubstituted aniline as described below. The aryl or heteroaryl is introduced symmetrically to the halide through the Suzuki reaction and the amino group (—NH$_2$) is substituted by the bromide (—Br) via the Sandmeyer reaction. Then, boron can be introduced eventually using butyllithium and tribromoborane. Compounds of specific examples were synthesized through the following reaction using aniline having various introduced substituents in addition to the types of aniline shown in Preparation Example 1-1.

Preparation Example 1-1: Synthesis of Compound 1-A

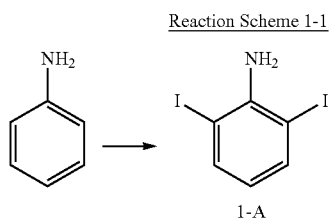

The compound aniline (30 g, 0.32 mol) was thoroughly dissolved in 300 mL of chloroform under a nitrogen atmosphere, and then 0.64 mol of iodine was added to the resulting solution at 0° C., followed by stirring for 2 hours. After the organic layer was extracted with a solution (1 mol, 300 mL) of sodium thiosulfate, the organic layer was thoroughly distilled and purified by column chromatography (chloroform/hexane) to prepare the compound 1-A (105.6 g, yield: 95%).

MS[M+H]$^+$=344

Preparation Example 1-2: Synthesis of Compound 1-B

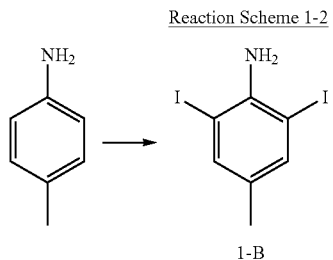

The compound p-toluidine (34.3 g, 0.32 mol) was thoroughly dissolved in 300 mL of chloroform under a nitrogen atmosphere, and then 0.64 mol of iodine was added to the resulting solution at 0° C., followed by stirring for 2 hours. After the organic layer was extracted with a solution (1 mol, 300 mL) of sodium thiosulfate, the organic layer was thoroughly distilled and purified by column chromatography (chloroform/hexane) to prepare the compound 1-B (105.7 g, yield: 92%).

MS[M+H]$^+$=358

Preparation Example 1-3: Synthesis of Compound 1-C

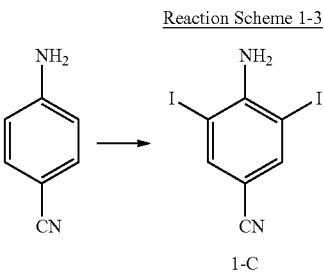 [SMILES: N#Cc1ccc(N)cc1 ; N#Cc1cc(I)c(N)c(I)c1]

The compound 4-aminobenzonitrile (37.8 g, 0.32 mol) was thoroughly dissolved in 300 mL of chloroform under a nitrogen atmosphere, and then 0.64 mol of iodine was added to the resulting solution at 0° C., followed by stirring for 2 hours. After the organic layer was extracted with a solution (1 mol, 300 mL) of sodium thiosulfate, the organic layer was thoroughly distilled and purified by column chromatography (chloroform/hexane) to prepare the compound 1-C (106.5 g, yield: 90%).

MS[M+H]$^+$=369

Preparation Example 1-4: Synthesis of Compound 1-D

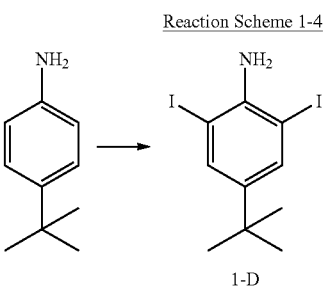

The compound 4-(tert-butyl)aniline (47.8 g, 0.32 mol) was thoroughly dissolved in 300 mL of chloroform under a nitrogen atmosphere, and then 0.64 mol of iodine was added to the resulting solution at 0° C., followed by stirring for 2 hours. After the organic layer was extracted with a solution (1 mol, 300 mL) of sodium thiosulfate, the organic layer was thoroughly distilled and purified by column chromatography (chloroform/hexane) to prepare the compound 1-D (116.7 g, yield: 91%).

MS[M+H]$^+$=401

Preparation Example 2-1: Synthesis of Compound 2-A

Reaction Scheme 2-1

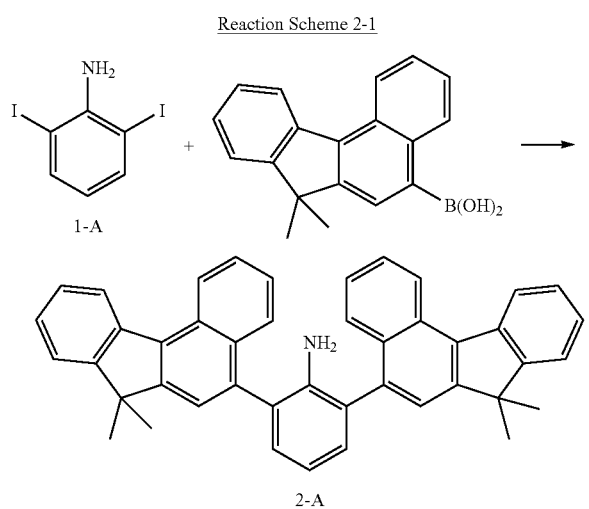

The compound 1-A (31 g, 0.09 mol) was thoroughly dissolved in 300 mL of THF under a nitrogen atmosphere, 130 mL of a 10M aqueous potassium carbonate solution was added to the resulting solution, and 0.10 mol of (7,7-dimethyl-7H-benzo[c]fluoren-5-yl)boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-A (44.2 g, yield: 85%).

MS[M+H]$^+$=577

Preparation Example 2-2: Synthesis of Compound 2-B

Reaction Scheme 2-2

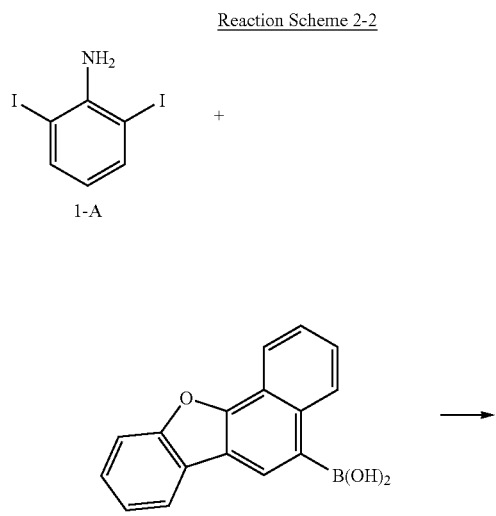

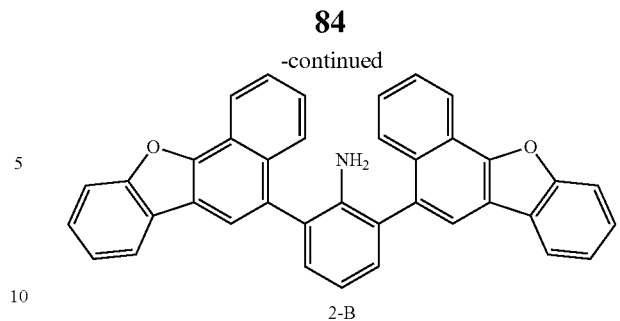

The compound 1-A (31 g, 0.09 mol) was thoroughly dissolved in 300 mL of tetrahydrofuran under a nitrogen atmosphere, and 130 mL of a 10M aqueous potassium carbonate solution was added to the resulting solution, and 0.10 mol of naphtho[1,2-b]benzofuran-5-yl boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-B (38.8 g, yield: 82%).

MS[M+H]$^+$=525

Preparation Example 2-3: Synthesis of Compound 2-C

Reaction Scheme 2-3

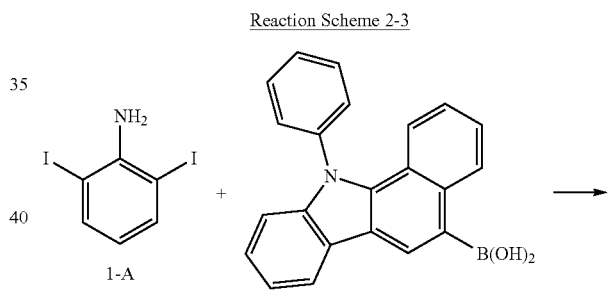

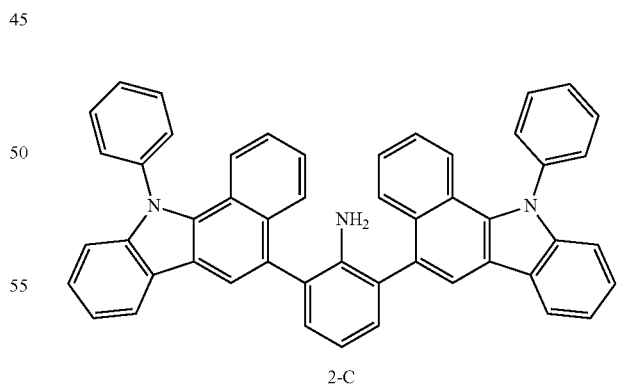

The compound 1-A (31 g, 0.09 mol) was thoroughly dissolved in 300 mL of tetrahydrofuran under a nitrogen atmosphere, and 130 mL of a 10M aqueous potassium carbonate solution was added to the resulting solution, and 0.10 mol of (11-phenyl-11H-benzo[a]carbazol-5-yl) boronic acid was added thereto. Tetrakis triphenylphosphine palladium (2.1 g, 1.8 mmol) was added thereto and was stirred Preparation Example 2-4: Synthesis of Compound 2-D

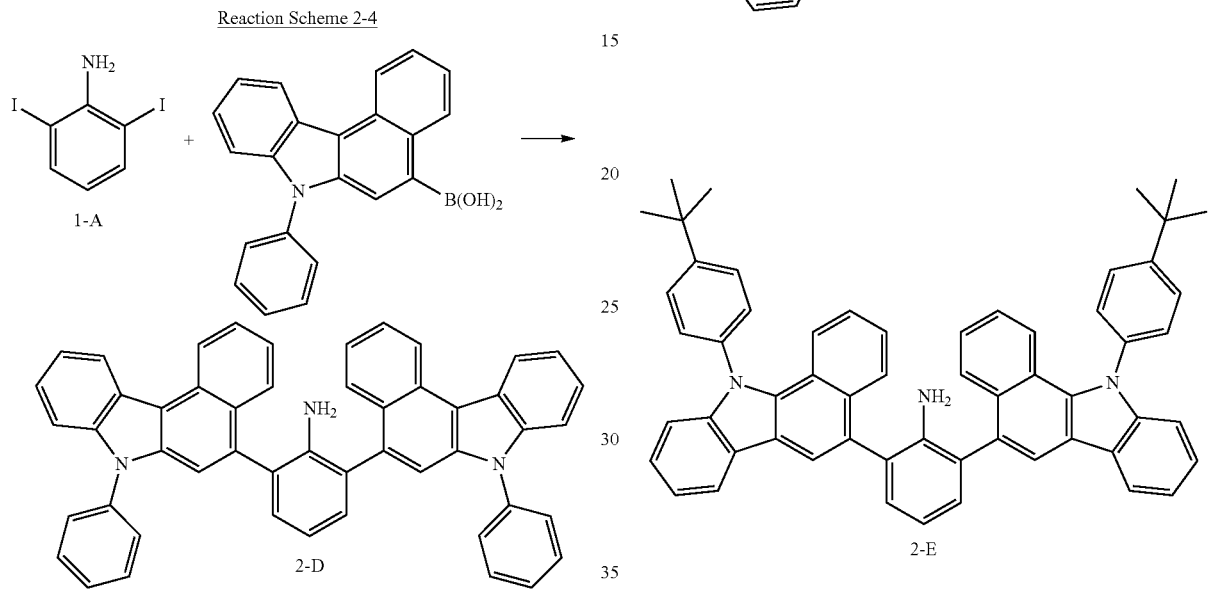

The compound 1-A (31 g, 0.09 mol) was thoroughly dissolved in 300 mL of tetrahydrofuran under a nitrogen atmosphere, and 130 mL of a 10M aqueous potassium carbonate solution was added to the resulting solution, and 0.10 mol of (7-phenyl-7H-benzo[c]carbazol-5-yl)boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-D (49.8 g, yield: 82%).

MS[M+H]$^+$=675

Preparation Example 2-5: Synthesis of Compound 2-E

Reaction Scheme 2-5

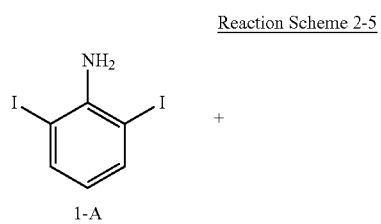  +  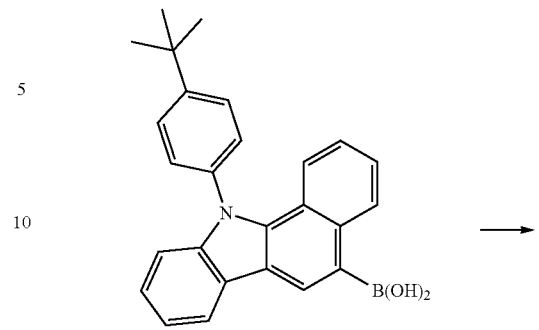

The compound 1-A (31 g, 0.09 mol) was thoroughly dissolved in 300 mL of tetrahydrofuran under a nitrogen atmosphere, 130 mL of a 10M aqueous potassium carbonate solution was added to the resulting solution, and 0.10 mol of (11-(4-(tert-butyl)phenyl)-11H-benzo[a]carbazol-5-yl)boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-E (56.7 g, yield: 80%).

MS[M+H]$^+$=788

Preparation Example 2-6: Synthesis of Compound 2-F

Reaction Scheme 2-6

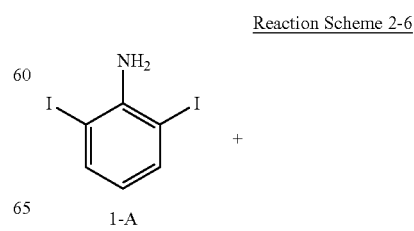  +

-continued

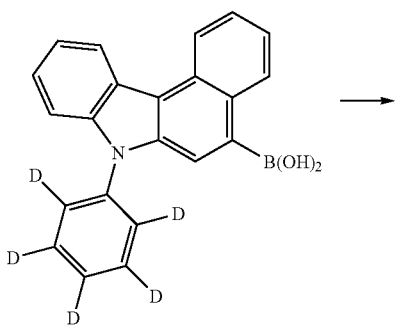

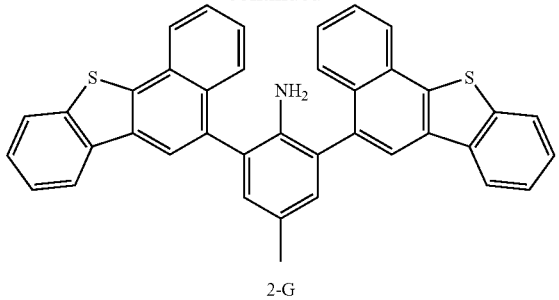

2-G

The compound 1-B (32.3 g, 0.09 mol) was thoroughly dissolved in 300 mL of tetrahydrofuran under a nitrogen atmosphere, 130 mL of a 10M aqueous potassium carbonate solution was added to the resulting solution, and 0.10 mol of benzo[b]naphtho[2,1-d]thiophen-5-yl boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-G (51.4 g, yield: 81%).

MS[M+H]$^+$=571

Preparation Example 2-8: Synthesis of Compound 2-H

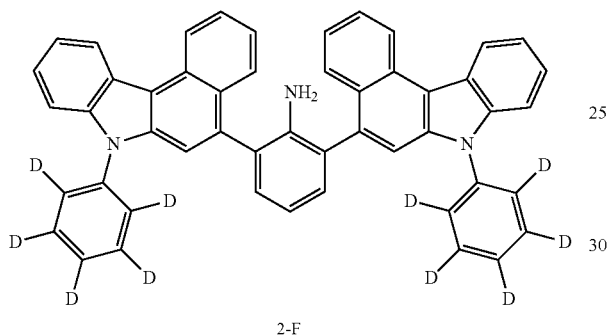

2-F

The compound 1-A (31 g, 0.09 mol) was thoroughly dissolved in 300 mL of tetrahydrofuran under a nitrogen atmosphere, 130 mL of a 10M aqueous potassium carbonate solution was added to the resulting solution, and 0.10 mol of (7-(phenyl-d5)-7H-benzo[c]carbazol-5-yl)boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-F (51.2 g, yield: 83%).

MS[M+H]$^+$=685

Preparation Example 2-7: Synthesis of Compound 2-G

Reaction Scheme 2-7

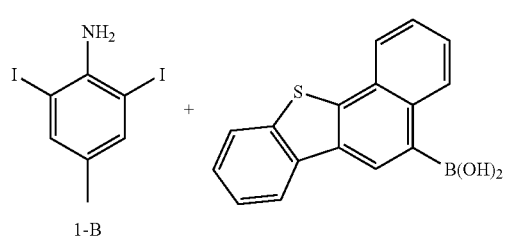

1-B

Reaction Scheme 2-8

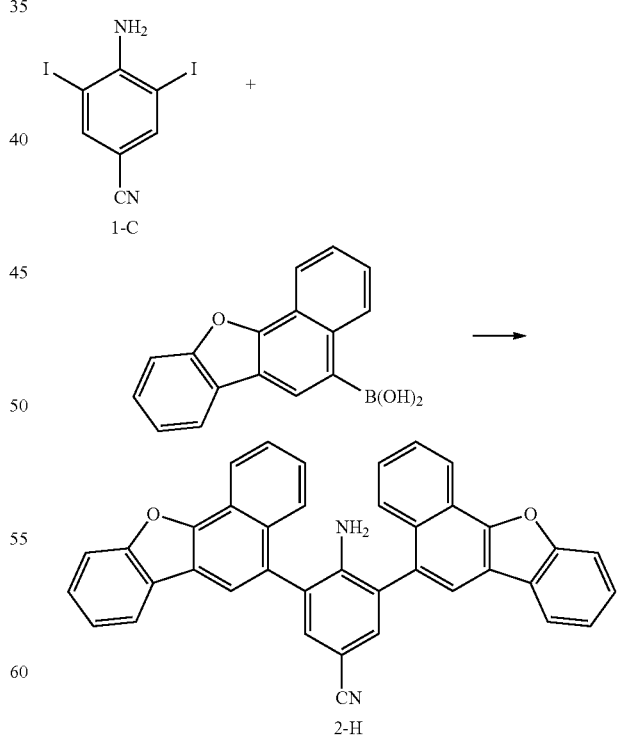

2-H

The compound 1-C (33.3 g, 0.09 mol) was thoroughly dissolved in 300 mL of tetrahydrofuran under a nitrogen atmosphere, 130 mL of a 10M aqueous potassium carbonate solution was added to the resulting solution, and 0.10 mol of naphtho[1,2-b]benzofuran-5-yl boronic acid was added thereto.

Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-H (41.6 g, yield: 84%).

MS[M+H]$^+$=550

Preparation Example 2-9: Synthesis of Compound 2-I

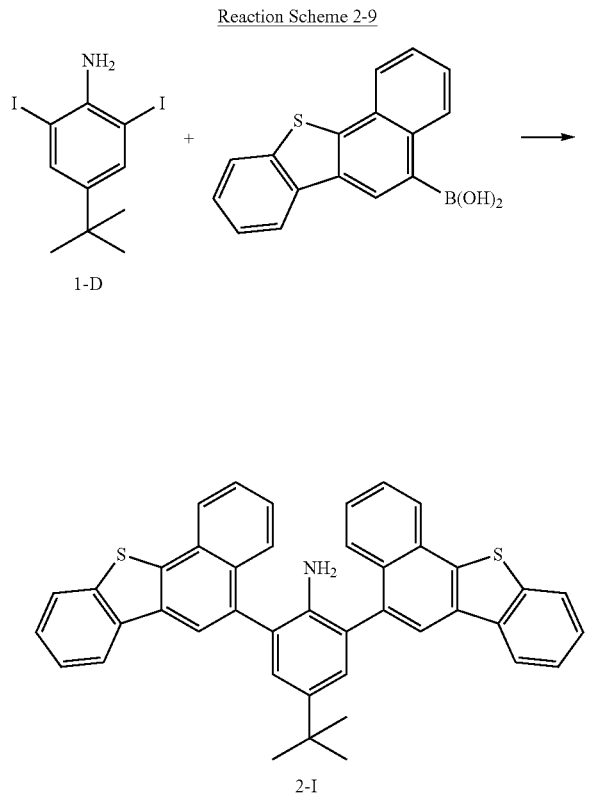

The compound 1-D (36.1 g, 0.09 mol) was thoroughly dissolved in 300 mL of tetrahydrofuran under a nitrogen atmosphere, 130 mL of a 10M aqueous potassium carbonate solution was added to the resulting solution, and 0.10 mol of benzo[b]naphtho[2,1-d]thiophen-5-yl boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-I (44.7 g, yield: 81%).

MS[M+H]$^+$=613

Preparation Example 2-10: Synthesis of Compound 2-J

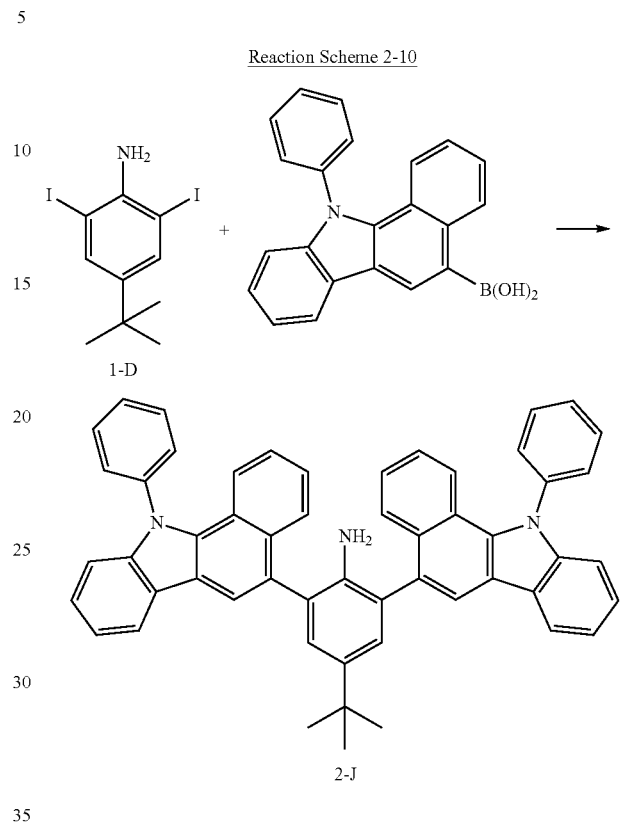

The compound 1-D (36.1 g, 0.09 mol) was thoroughly dissolved in 300 mL of tetrahydrofuran under a nitrogen atmosphere, 130 mL of a 10M aqueous potassium carbonate solution was added to the resulting solution, and 0.10 mol of (11-phenyl-11H-benzo[a]carbazol-5-yl) boronic acid was added thereto. Tetrakis triphenylphosphine palladium (2.1 g, 1.8 mmol) was added thereto and was stirred under reflux for 3 hours. After the reaction was completed, the water layer was removed, and the organic layer was thoroughly distilled and purified by column chromatography (chloroform/hexane) to obtain the compound 2-J (52 g, yield: 79%).

MS[M+H]$^+$=731

Preparation Example 3-1: Synthesis of Compound 3-A

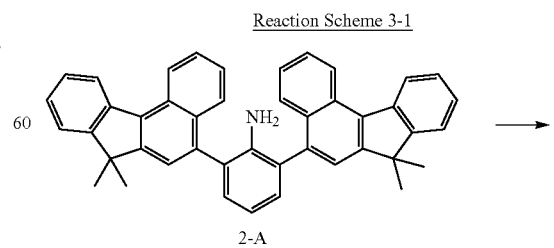

-continued

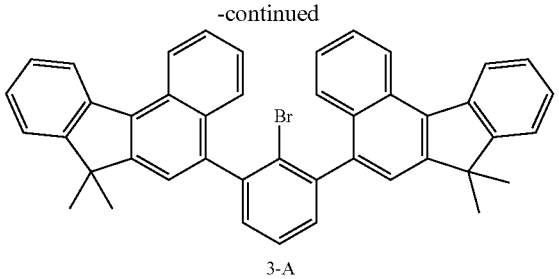

3-A 0.7 L of acetonitrile was added to the compound 2-A (40.4 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-A (34.1 g, yield: 76%).

MS[M+H]$^+$=641

Preparation Example 3-2: Synthesis of Compound 3-B

Reaction Scheme 3-2

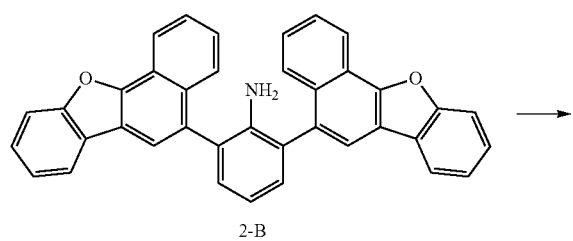

2-B

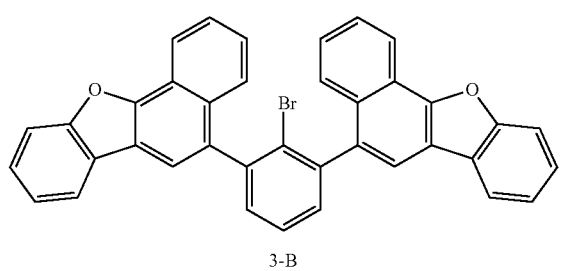

3-B 0.7 L of acetonitrile was added to the compound 2-B (36.8 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-B (30.5 g, yield: 74%).

MS[M+H]$^+$=589

Preparation Example 3-3: Synthesis of Compound 3-C

Reaction Scheme 3-3

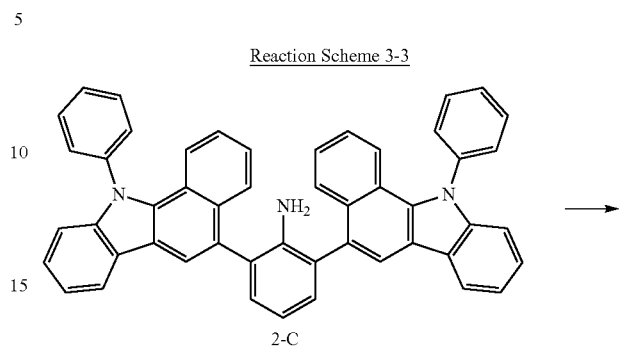

2-C

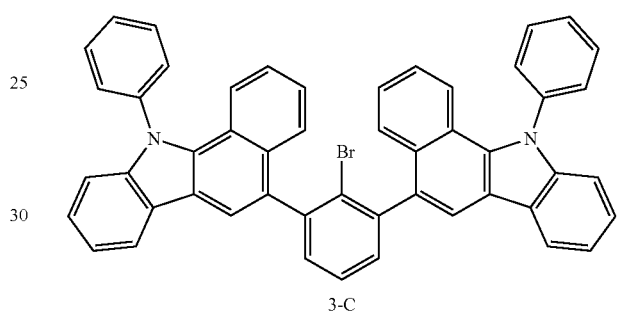

3-C 0.7 L of acetonitrile was added to the compound 2-C (47.3 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-C (38.3 g, yield: 74%).

MS[M+H]$^+$=739

Preparation Example 3-4: Synthesis of Compound 3-D

Reaction Scheme 3-4

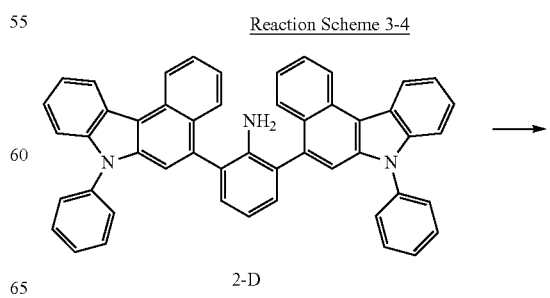

2-D

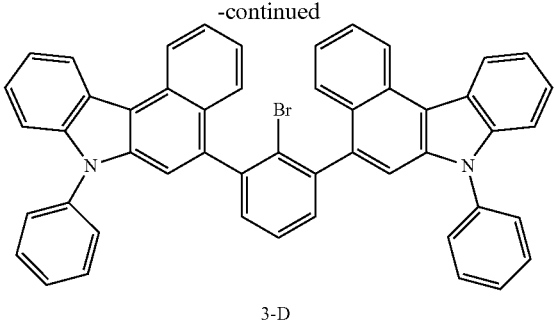

3-D 0.7 L of acetonitrile was added to the compound 2-D (47.3 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-D (36.7 g, yield: 71%).

MS[M+H]$^+$=739

Preparation Example 3-5: Synthesis of Compound 3-E

Reaction Scheme 3-5

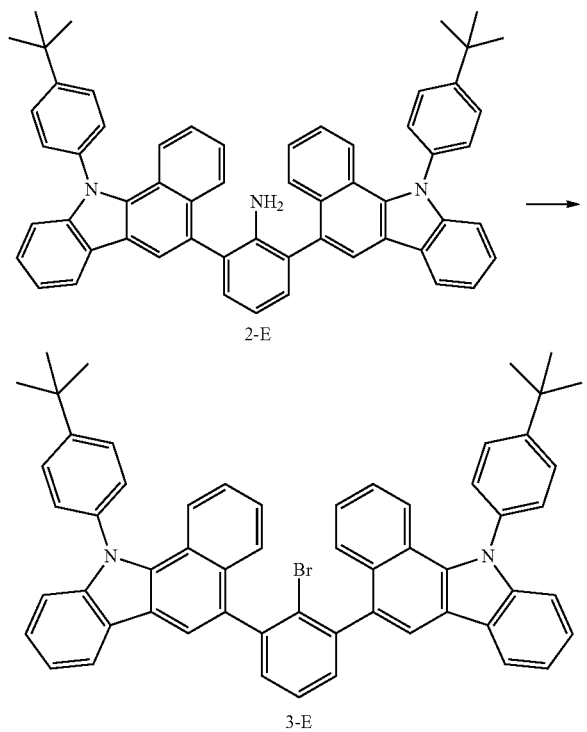

3-E 0.7 L of acetonitrile was added to the compound 2-E (55.2 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-E (42.9 g, yield: 72%).

MS[M+H]=851

Preparation Example 3-6: Synthesis of Compound 3-F Reaction Scheme 3-6

Reaction Scheme 3-6

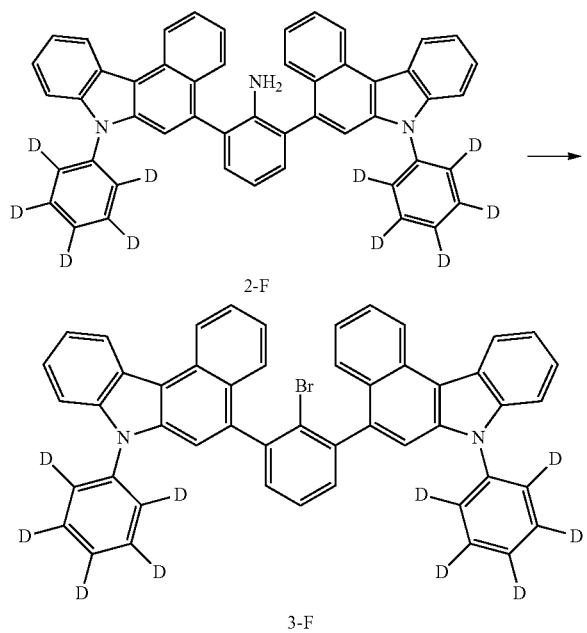

3-F 0.7 L of acetonitrile was added to the compound 2-F (48 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-F (39.3 g, yield: 75%).

MS[M+H]$^+$=749

Preparation Example 3-7: Synthesis of Compound 3-G

Reaction Scheme 3-7

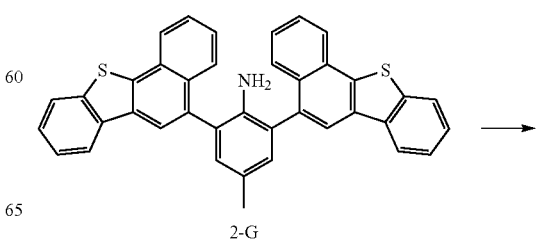

2-G

95

-continued

3-G 0.7 L of acetonitrile was added to the compound 2-G (40 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-G (33.8 g, yield: 76%).

MS[M+H]$^+$=635

Preparation Example 3-8: Synthesis of Compound 3-H

Reaction Scheme 3-8

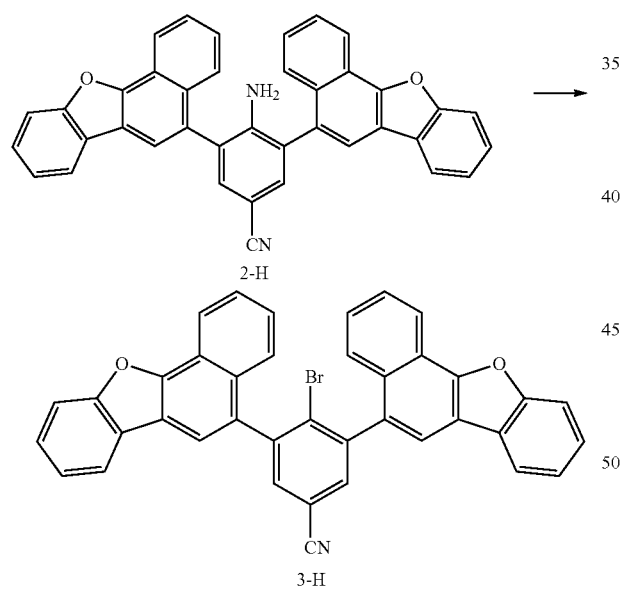

0.7 L of acetonitrile was added to the compound 2-H (38.5 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-H (31.4 g, yield: 73%).

MS[M+H]$^+$=614

96

Preparation Example 3-9: Synthesis of Compound 3-I

Reaction Scheme 3-9

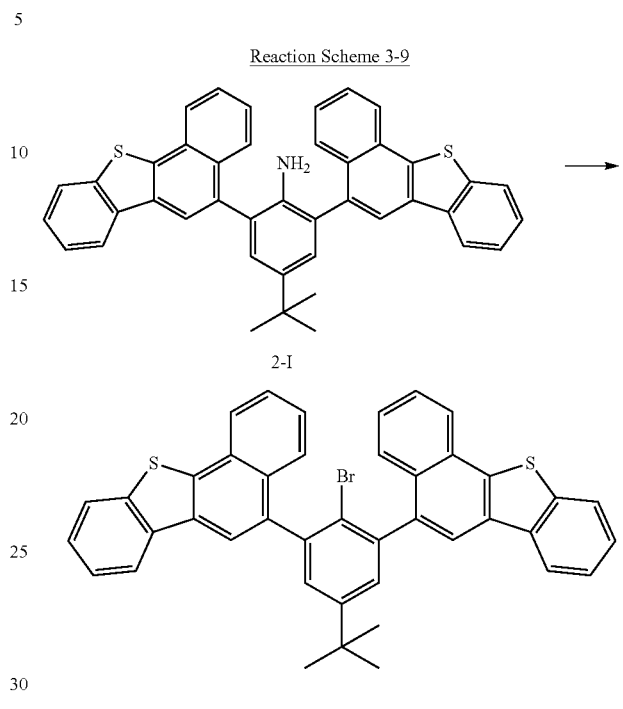

0.7 L of acetonitrile was added to the compound 2-I (42.9 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-I (34.6 g, yield: 73%).

MS[M+H]$^+$=677

Preparation Example 3-10: Synthesis of Compound 3-J

Reaction Scheme 3-10

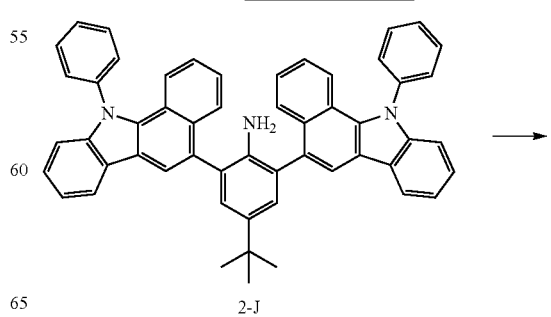

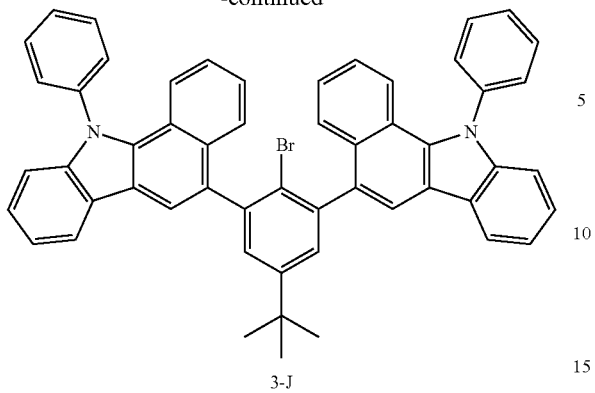

3-J 0.7 L of acetonitrile was added to the compound 2-J (51.2 g, 0.07 mol) under a nitrogen atmosphere, and 15 mL of 12M hydrochloric acid was added to the solution at 0° C. Sodium nitrite (6.9 g, 0.10 mol) was added at 0° C. and stirred for 10 minutes, and cupper bromide (II) (22.3 g, 0.10 mol) was added and heated to 50° C. After heating for 1 hour, the reaction solution was reversely precipitated in 1.5 L of distilled water to obtain a solid. The obtained solid was purified by column chromatography (chloroform/hexane) to obtain the compound 3-J (39.5 g, yield: 71%).

MS[M+H]$^+$=795

Preparation Example 4-1: Synthesis of Compound 1

Reaction Scheme 4-1

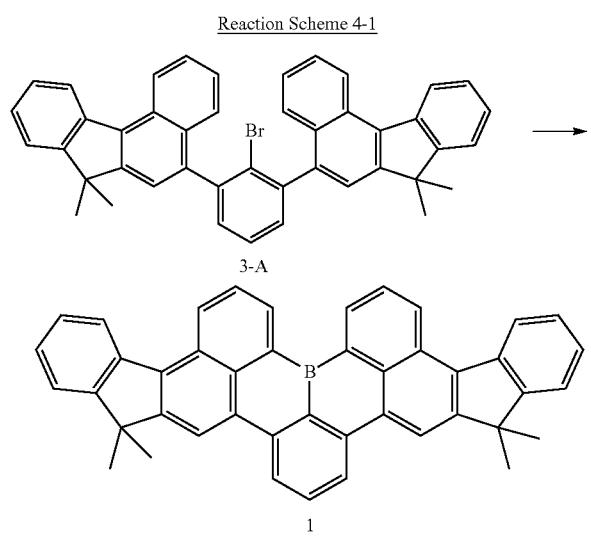

3-A

1

200 ml of toluene was added to the compound 3-A (32 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was added at room temperature, the solvent was completely distilled and purified by column chromatography (chloroform/hexane) to obtain Compound 1 (17.7 g, yield: 62%).

MS[M+H]$^+$=570

Preparation Example 4-2: Synthesis of Compound 2

Reaction Scheme 4-2

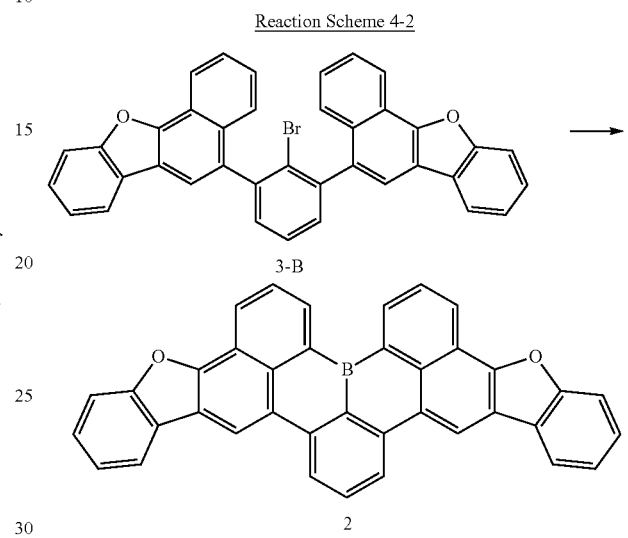

3-B

2

200 ml of toluene was added to the compound 3-B (29.5 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 1 (15.8 g, yield: 61%).

MS[M+H]$^+$=518

Preparation Example 4-3: Synthesis of Compound 3

Reaction Scheme 4-3

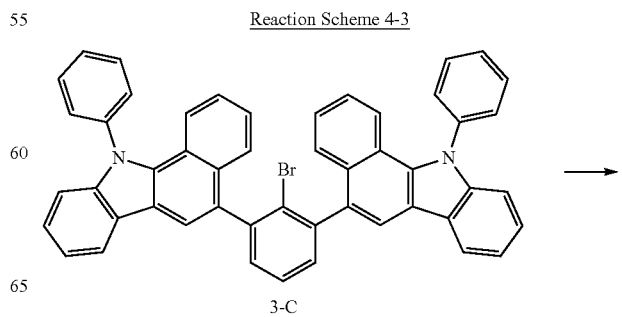

3-C

-continued

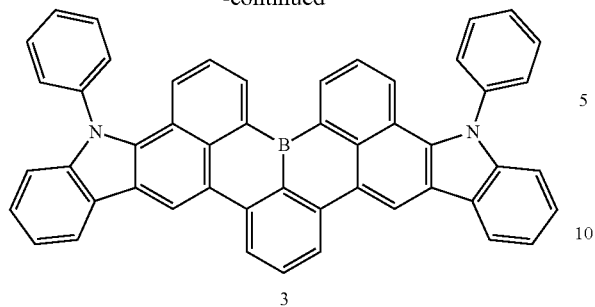

3

200 ml of toluene was added to the compound 3-C (37 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction refluxed for 20 hours. After diisopropylethylamine (6.5 g, 0.05 ml) was further added at room temperature, the solvent was completely distilled and purified by column chromatography (chloroform/hexane) to obtain Compound 3 (21.4 g, yield: 64%).

MS[M+H]$^+$=668

Preparation Example 4-4: Synthesis of Compound 4

Reaction Scheme 4-4

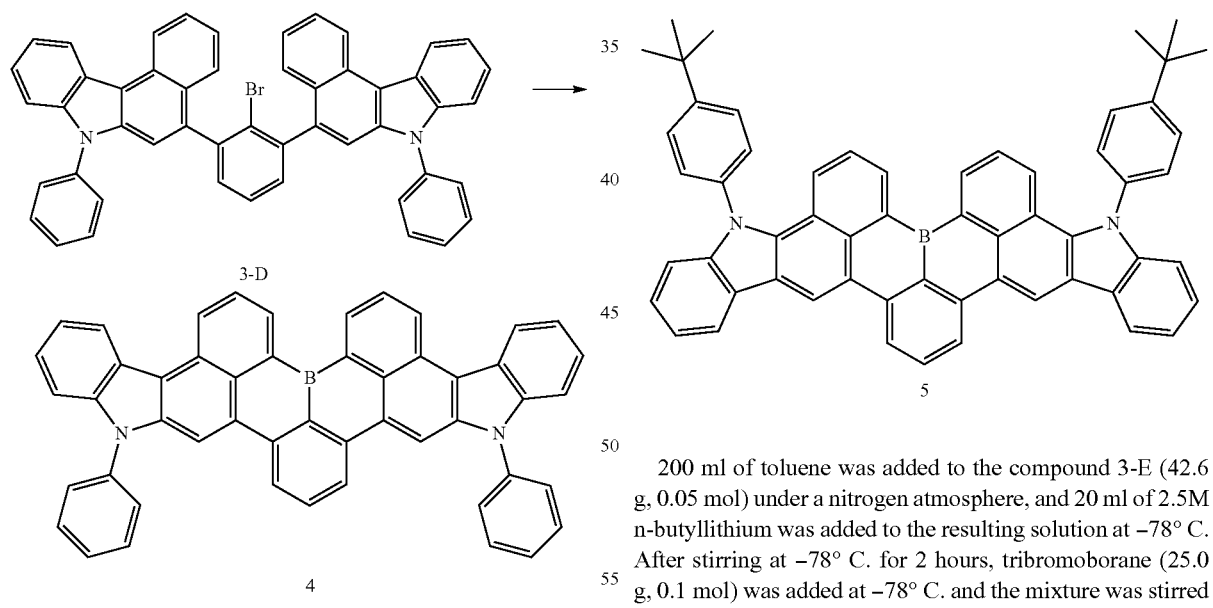

4

200 ml of toluene was added to the compound 3-D (37 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 4 (20.4 g, yield: 61%).

MS[M+H]$^+$=668

Preparation Example 4-5: Synthesis of Compound 5

Reaction Scheme 4-5

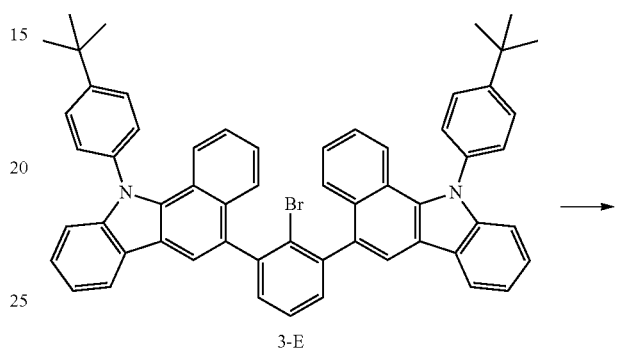

200 ml of toluene was added to the compound 3-E (42.6 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 5 (25 g, yield: 64%).

MS[M+H]$^+$=780

Preparation Example 4-6: Synthesis of Compound 6

Reaction Scheme 4-6

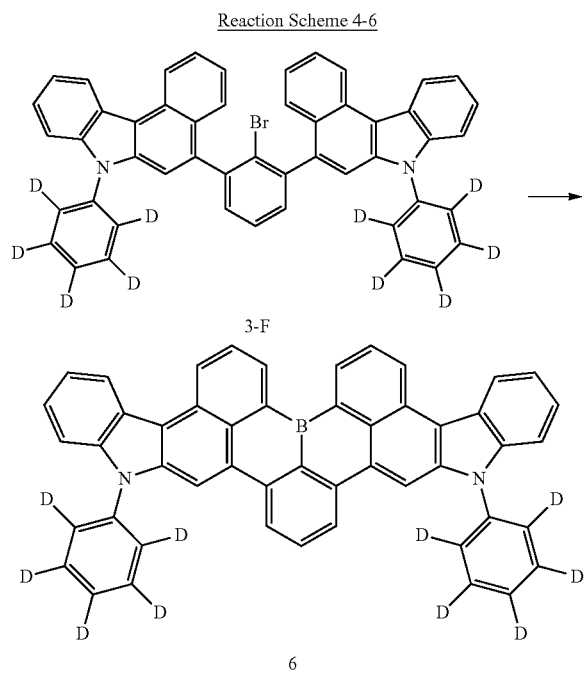

200 ml of toluene was added to the compound 3-F (37.5 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 6 (20.4 g, yield: 60%).

MS[M+H]$^+$=678

Preparation Example 4-7: Synthesis of Compound 7

Reaction Scheme 4-7

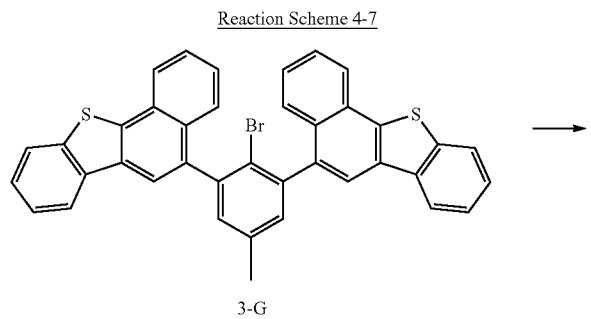

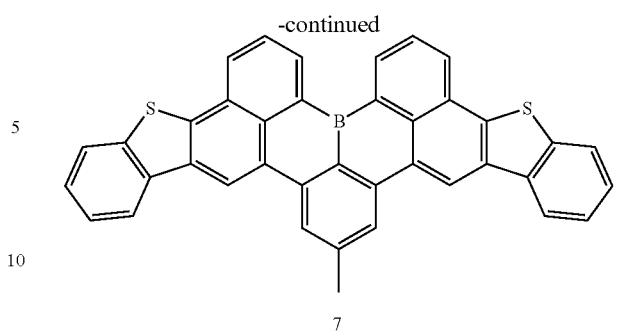

200 ml of toluene was added to the compound 3-G (31.8 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 7 (17.8 g, yield: 63%).

MS[M+H]$^+$=564

Preparation Example 4-8: Synthesis of Compound 8

Reaction Scheme 4-8

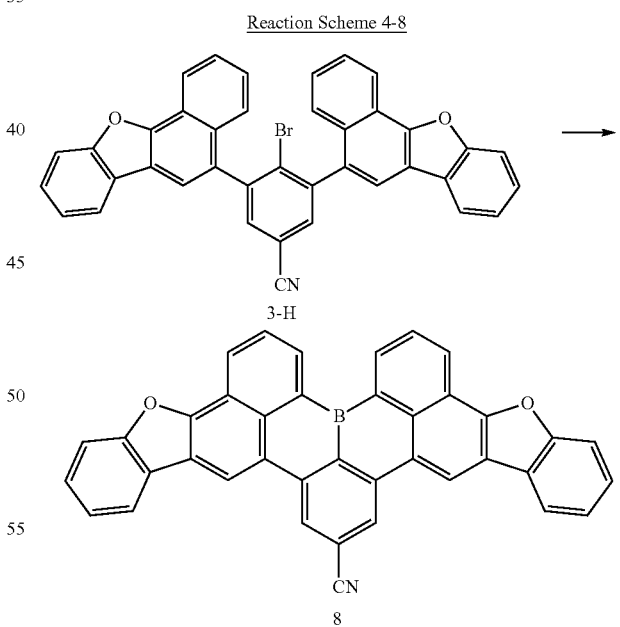

200 ml of toluene was added to the compound 3-H (30.7 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 8 (16.3 g, yield: 60%).

MS[M+H]$^+$=543

Preparation Example 4-9: Synthesis of Compound 9

Reaction Scheme 4-9

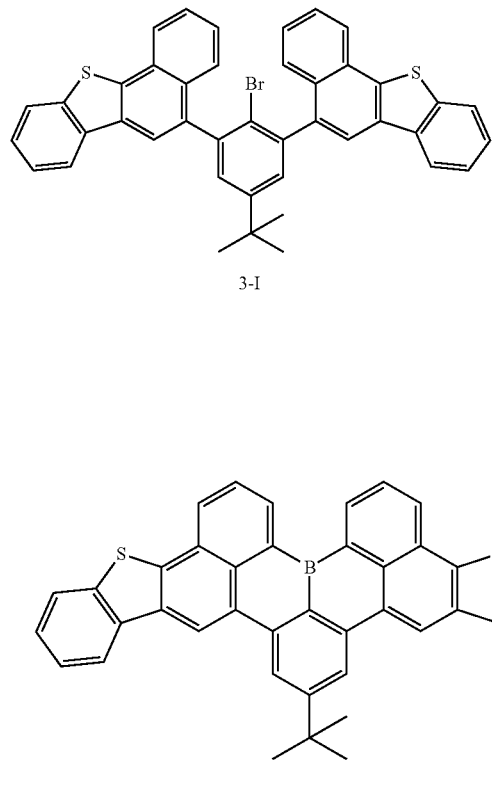

200 ml of toluene was added to the compound 3-I (33.9 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 9 (18.5 g, yield: 61%).

MS[M+H]$^+$=606

Preparation Example 4-10: Synthesis of Compound 10

Reaction Scheme 4-10

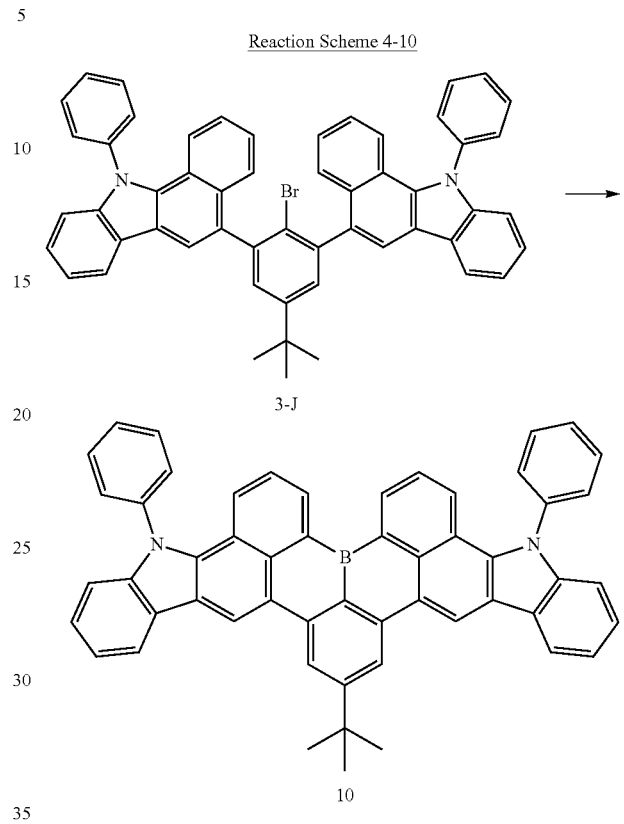

200 ml of toluene was added to the compound 3-J (39.8 g, 0.05 mol) under a nitrogen atmosphere, and 20 ml of 2.5M n-butyllithium was added to the resulting solution at −78° C. After stirring at −78° C. for 2 hours, tribromoborane (25.0 g, 0.1 mol) was added at −78° C. and the mixture was stirred for 30 minutes. The reaction solution was heated to room temperature and stirred for 30 minutes, followed by stirring at 50° C. for one hour. After cooling to 0° C., diisopropylethylamine (12.9 g, 0.1 mol) was added and refluxed for 20 hours. After diisopropylethylamine (6.5 g, 0.05 ml) was further added at room temperature, the solvent was completely distilled and purified by column chromatography (chloroform/hexane) to obtain Compound 10 (21.7 g, yield: 60%).

MS[M+H]$^+$=724

The compounds of Chemical formulas 2 to 12 according to one embodiment of the present specification can be synthesized by controlling the bonding directions of the benzene rings of benzonaphthothiophene, benzonaphthofuran, benzocarbazole and benzofluorene bonded to the boronic acid solutions used in the Preparation Examples 2-1 to 2-10, presence of condensation rings, substituents and bonding positions of boronic acid.

Example

An organic photoluminescence device was fabricated by incorporating Chemical Formula 1 according to one embodiment of the present invention into the light emitting layer, and the characteristics thereof were evaluated.

In the present test example, a host material (m-CBP) having a triplet value of 2.5 eV or more, and a sensitizer (4CzIPN) having a TADF with an $E_{ST}$ (defined as the difference between the singlet energy and the triplet energy) of less than 0.2 eV, in addition to Chemical Formula 1 according to one embodiment of the present specification, were incorporated into the light emitting layer, to prepare a green organic photoluminescence device, and the characteristics thereof were evaluated.

Comparative Example 1

A glass substrate coated to a thin thickness of 1,000 Å with ITO (indium tin oxide) was cleaned by ultrasonication with a solution of a detergent in distilled water. The detergent used herein was a product commercially available from Fischer Co. and the distilled water used herein was distilled water secondarily filtered through a filter commercially available from Millipore Co. ITO was cleaned for 30 minutes and was then ultrasonically cleaned with distilled water twice for 10 minutes. After cleaning with distilled water, ITO was subjected to ultrasonic cleaning using isopropyl alcohol, acetone and methanol solvents, dried and transported to a plasma cleaner. The substrate was cleaned with oxygen plasma for 5 minutes and transported to a vacuum deposition machine. Each thin film was laminated on the prepared ITO transparent electrode at a degree of vacuum of $5.0 \times 10^{-4}$ Pa by a vacuum deposition method. First, hexanitrile hexaazatriphenylene (HAT) was thermally vacuum deposited on the ITO to a thickness of 500 Å to form a hole injection layer.

4-4'-bis[N-(1-naphthyl)-N-phenylamino]biphenyl (NPB) (300 Å) shown below as a hole transport material was vacuum-deposited on the hole injection layer to form a hole transport layer.

N-([1,1'-biphenyl]-4-yl)-N-(4-(11-([1,1'-biphenyl]-4-yl)-11H-benzo[a]carbazol-5-yl)phenyl)-[1,1'-biphenyl]-4-amine (EB1) (100 Å) shown below was vacuum-deposited on the hole transport layer to form an electron blocking layer.

Subsequently, m-CBP, 4CzIPN and GD1 shown below were vacuum-deposited on the electron blocking layer at a weight ratio of 68:30:2 to a layer thickness of 300 Å to form a light emitting layer.

Compound ET1 and compound LiQ (lithium quinolate) were vacuum deposited on the light emitting layer at a weight ratio of 1:1 to form an electron injection and transport layer having a thickness of 300 Å. Lithium fluoride (LiF) and aluminum were sequentially deposited to thicknesses of 12 Å and 2,000 Å, respectively, on the electron injection and transport layer to form a cathode.

During the process described above, the deposition rate of the organic material was maintained at 0.4 to 0.7 Å/sec, the deposition rate of the lithium fluoride of the cathode was maintained at 0.3 Å/sec, the deposition rate of the aluminum was maintained at 2 Å/sec, and the vacuum degree during deposition was maintained at $2 \times 10^{-7}$ to $5 \times 10^{-6}$ torr to fabricate an organic light emitting device.

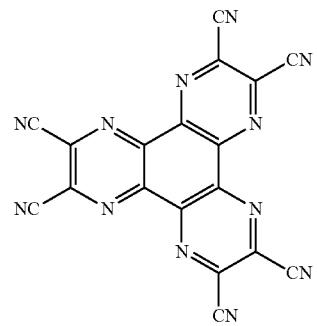

HAT

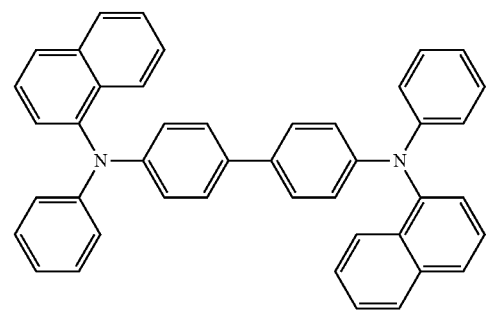

NPB

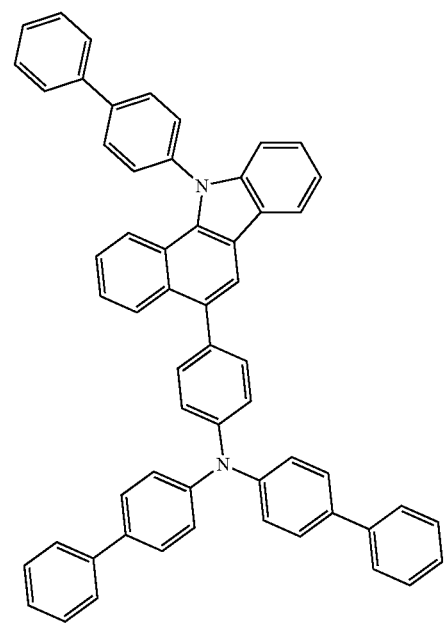

EB1 m-CBP

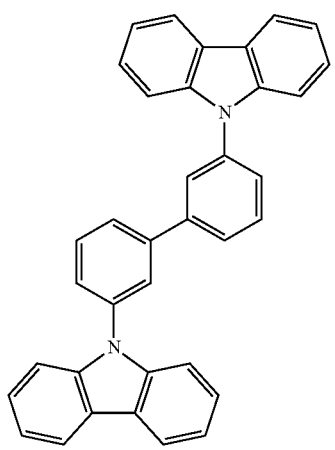

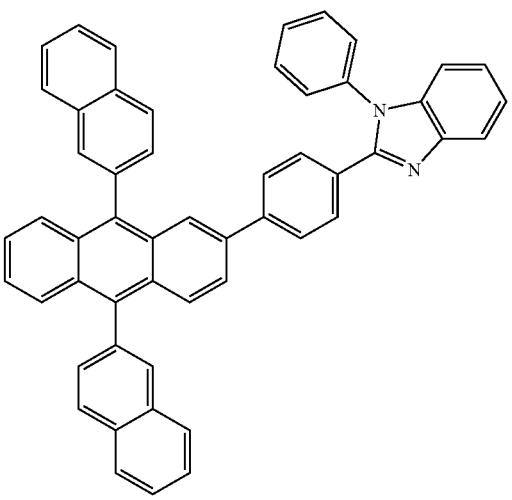
ET1

4CzIPN

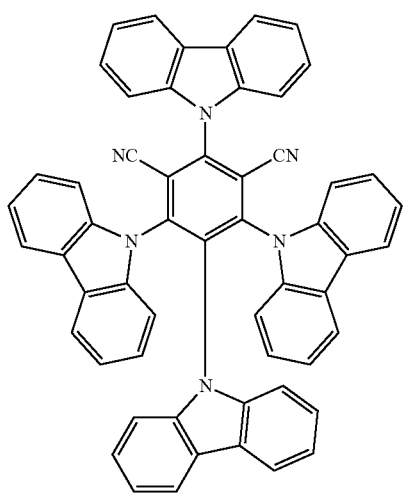

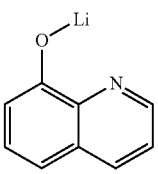
LiQ

Test Examples 1-1 to 1-10

Organic light emitting devices were fabricated in the same manner as in Comparative Example 1, except that the compounds shown in Table 1 were used, instead of the compound GD1 in Comparative Example 1.

Comparative Examples 2 and 3

Organic light emitting devices were prepared in the same manner as in Comparative Example 1, except that the following compounds GD2 and GD3 were used, instead of the compound GD1 in Comparative Example 1.

GD1

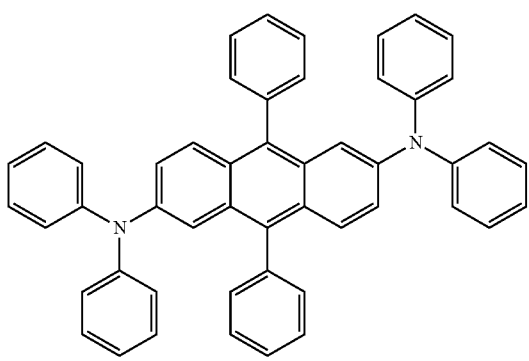

GD2

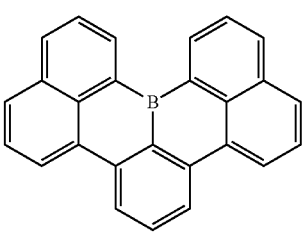

-continued

GD3

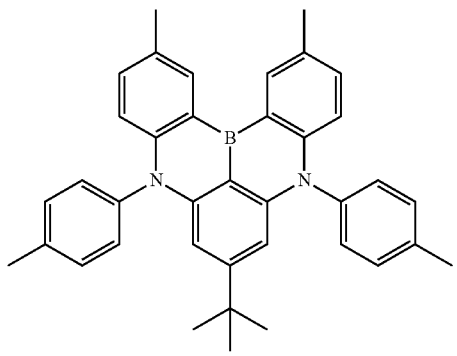

Table 1 shows the results of measurement of voltage, efficiency and color coordinates, when a current is applied to the organic light emitting devices fabricated by Test Examples 1-1 to 1-10 and Comparative Examples 1 to 3.

TABLE 1

| Items | Compound (light emitting layer) | Voltage (V@10 mA/cm²) | Efficiency (cd/A@10 mA/cm²) | Color coordinates (x, y) |
|---|---|---|---|---|
| Comparative Example 1 | Compound GD1 | 4.76 | 4.73 | (0.15, 0.61) |
| Test Example 1-1 | Compound 1 | 3.95 | 19.6 | (0.21, 0.69) |
| Test Example 1-2 | Compound 2 | 3.92 | 18.7 | (0.22, 0.69) |
| Test Example 1-3 | Compound 3 | 4.01 | 18.3 | (0.21, 0.68) |
| Test Example 1-4 | Compound 4 | 3.89 | 19.5 | (0.21, 0.70) |
| Test Example 1-5 | Compound 5 | 3.91 | 19.3 | (0.22, 0.69) |
| Test Example 1-6 | Compound 6 | 4.01 | 18.8 | (0.22, 0.70) |
| Test Example 1-7 | Compound 7 | 3.96 | 19.1 | (0.21, 0.71) |
| Test Example 1-8 | Compound 8 | 3.89 | 19.5 | (0.20, 0.70) |
| Test Example 1-9 | Compound 9 | 3.98 | 18.6 | (0.21, 0.68) |
| Test Example 1-10 | Compound 10 | 3.93 | 18.9 | (0.22, 0.71) |
| Comparative Example 2 | Compound GD2 | 4.51 | 13.1 | (0.18, 0.52) |
| Comparative Example 3 | Compound GD3 | 4.43 | 7.5 | (0.17, 0.24) |

As can be seen from Table 1, the results showed that all of the devices of Test Examples 1-1 to 1-10 using the compound having the structure of Chemical Formula 1 as a core had a lower voltage and higher efficiency than that of the device using the compound GD1 in Comparative Example 1.

Comparing with the devices of Comparative Examples 2 and 3, it was found that the structure of Chemical Formula 1 according to the present specification has improved characteristics in terms of voltage and efficiency.

As can be seen from results shown in Table 1, the compounds according to the present specification have excellent light emitting ability and are capable of tuning light emission wavelength, thereby realizing organic light emitting devices having high color purity.

The invention claimed is:

1. A compound of Chemical Formula 1:

Chemical Formula 1

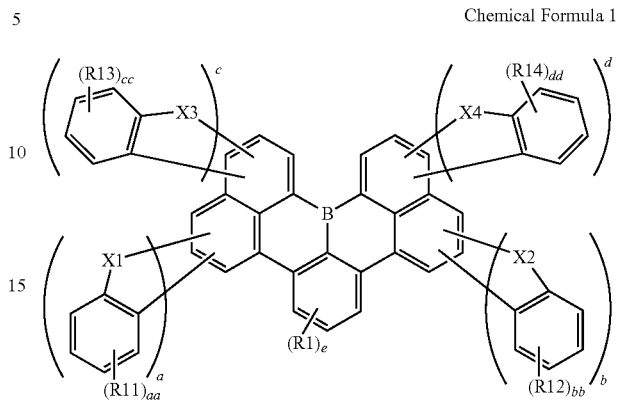

wherein X1 to X4 are identical to or different from one another and are each independently O, S, NR2 or CR3R4, and a to d are each 0 or 1, with the proviso that 1≤a+b+c+d;

R1 and R11 to R14 are identical to or different from one another and are each independently hydrogen, deuterium, a nitrile group, a substituted or unsubstituted alkyl group, a substituted or unsubstituted cycloalkyl group, a substituted or unsubstituted aryl group, or a substituted or unsubstituted heterocyclic group;

e is an integer of 0 to 3, wherein, when e is 2 or more, each R1 is identical to or different from each other;

aa, bb, cc and dd are each an integer of 0 to 4, wherein, when aa, bb, cc and dd are 2 or more, the substituents in parentheses are identical to or different from one another;

R2 is a substituted or unsubstituted aryl group or a substituted or unsubstituted heterocyclic group; and R3 and R4 are identical to or different from each other and are each independently a substituted or unsubstituted alkyl group, a substituted or unsubstituted aryl group, or a substituted or unsubstituted heterocyclic group.

2. The compound of claim 1, wherein Chemical Formula 1 any one of the following Chemical Formulae 2 to 7:

Chemical Formula 2

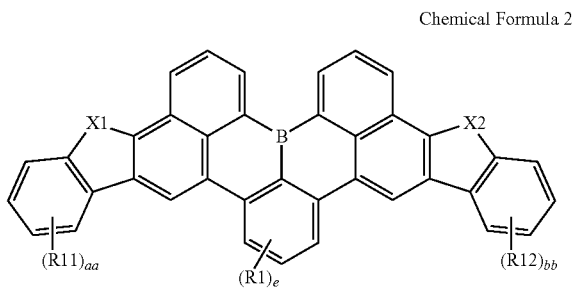

Chemical Formula 3

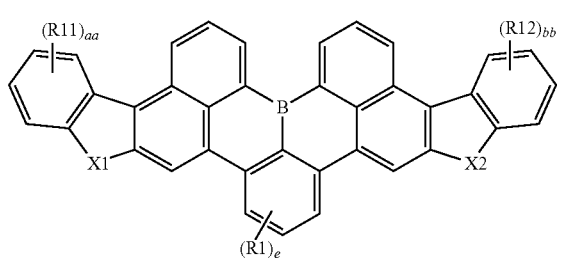

Chemical Formula 4
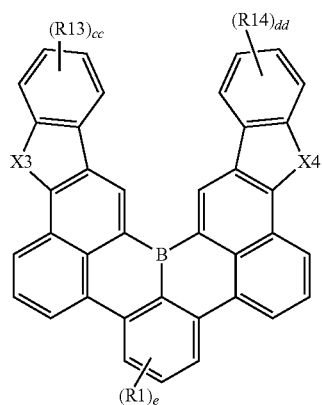
Chemical Formula 5
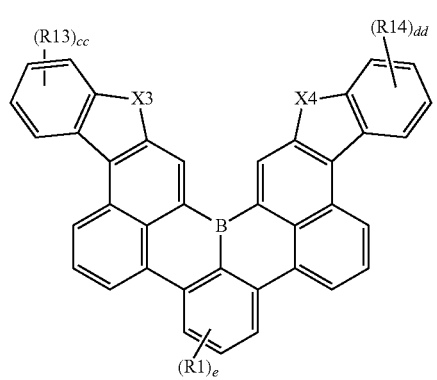
Chemical Formula 6
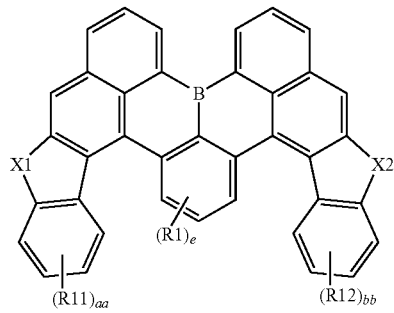
Chemical Formula 7
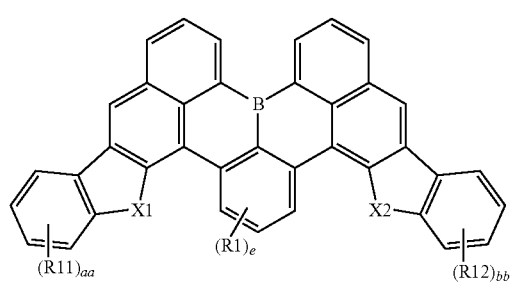
Chemical Formula 8
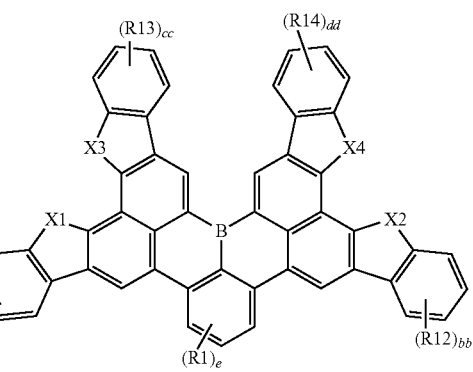
Chemical Formula 9
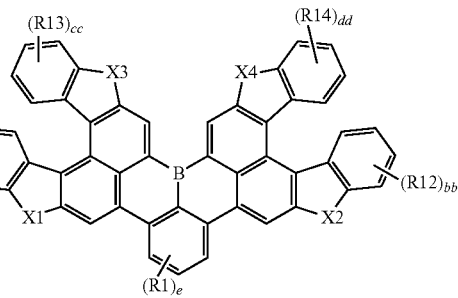
Chemical Formula 10
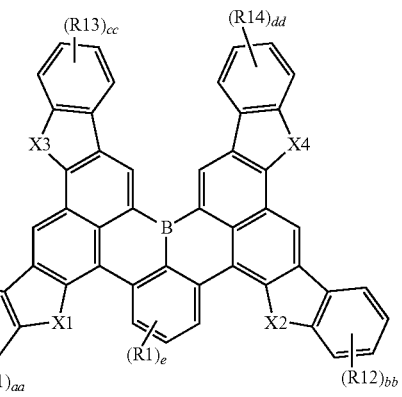
Chemical Formula 11
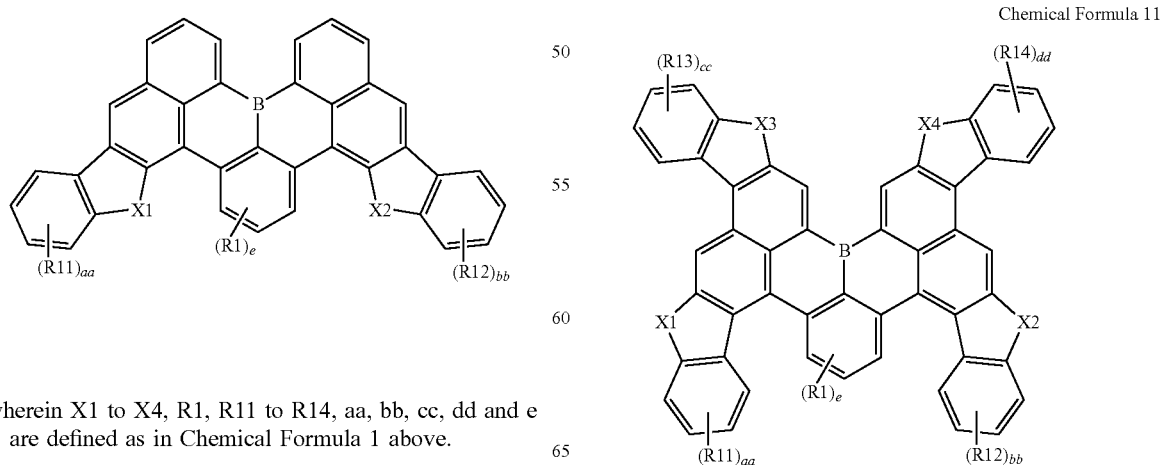
wherein X1 to X4, R1, R11 to R14, aa, bb, cc, dd and e are defined as in Chemical Formula 1 above.
3. The compound of claim 1, wherein Chemical Formula 1 is any one of the following Chemical Formulae 8 to 12:

113
-continued

Chemical Formula 12

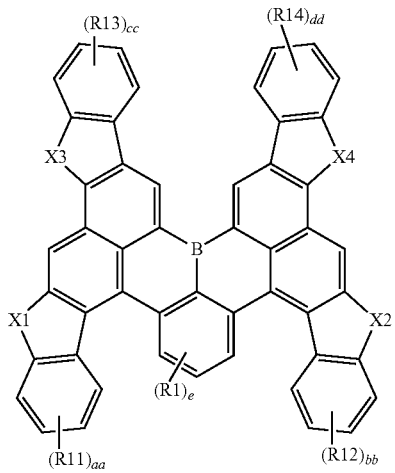

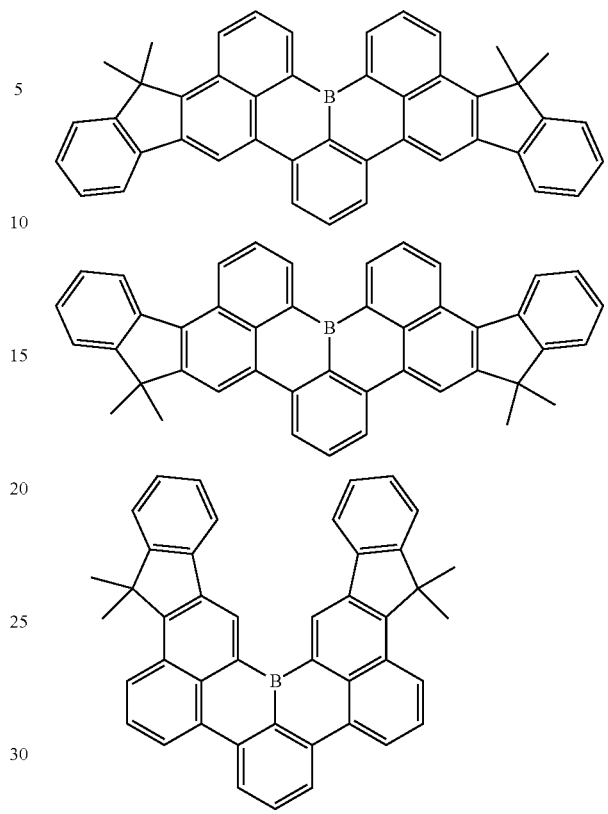

wherein X1 to X4, R1, R11 to R14, aa, bb, cc, dd and e are defined as in Chemical Formula 1 above.

4. The compound of claim 1, wherein Chemical Formula 1 is the following Chemical Formula 1-1:

Chemical Formula 1-1

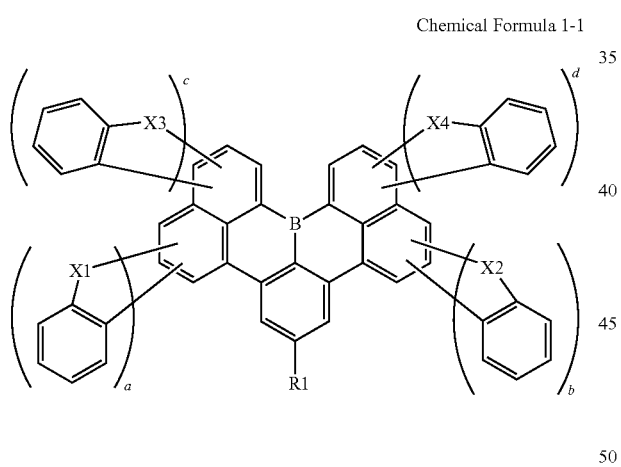

wherein X1 to X4, R1 and a to d are defined as in Chemical Formula 1 above.

5. The compound of claim 4, wherein R1 is hydrogen, a methyl group, a tert-butyl group or a nitrile group.

6. The compound of claim 1, wherein X1 to X4 are identical to or different from each other and each independently is O, S, NR2, or CR3R4;

R2 is an aryl group that is unsubstituted or substituted by a deuterium, a nitrile group or an alkyl group; and R3 and R4 are each an alkyl group.

7. The compound of claim 1, wherein the compound of Chemical Formula 1 is selected from one of the following compounds:

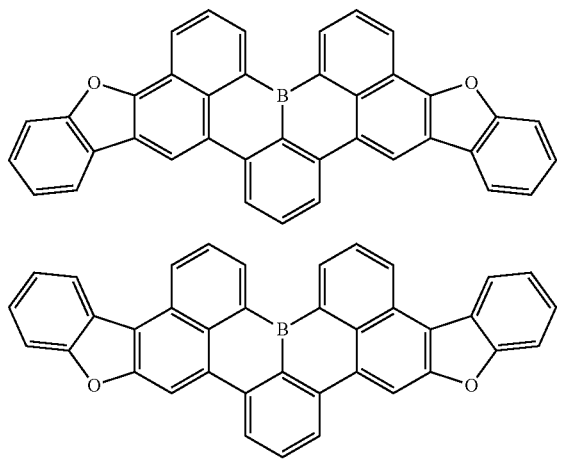

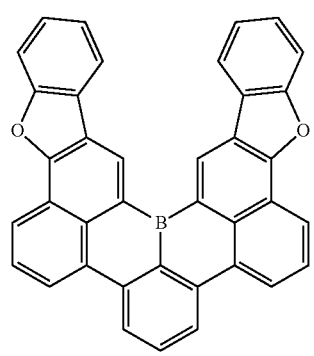

115
-continued
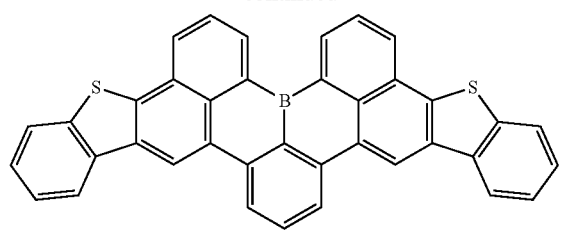
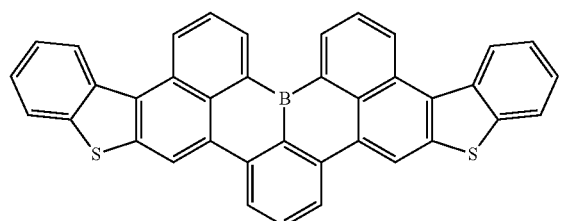
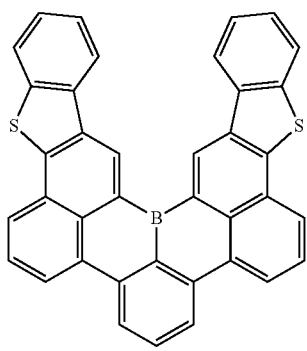
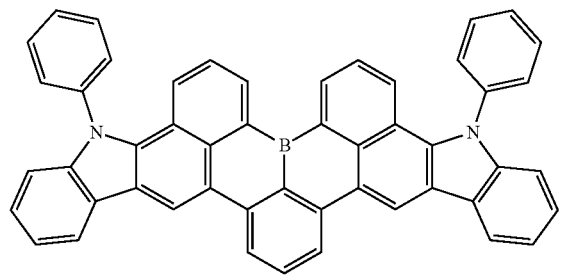
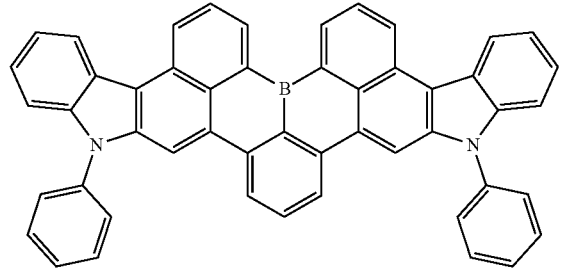
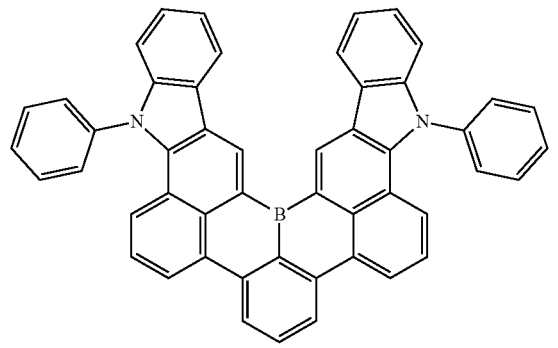
116
-continued
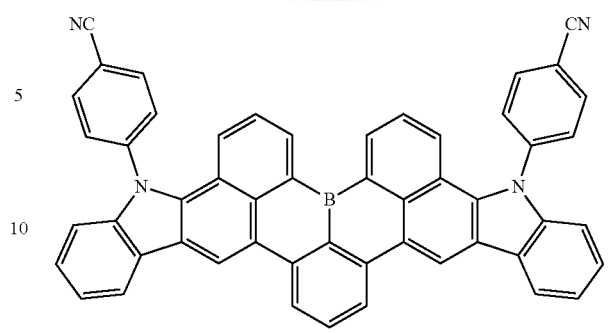
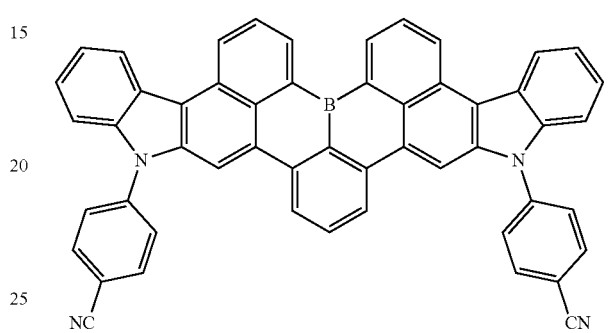
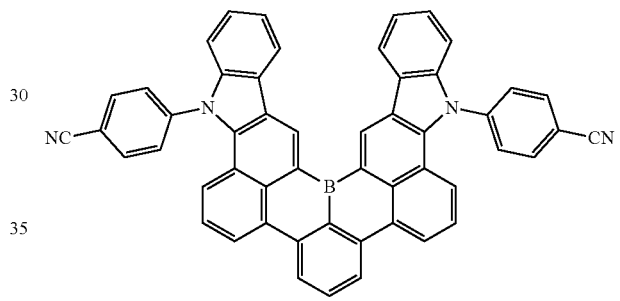
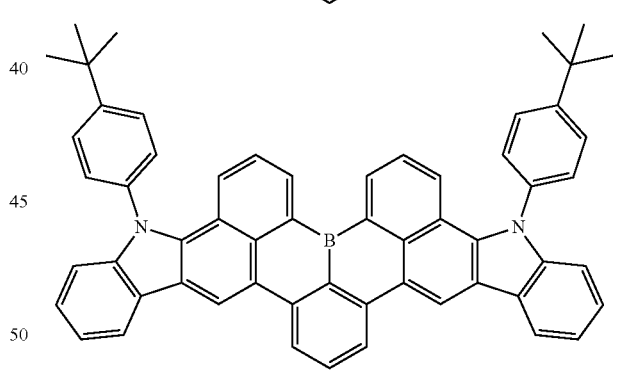
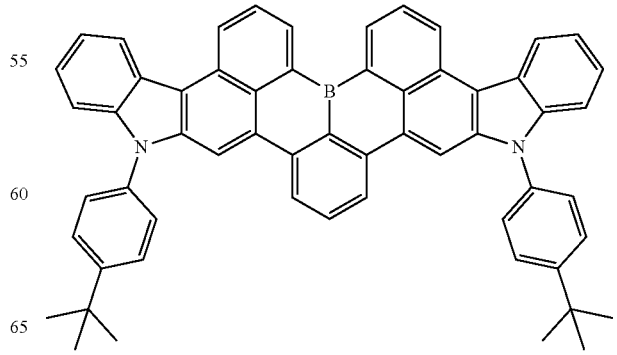

117
-continued
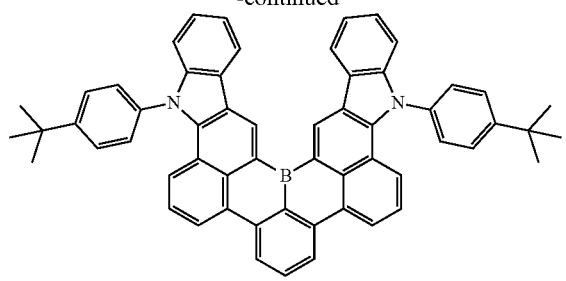
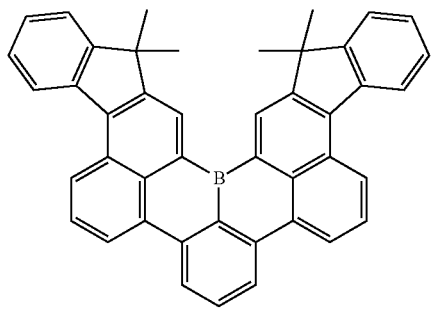
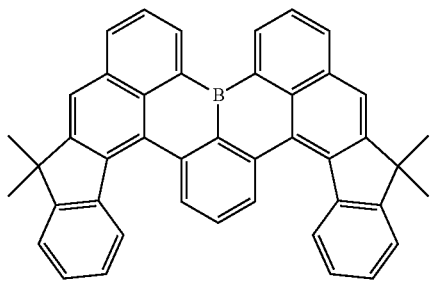
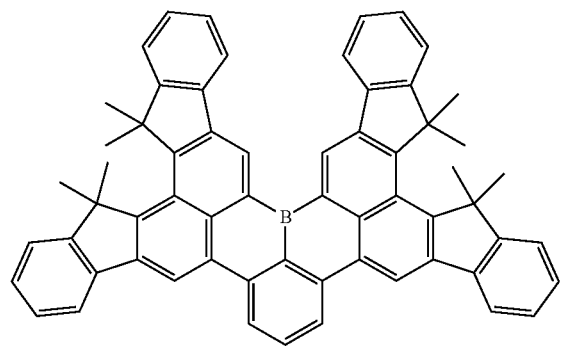
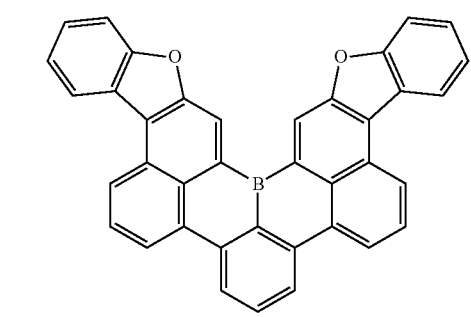
118
-continued
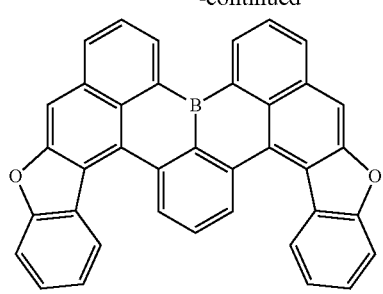
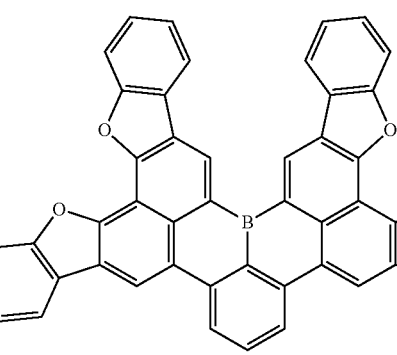
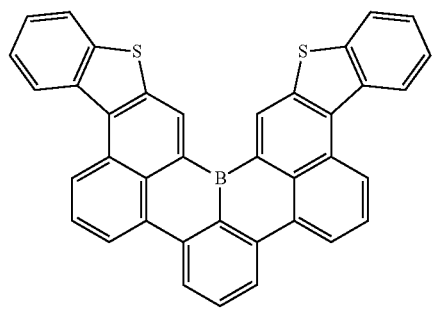
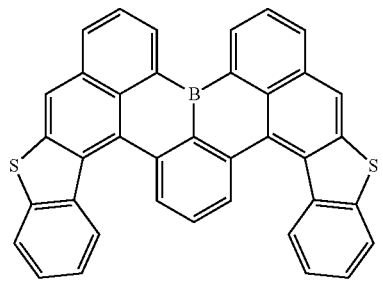
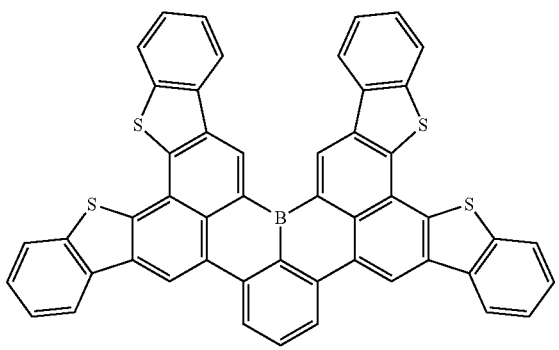

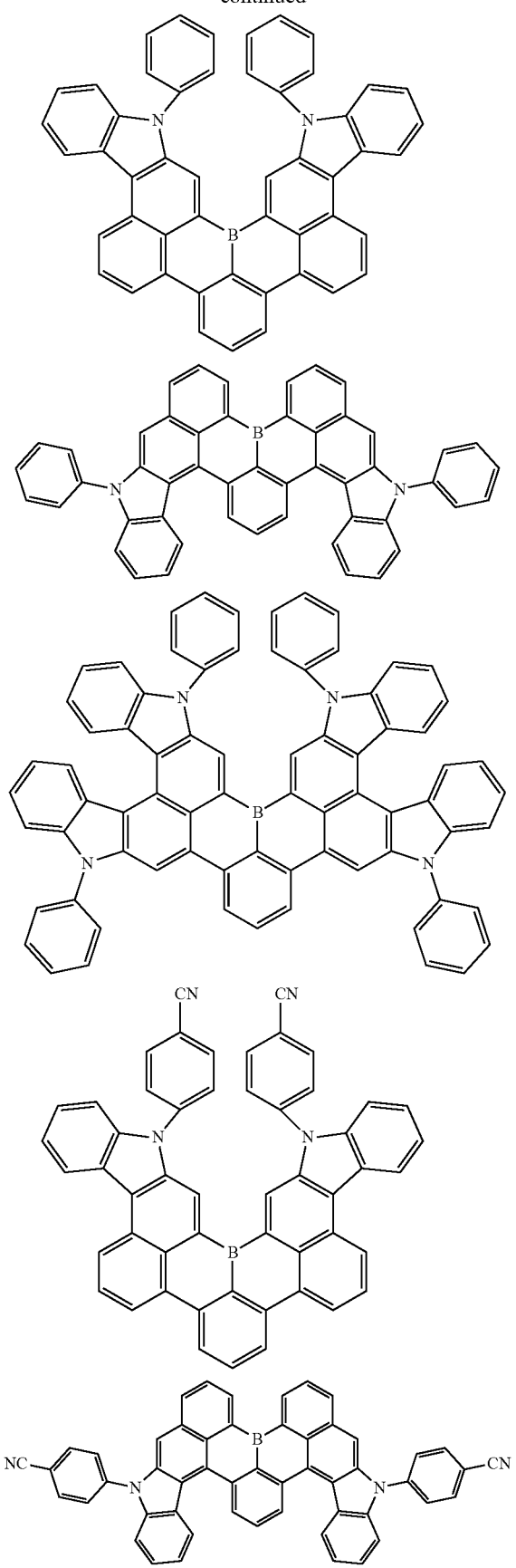

121
-continued
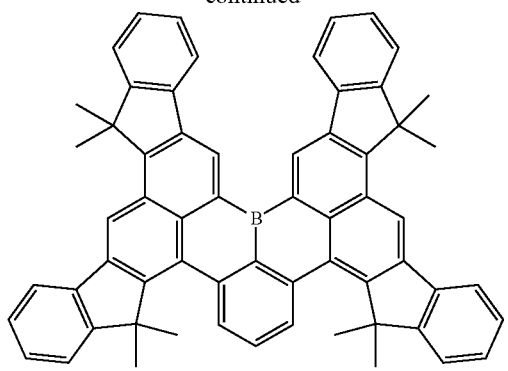
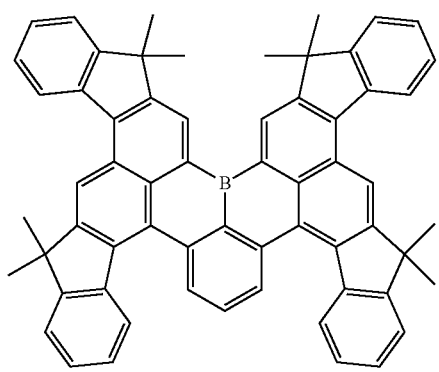
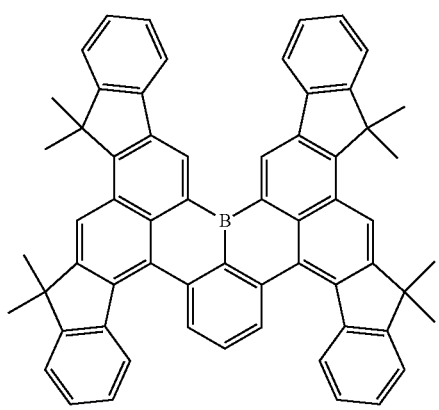
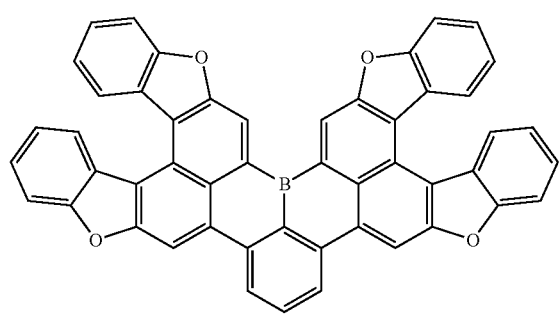
122
-continued
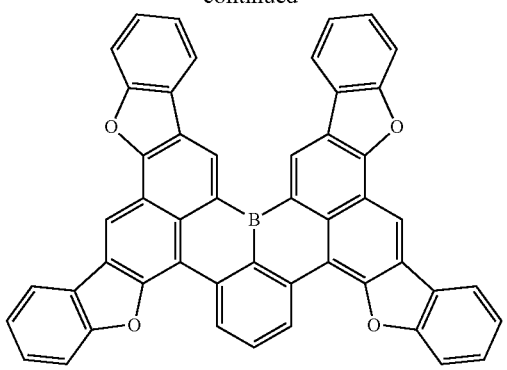
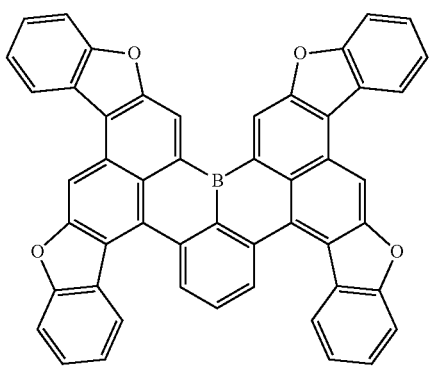
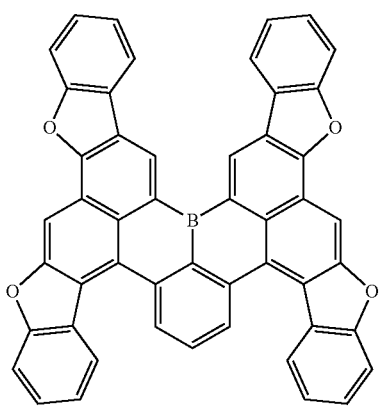
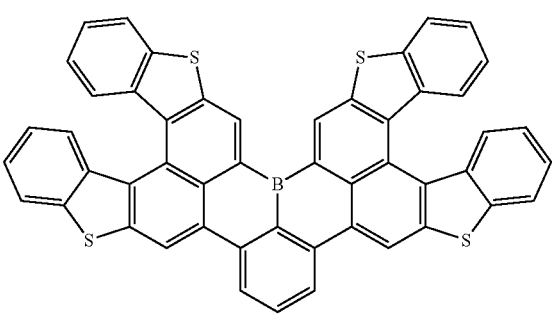

123
-continued
124
-continued
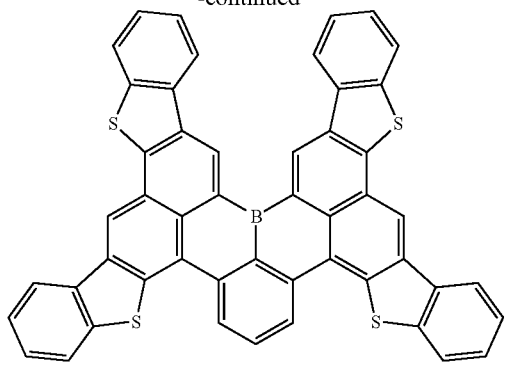
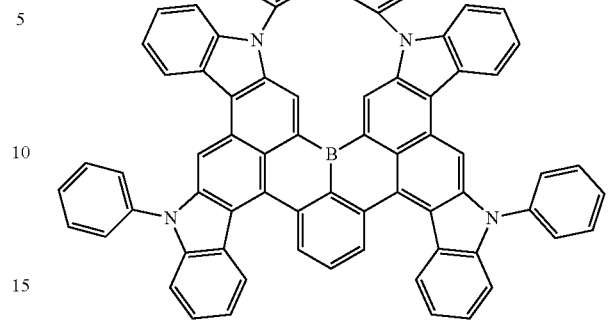
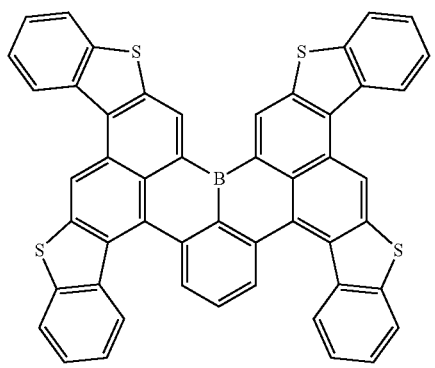
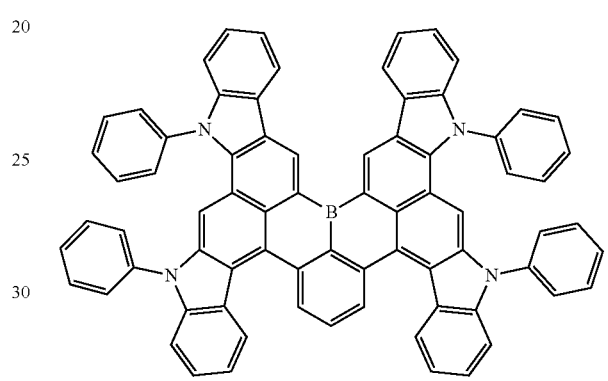
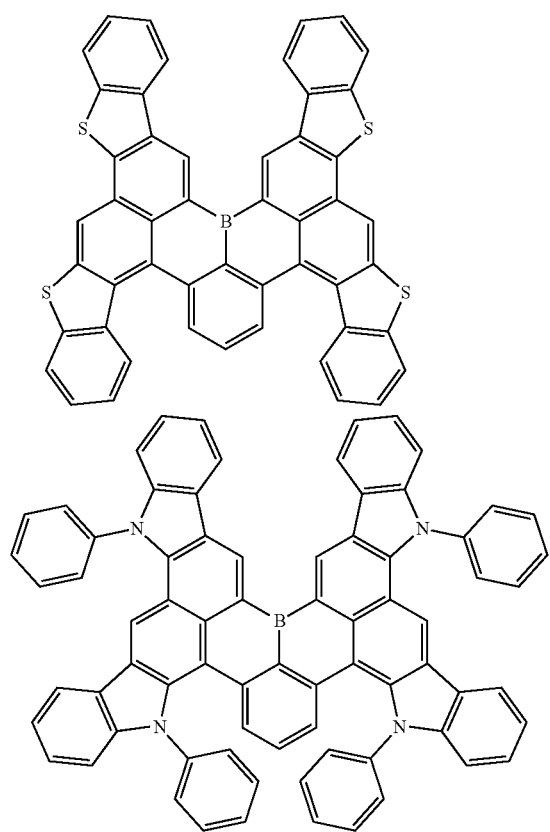
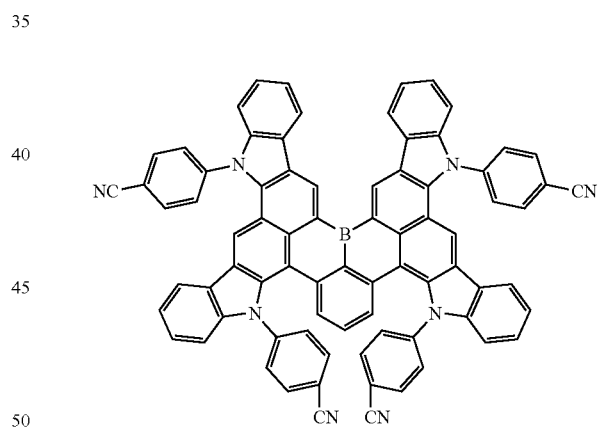
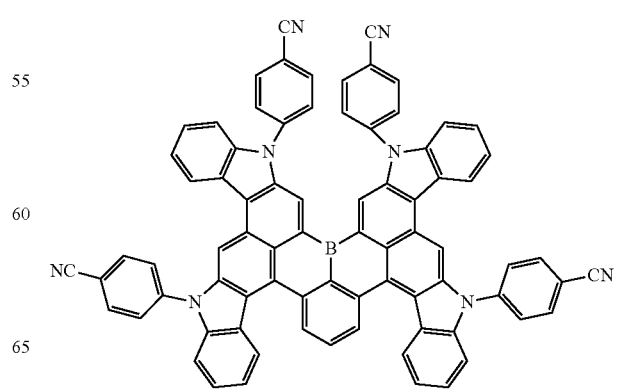

125
-continued
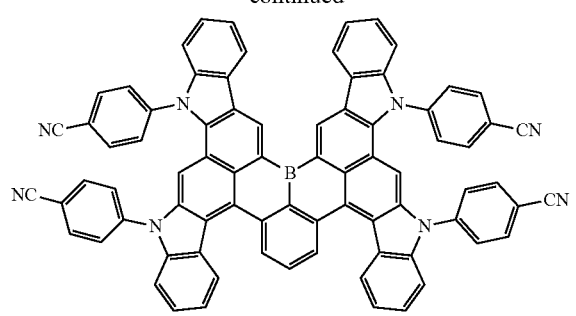
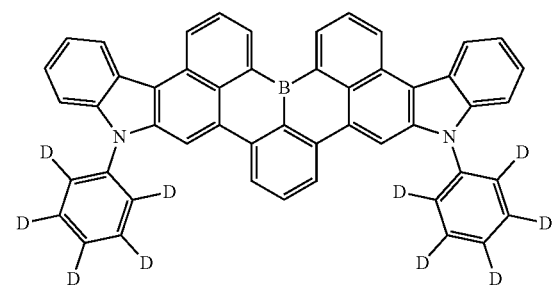
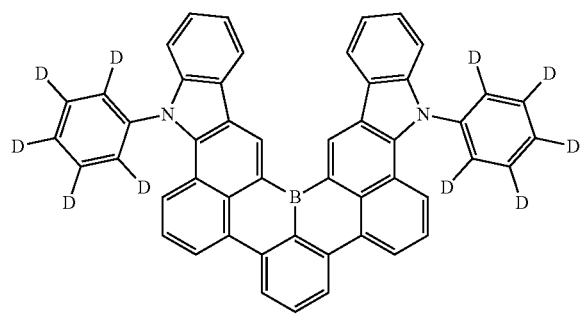
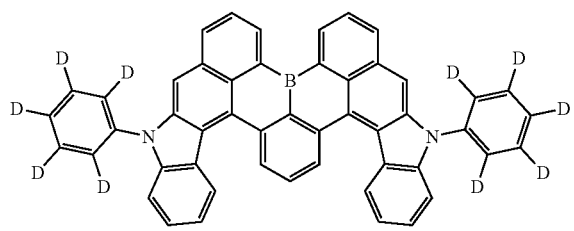
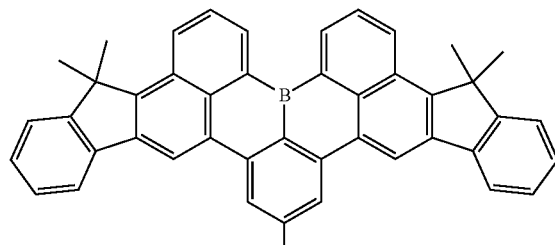
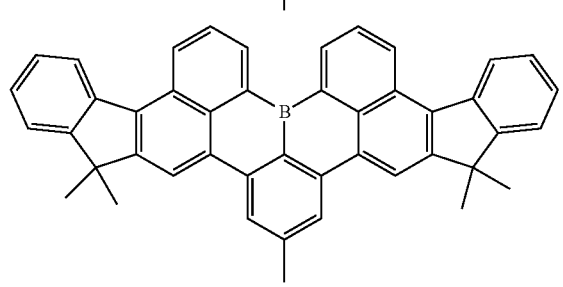
126
-continued
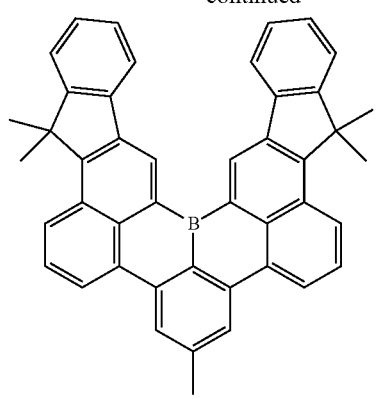
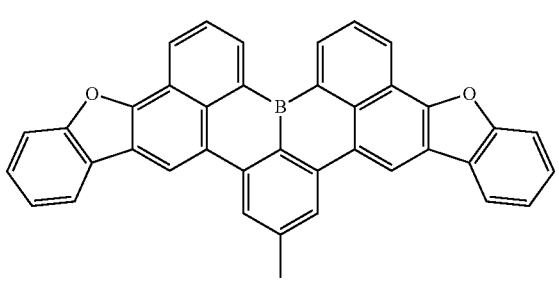
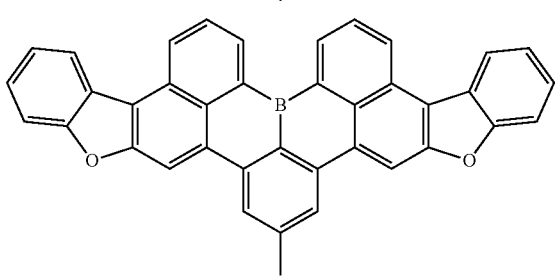
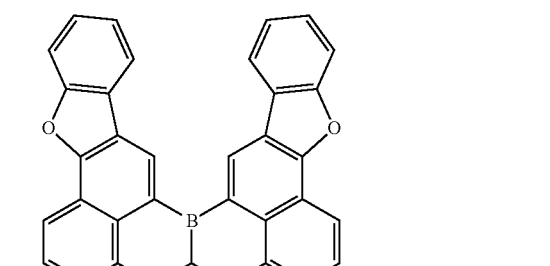
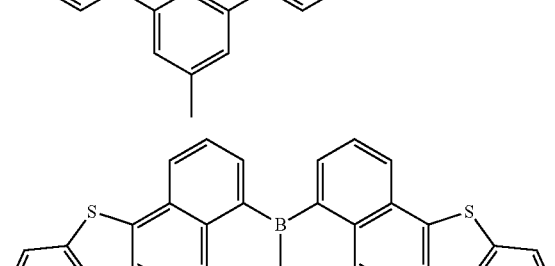
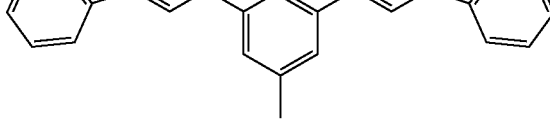

127
-continued
128
-continued
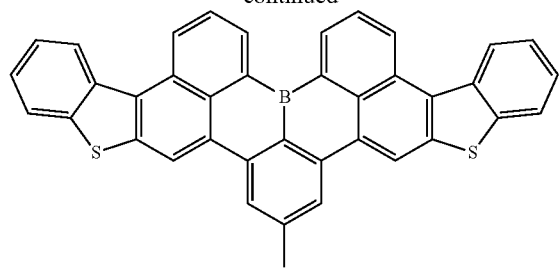
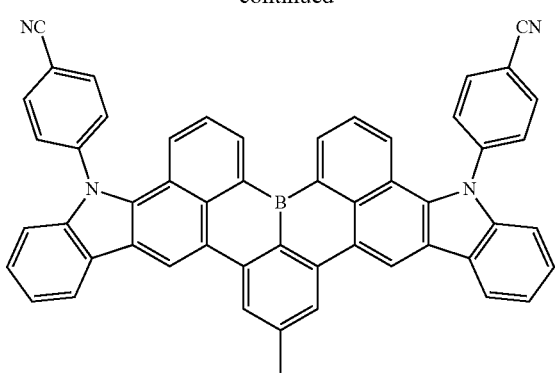
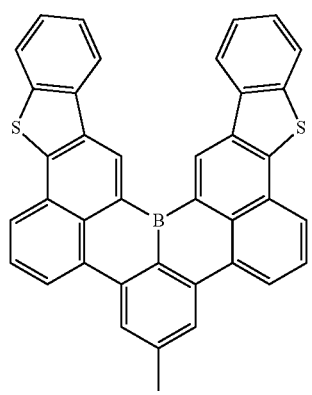
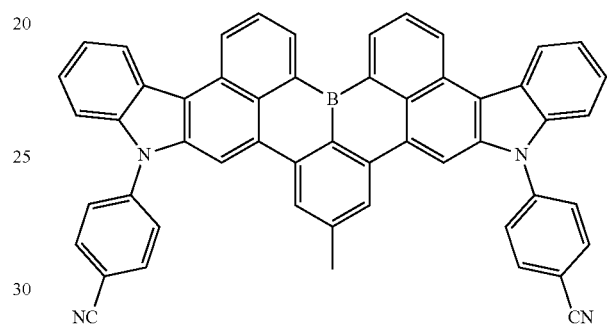
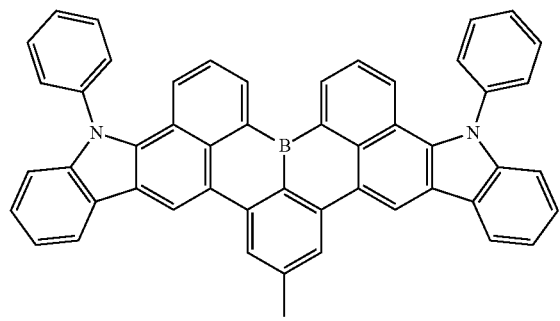
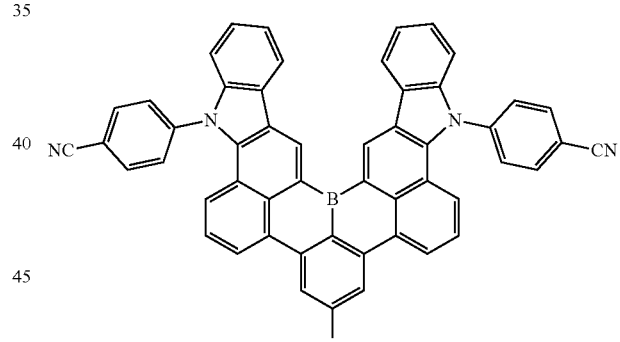
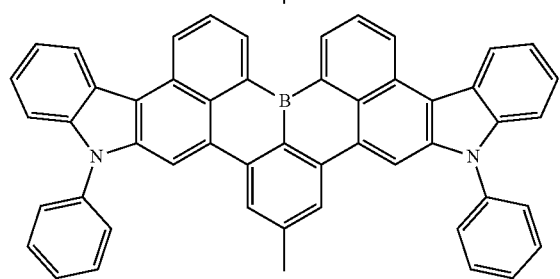
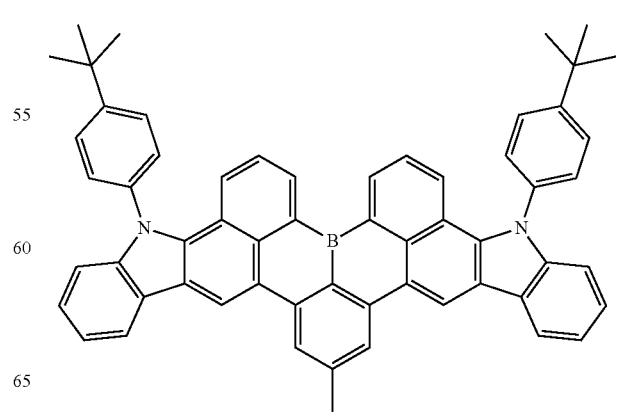
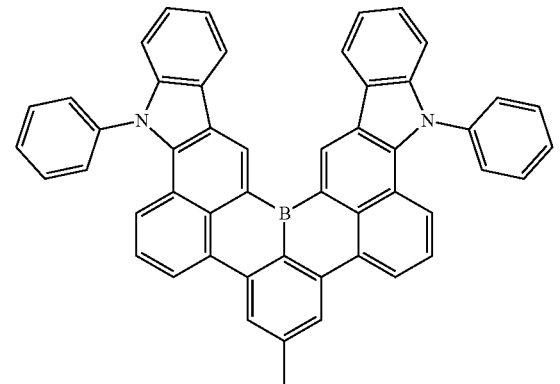

129
-continued
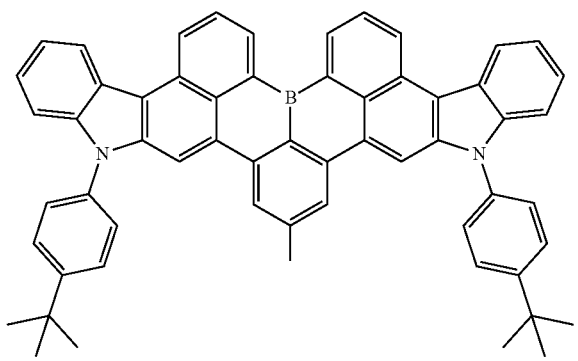
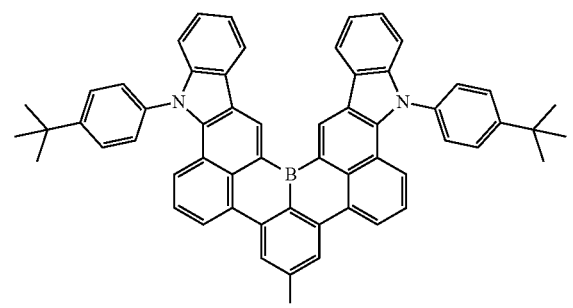
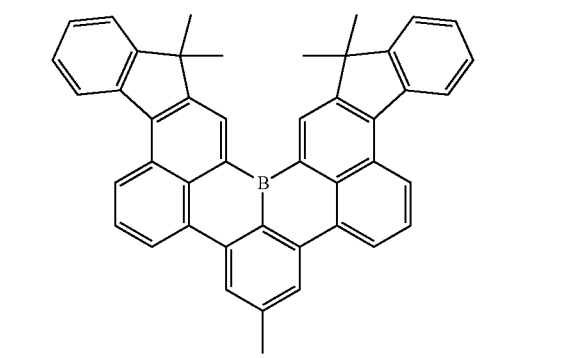
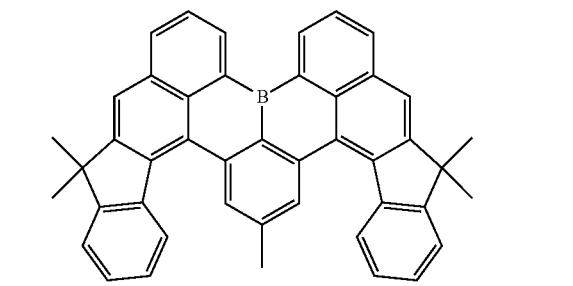
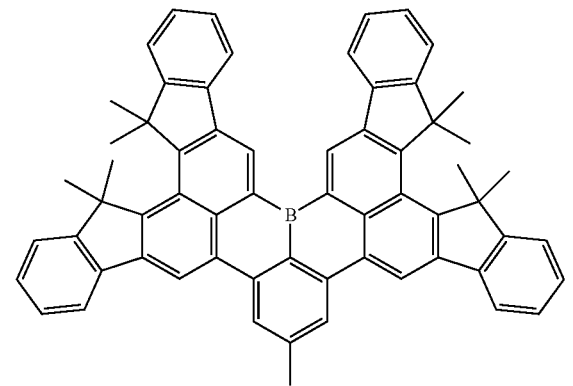
130
-continued
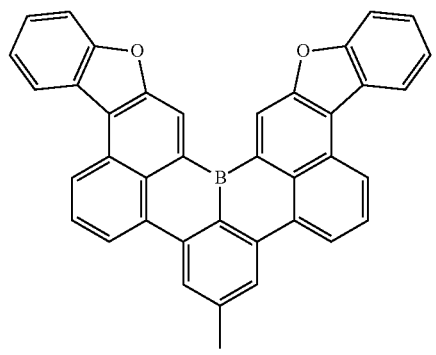
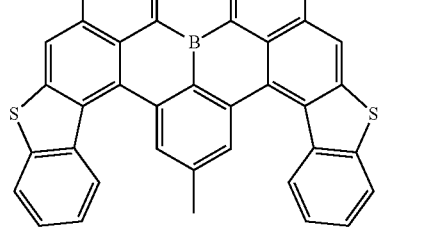
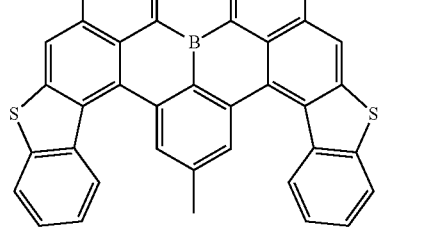
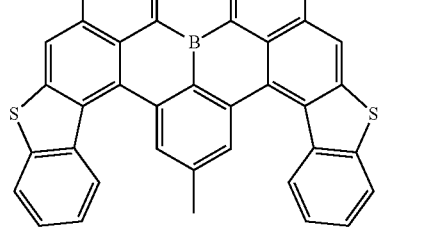
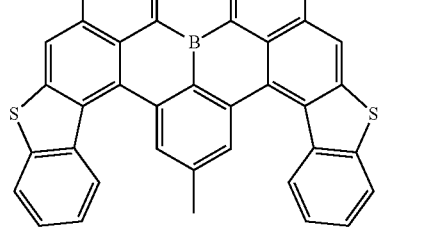

131
-continued
132
-continued
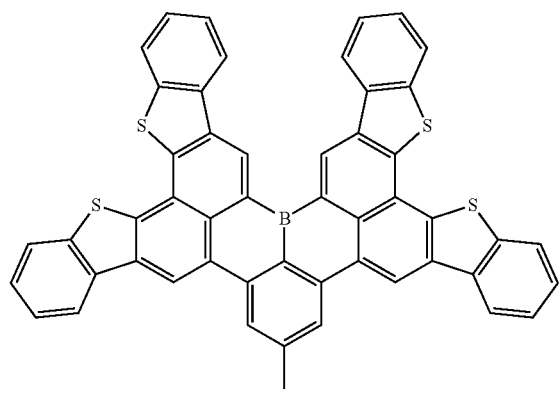
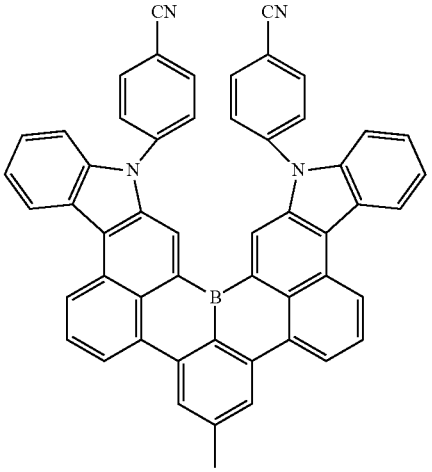
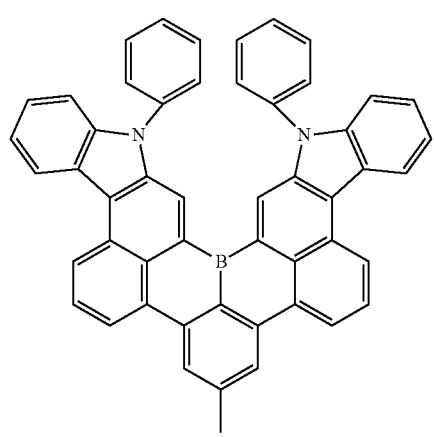
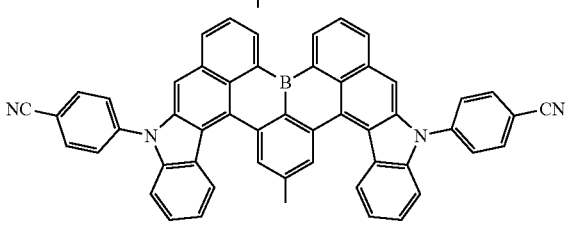
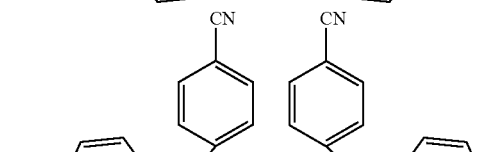
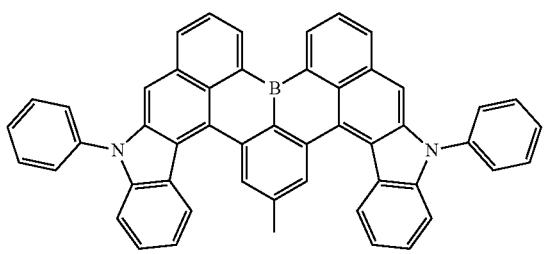
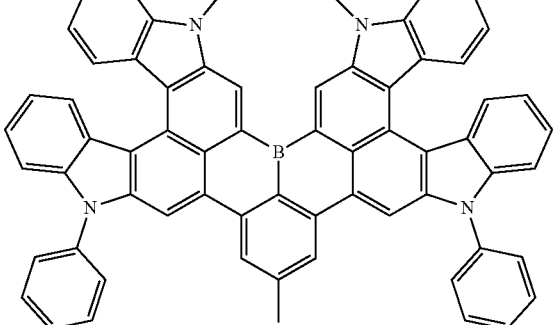
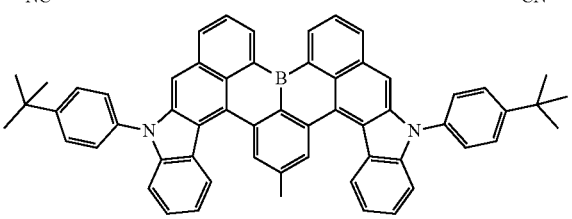
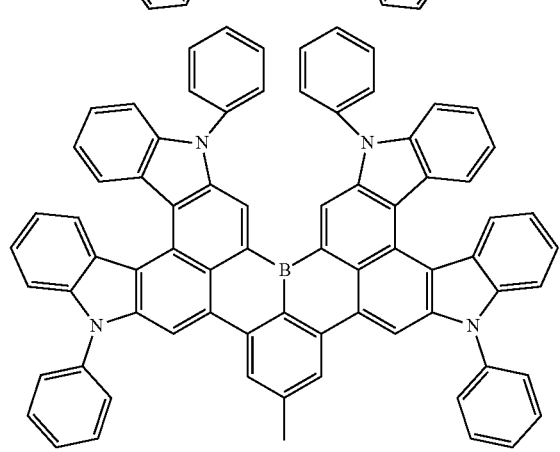
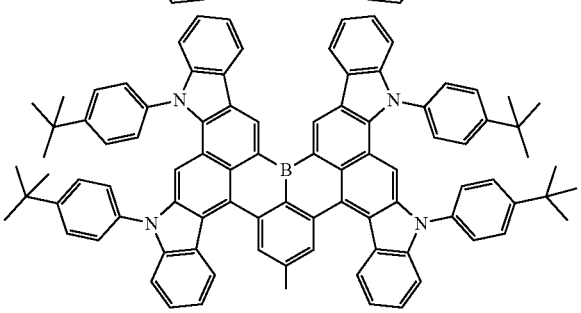

133
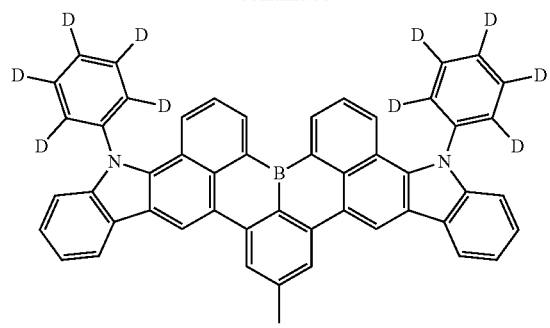
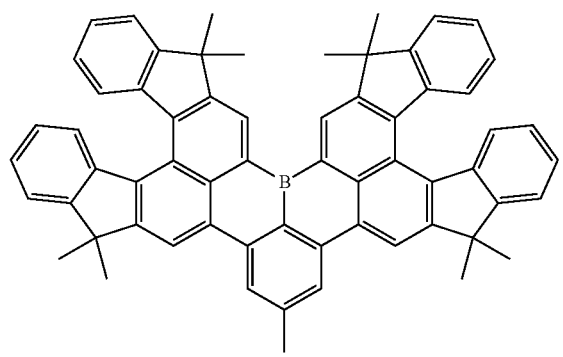
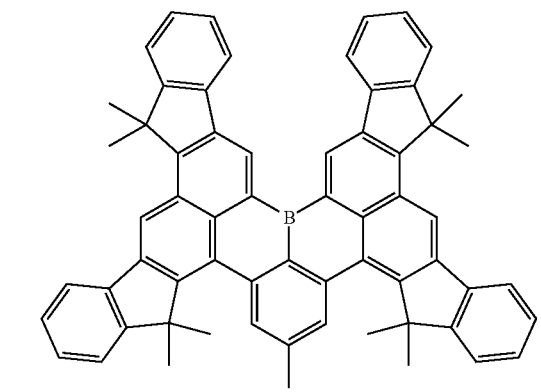
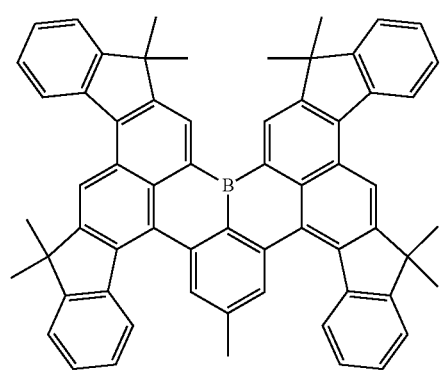
134
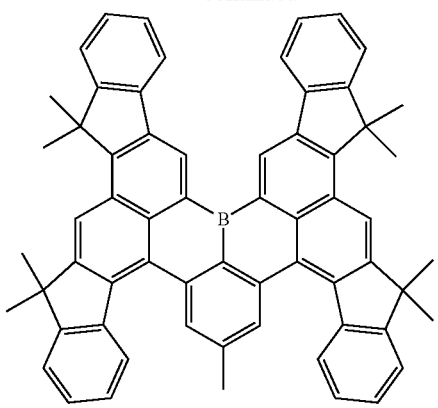
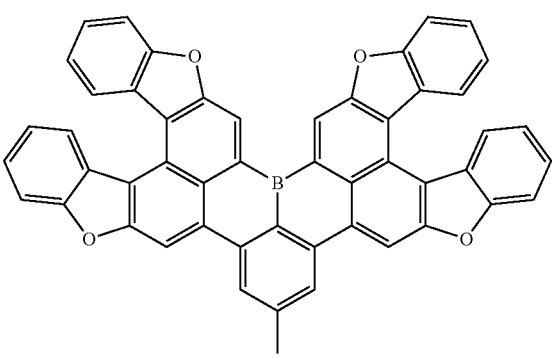
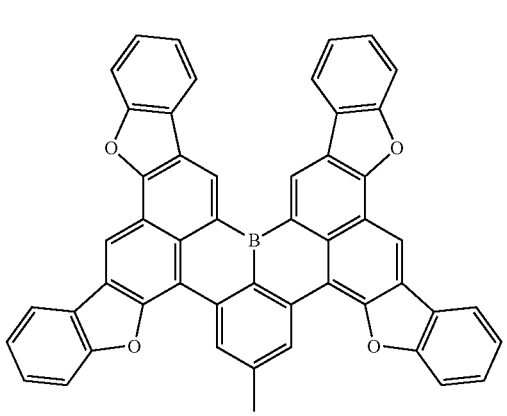
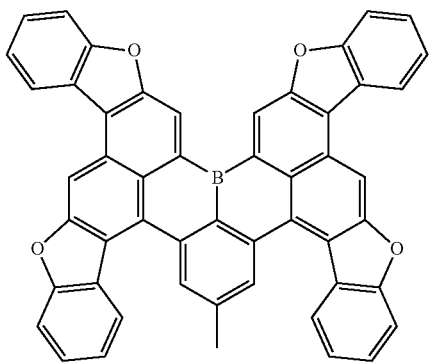

135
-continued
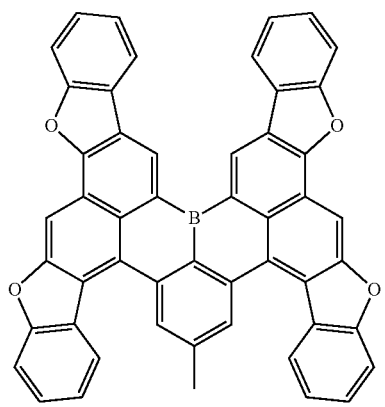
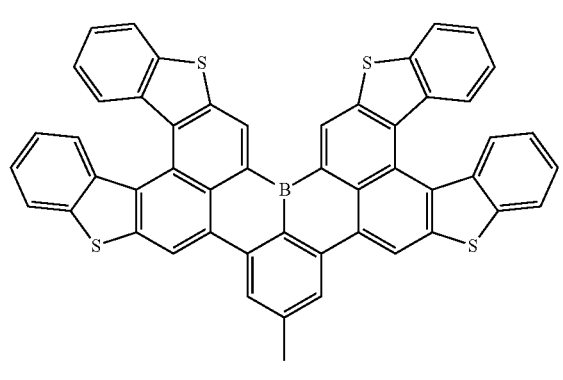
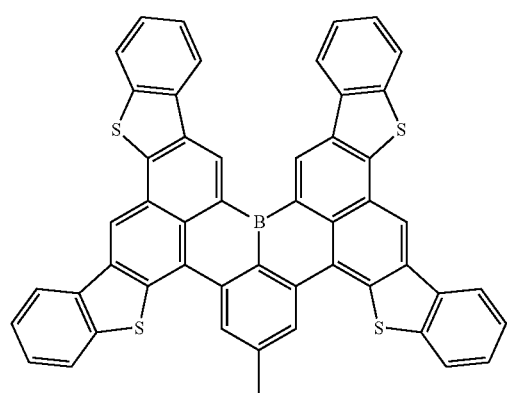
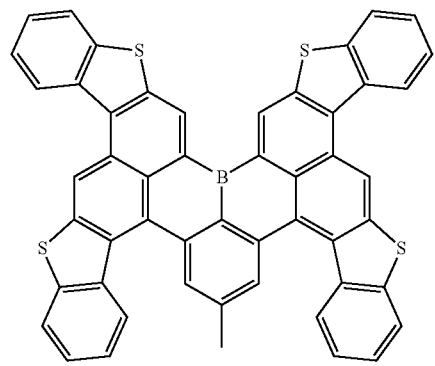
136
-continued
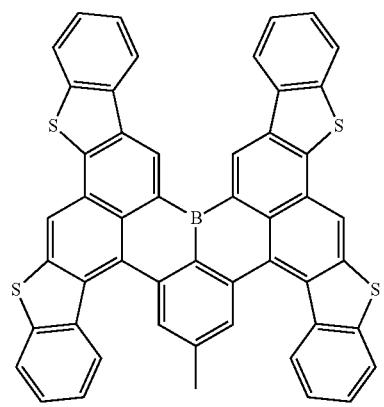
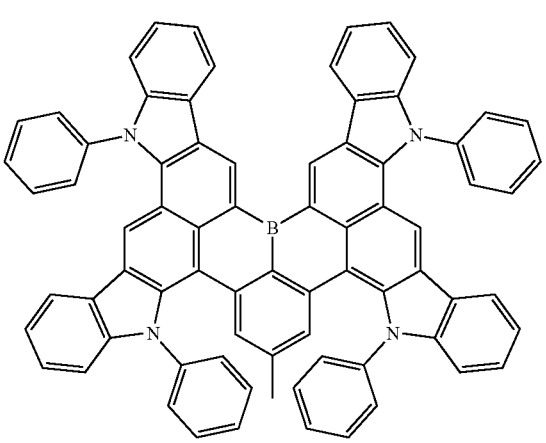
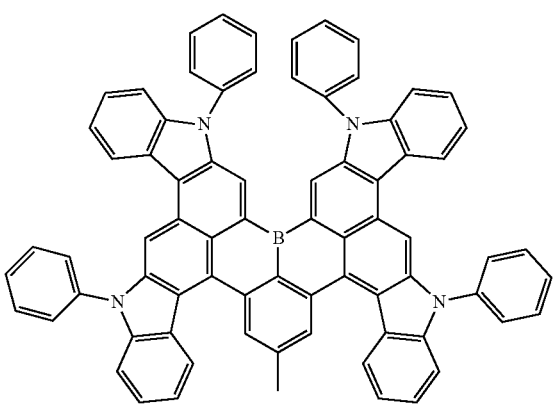
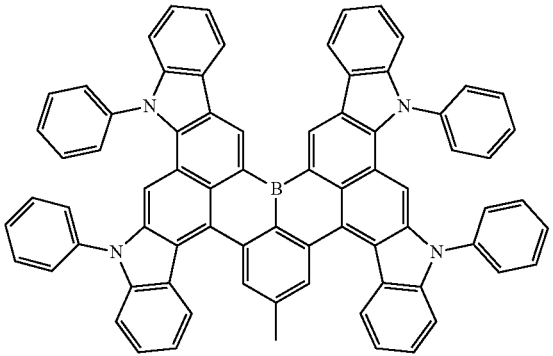

137
-continued
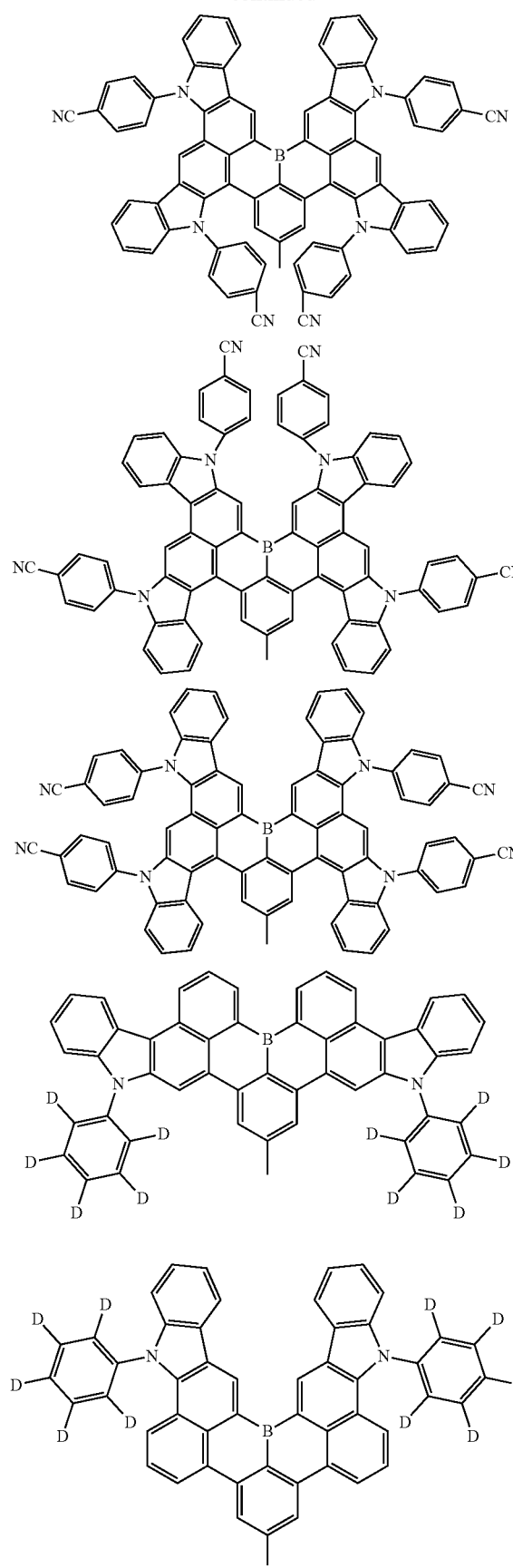
138
-continued
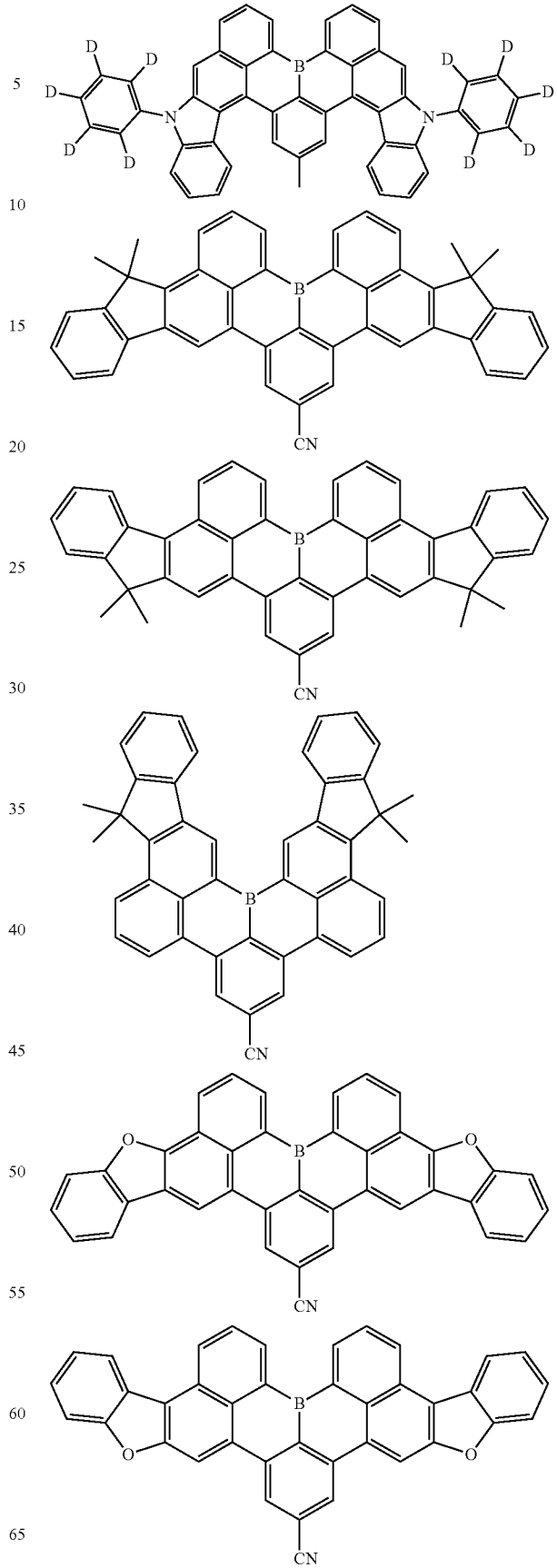

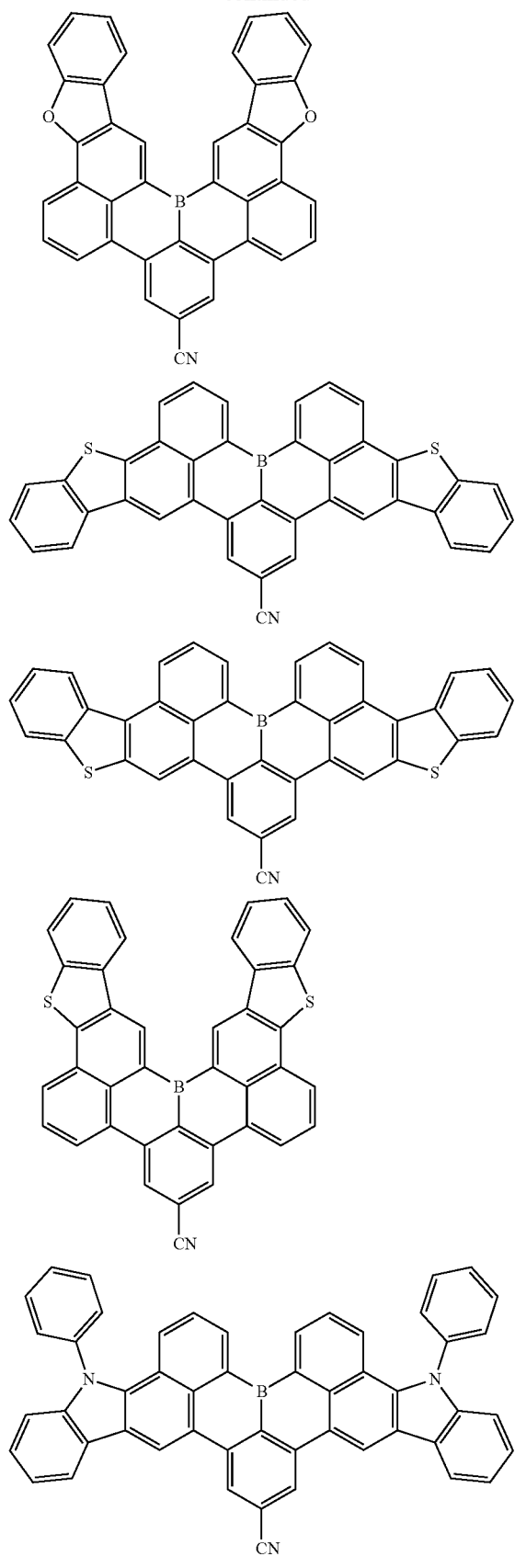
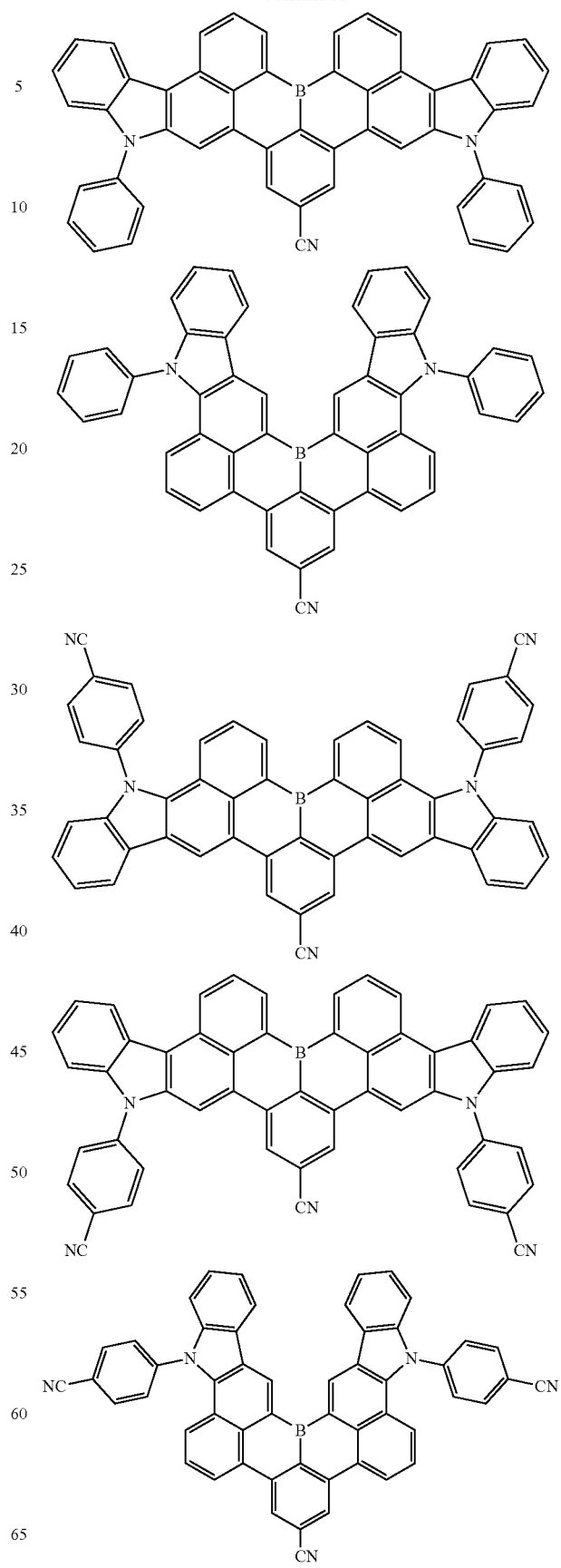

141
-continued
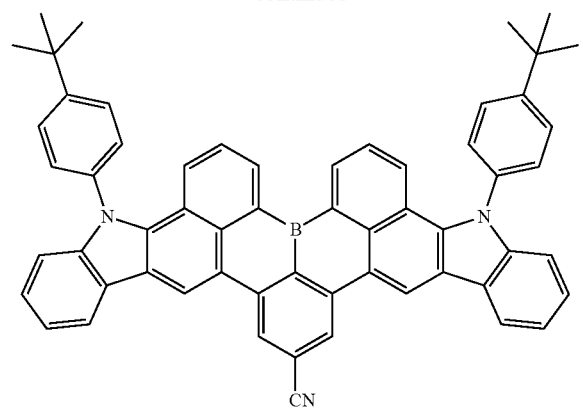
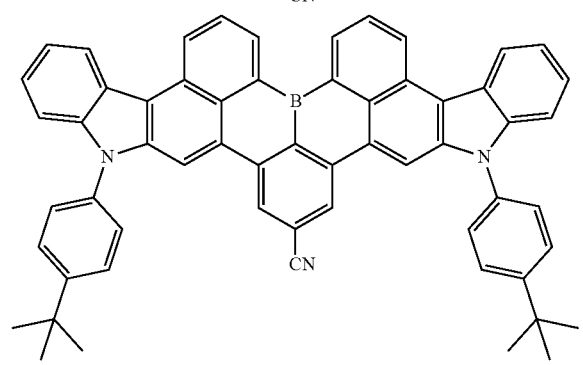
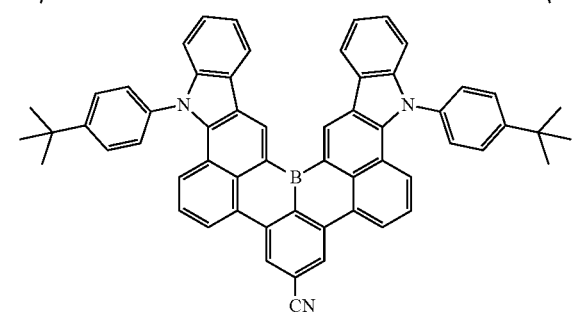
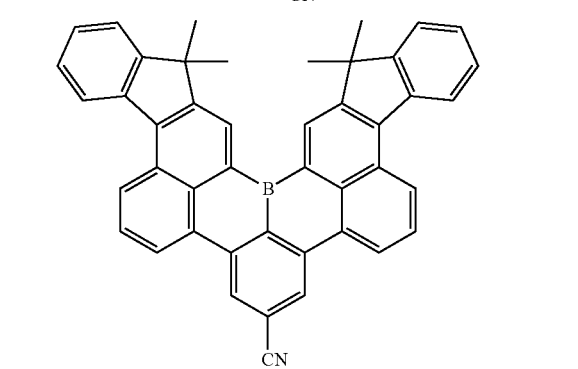
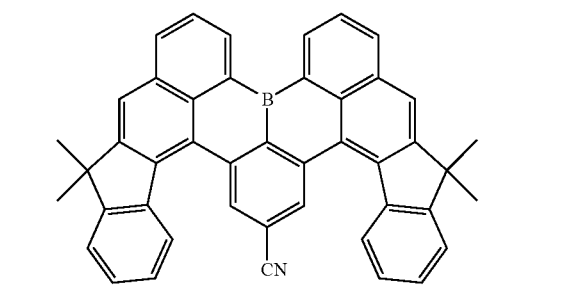
142
-continued
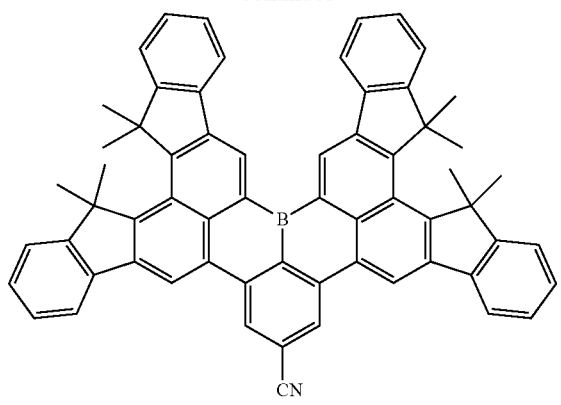
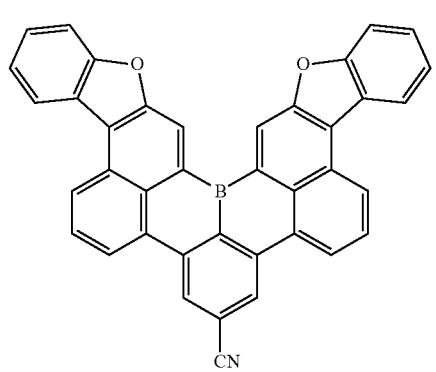
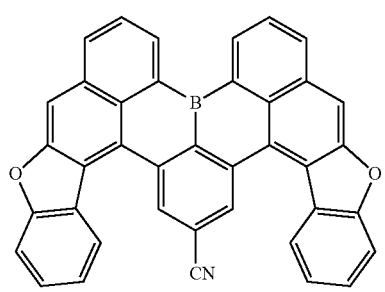
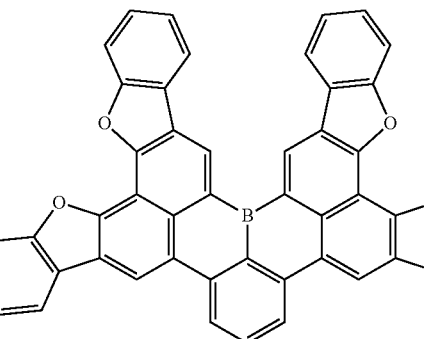

-continued
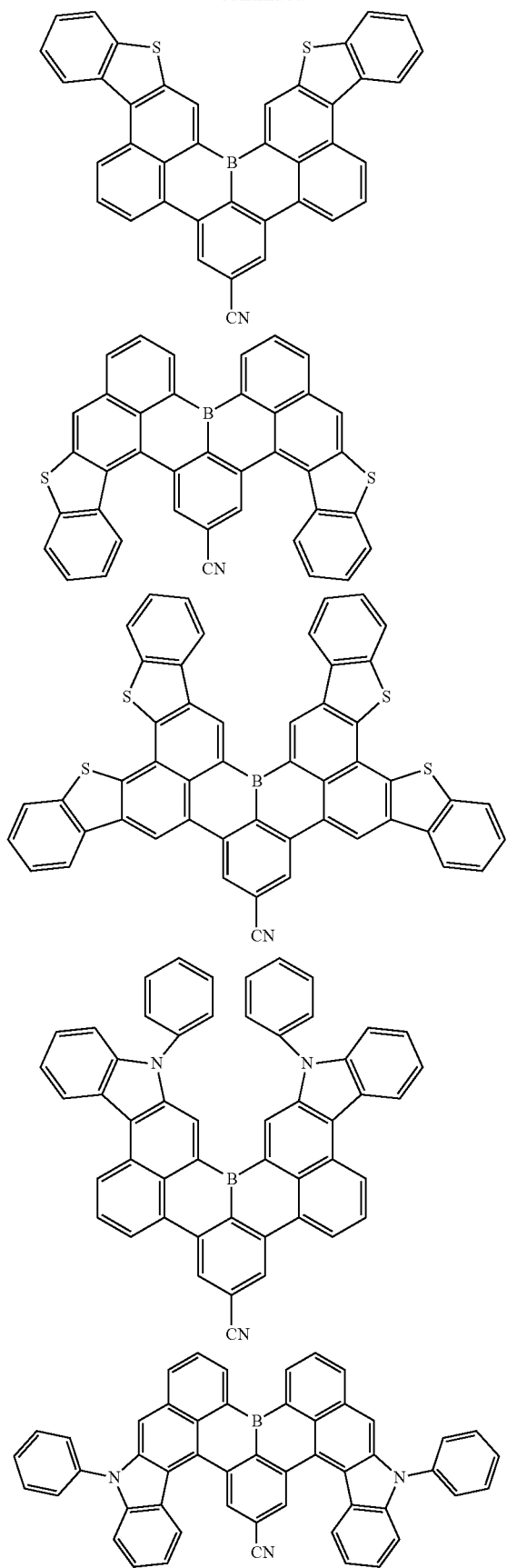
-continued
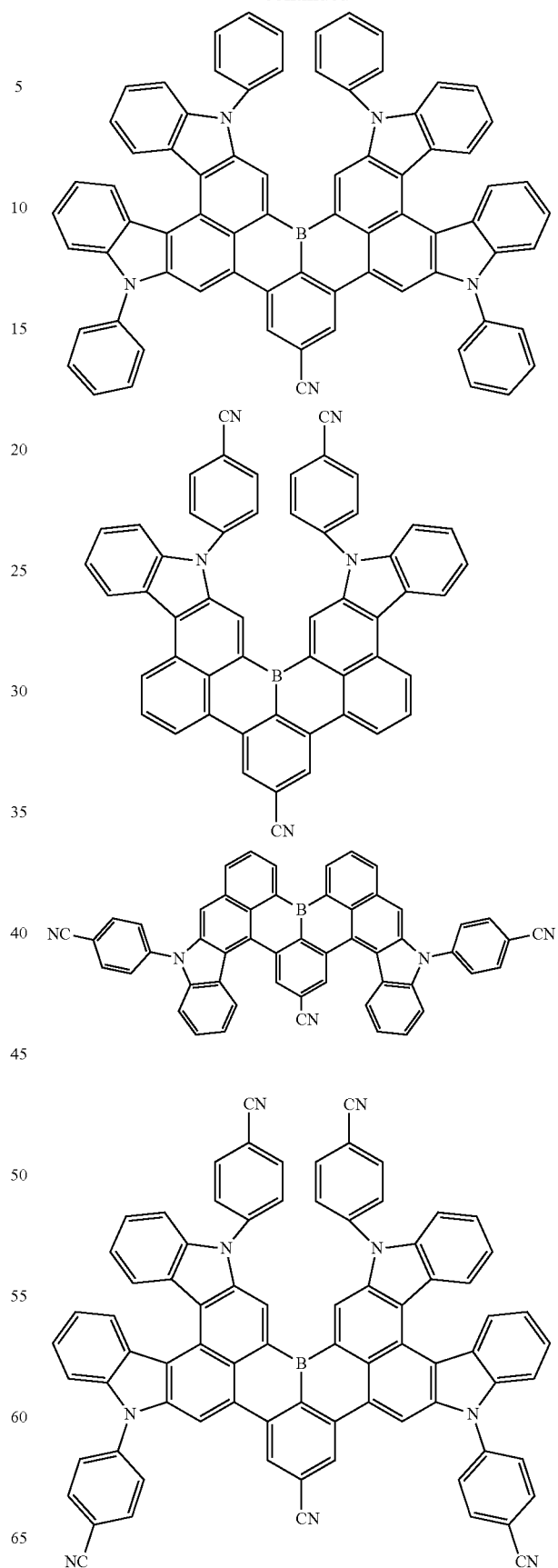

145
-continued
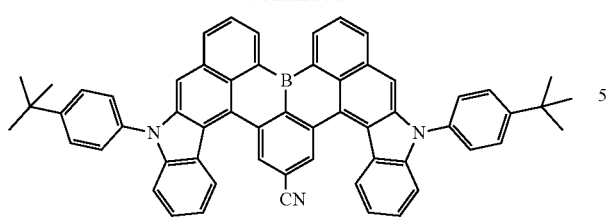
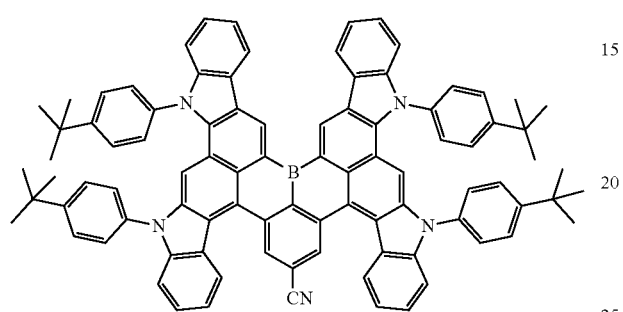
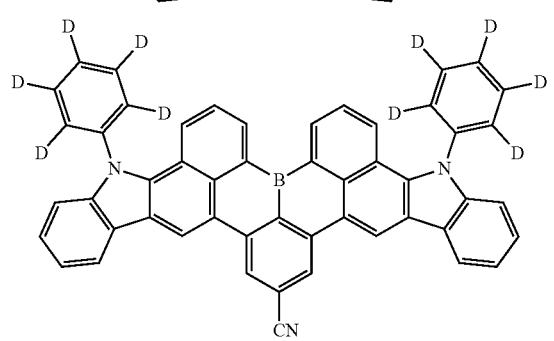
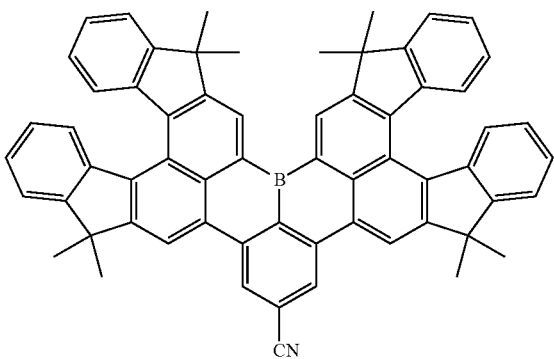
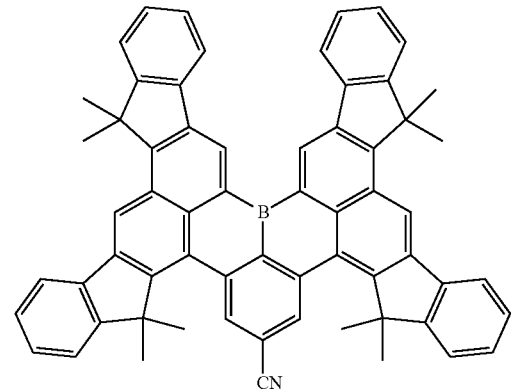
146
-continued
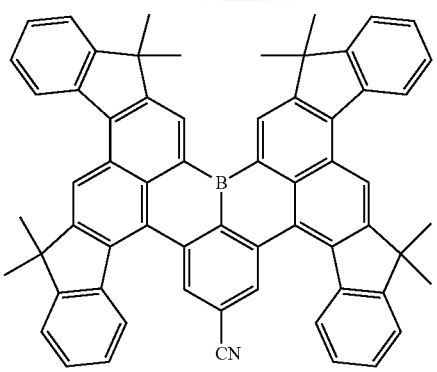
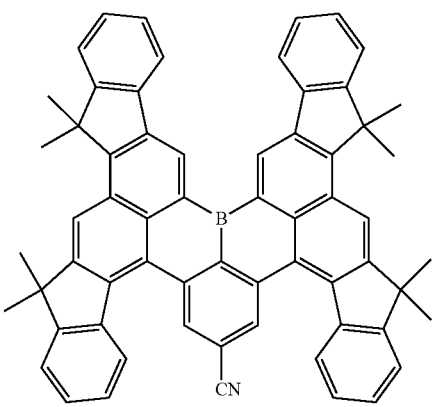
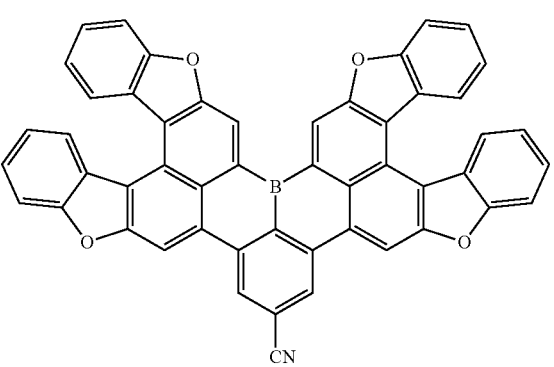
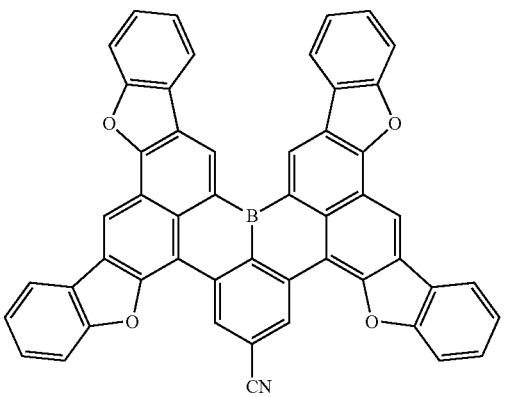

147
-continued
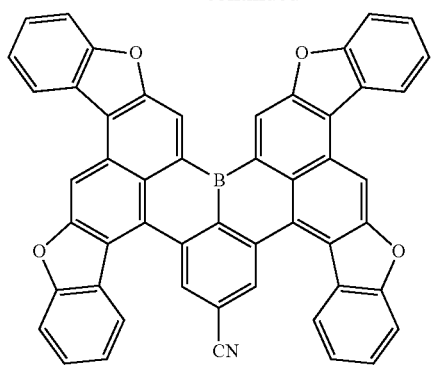
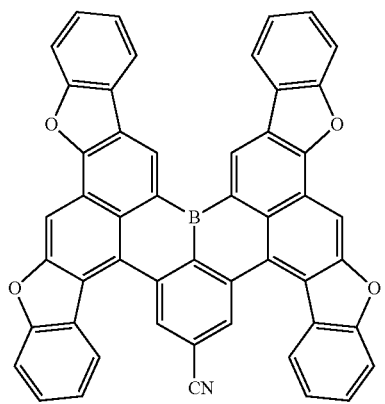
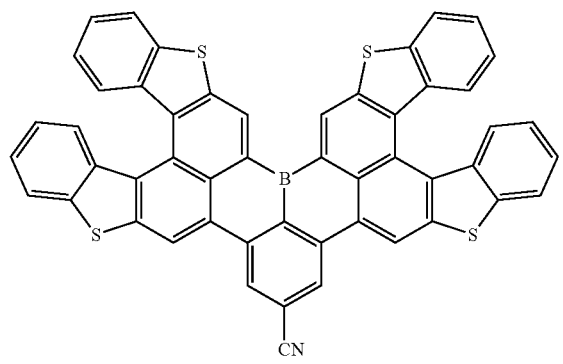
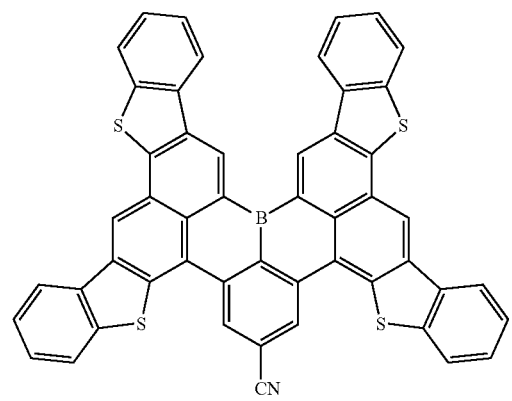
148
-continued
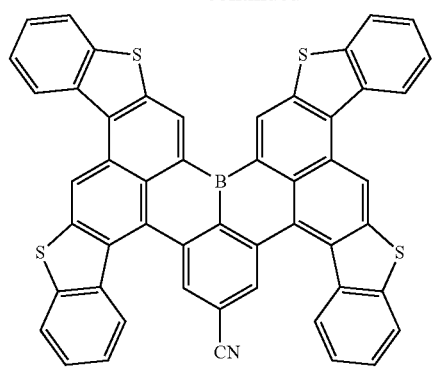
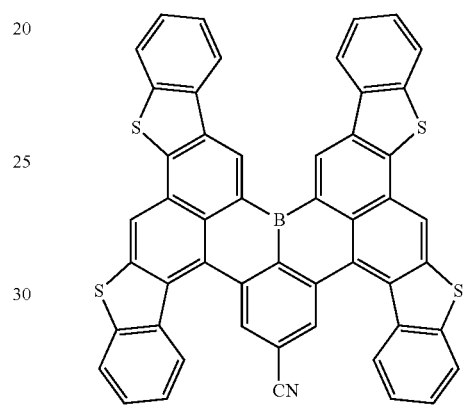
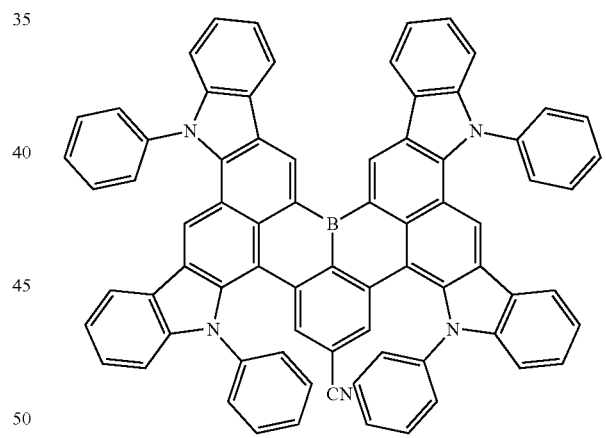
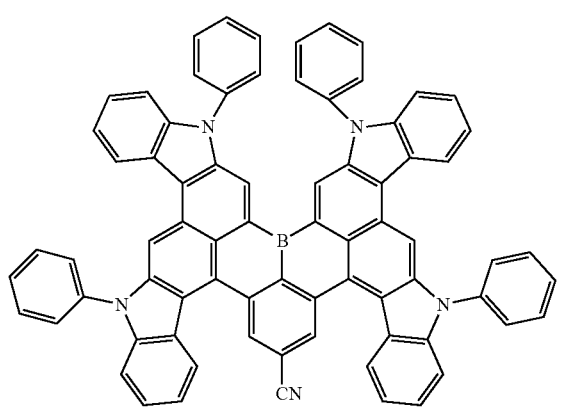

149
-continued
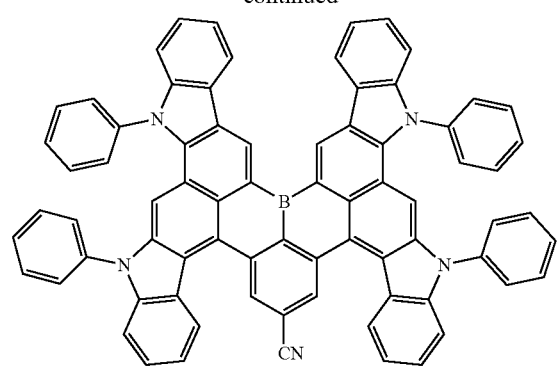
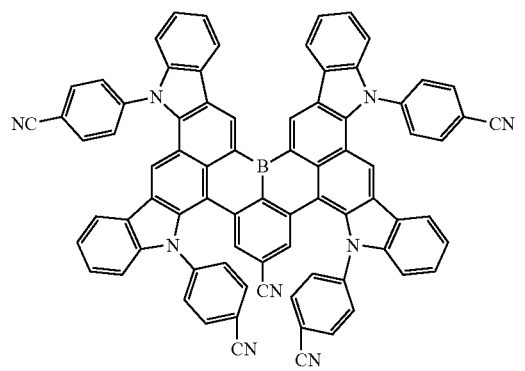
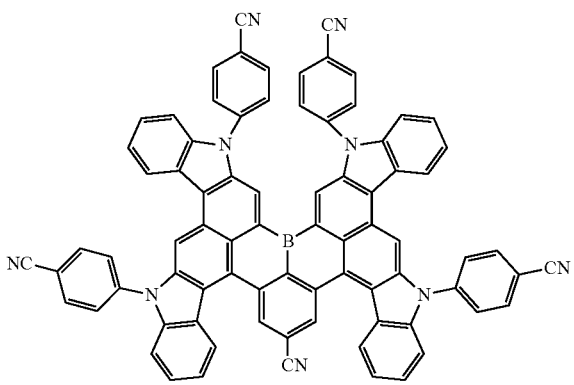
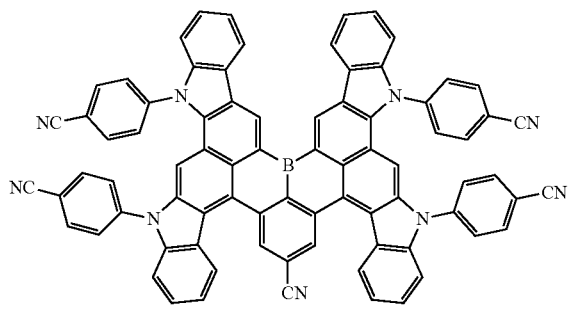
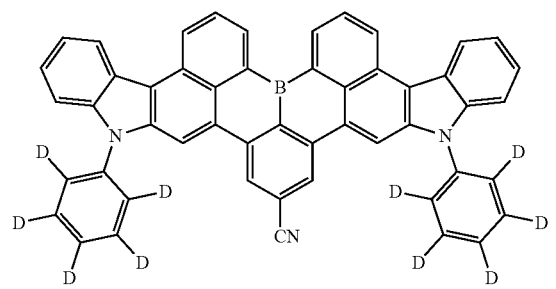
150
-continued
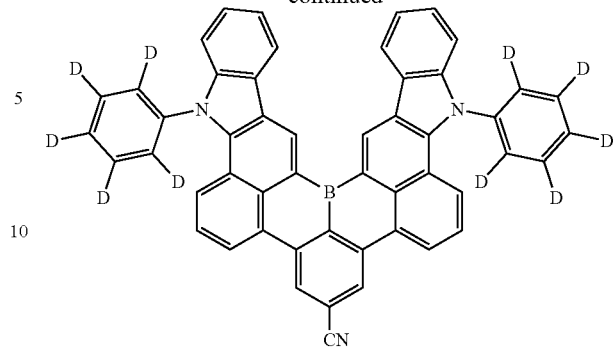
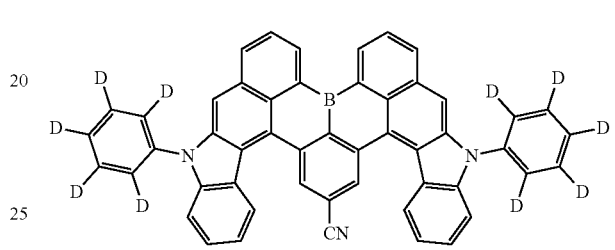
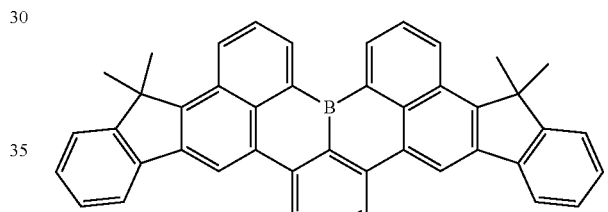
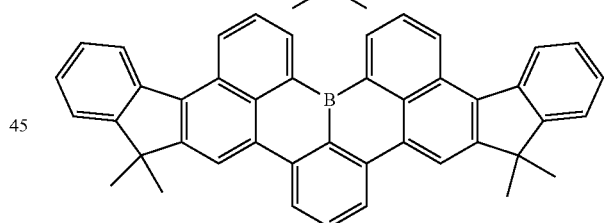
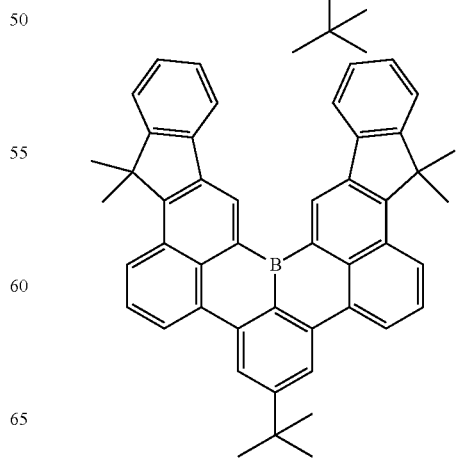

151
-continued
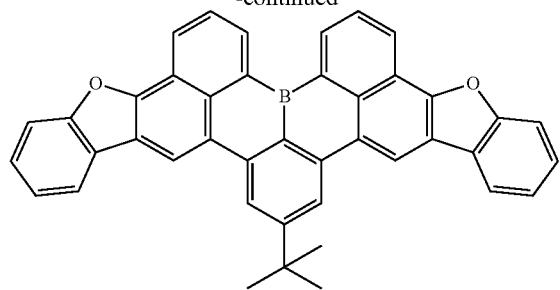
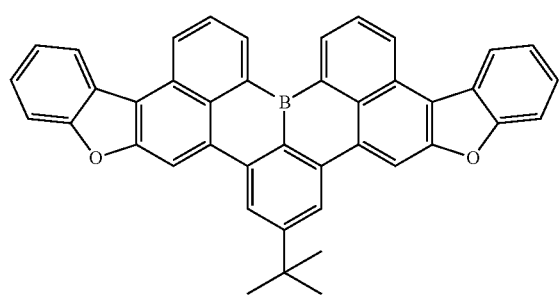
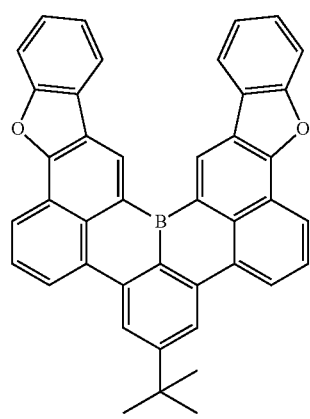
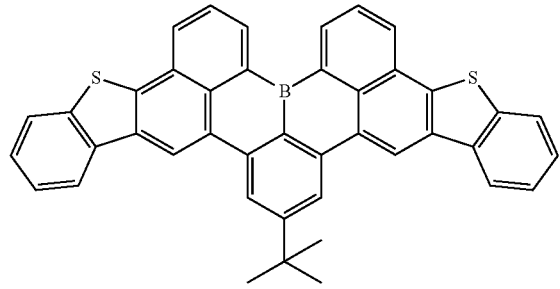
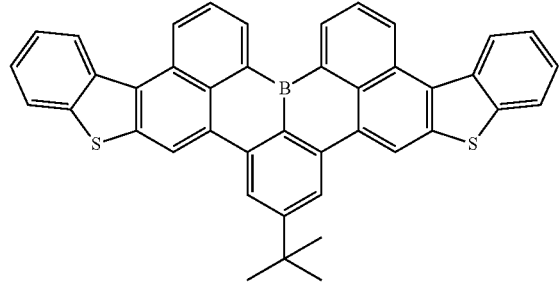
152
-continued
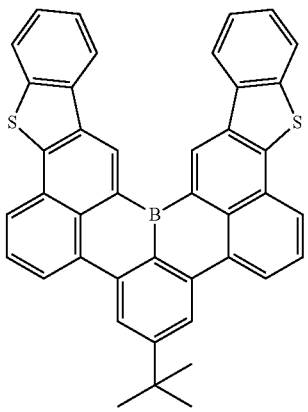
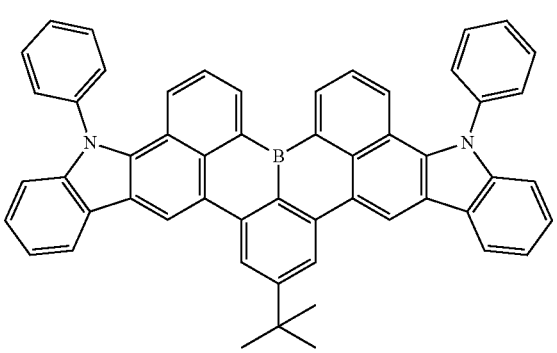
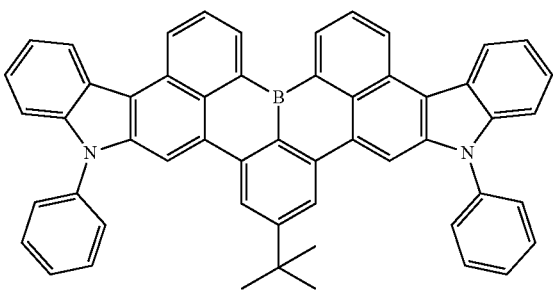
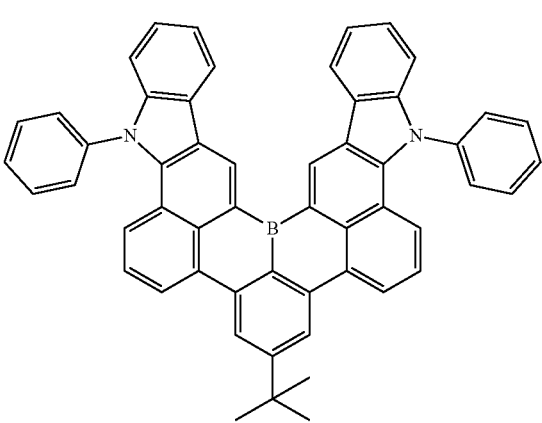

153
-continued
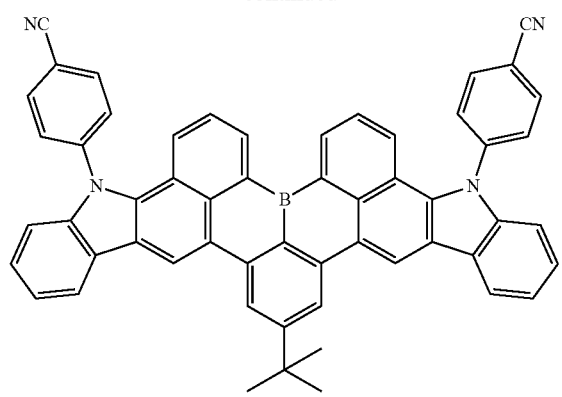
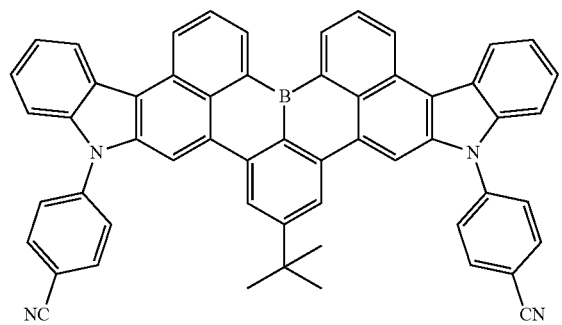
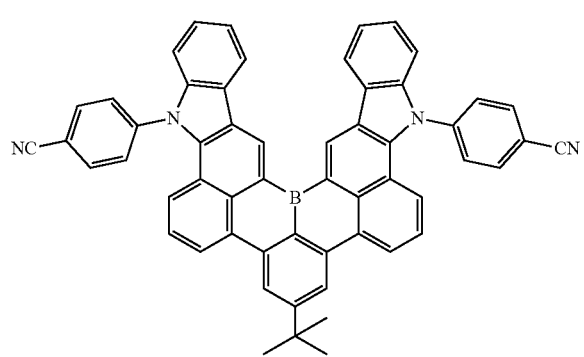
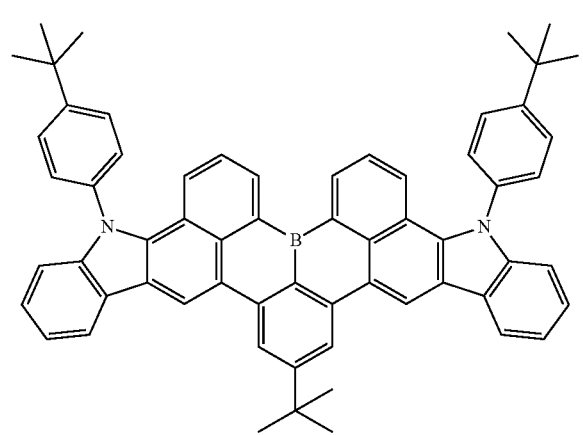
154
-continued
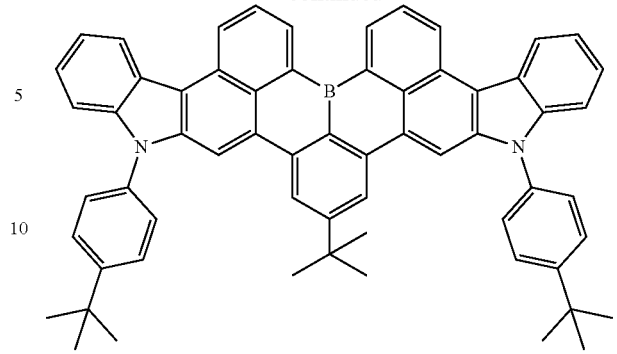
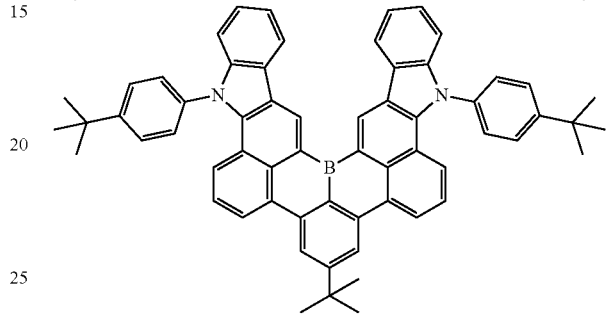
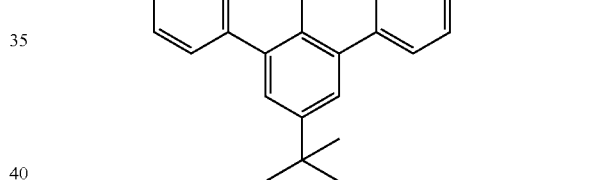
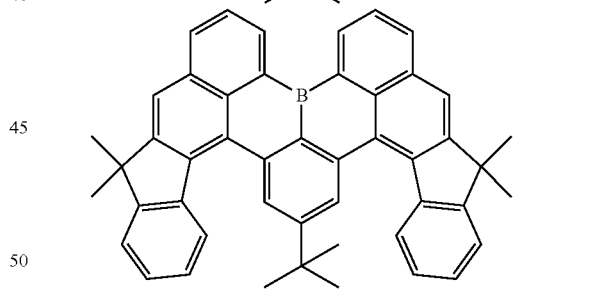
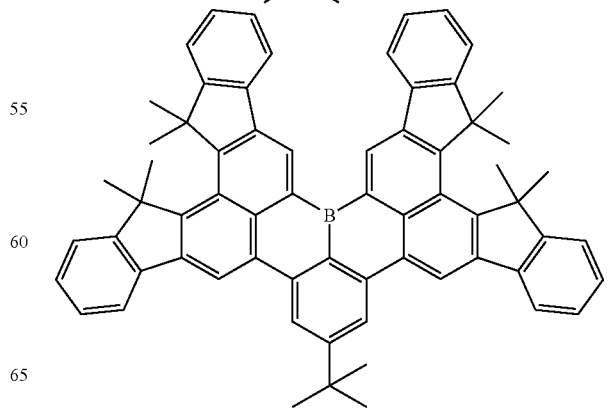

155
-continued
156
-continued
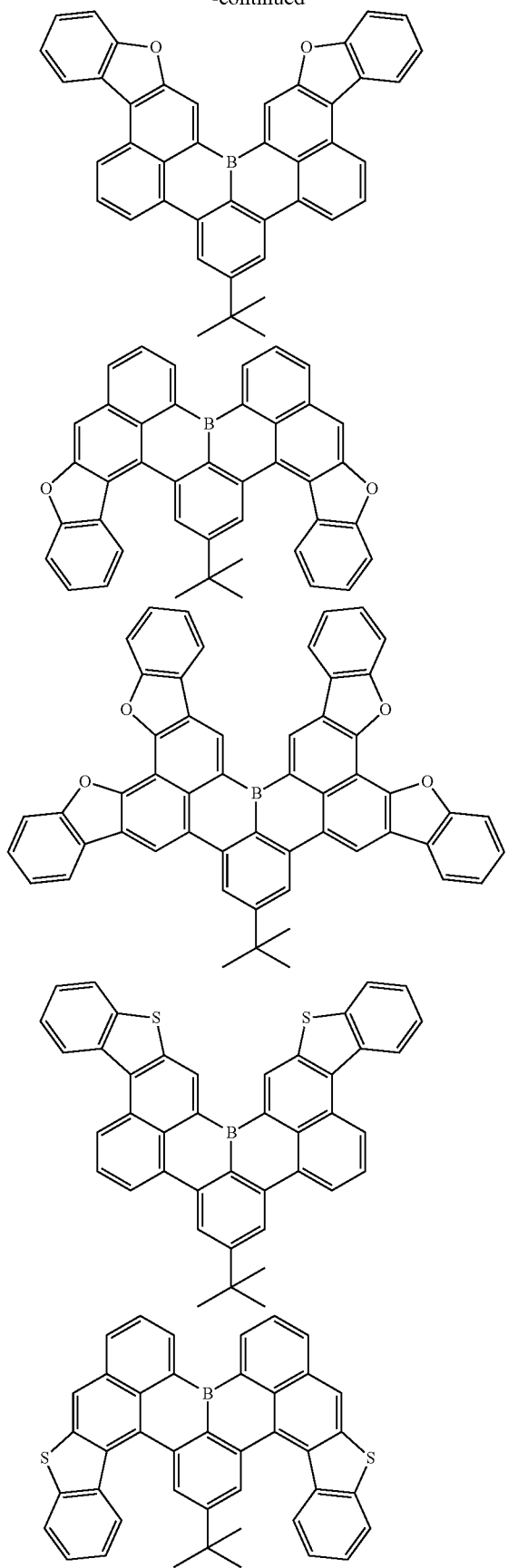
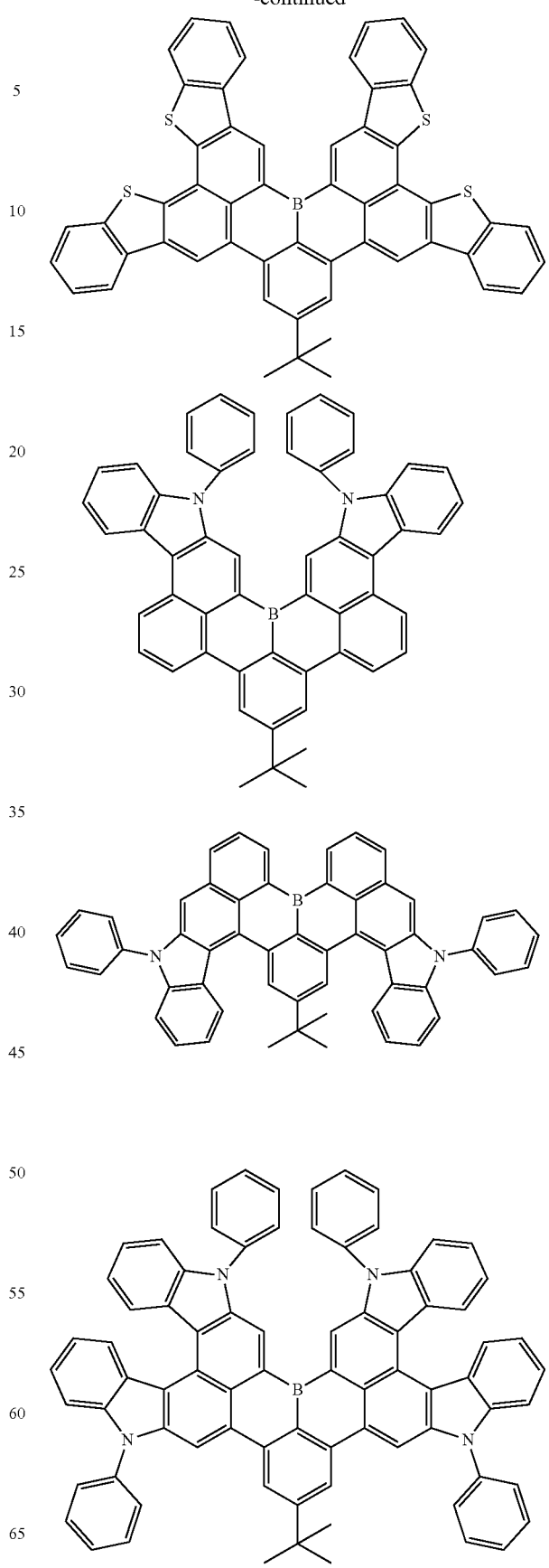

157
-continued
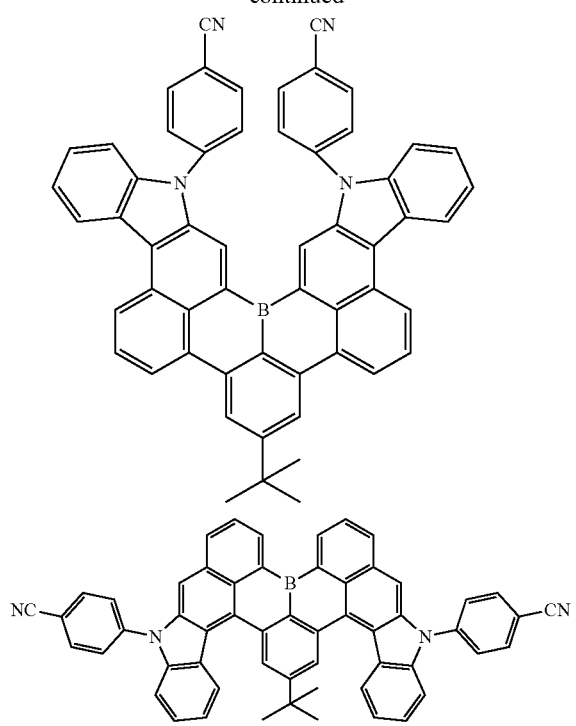
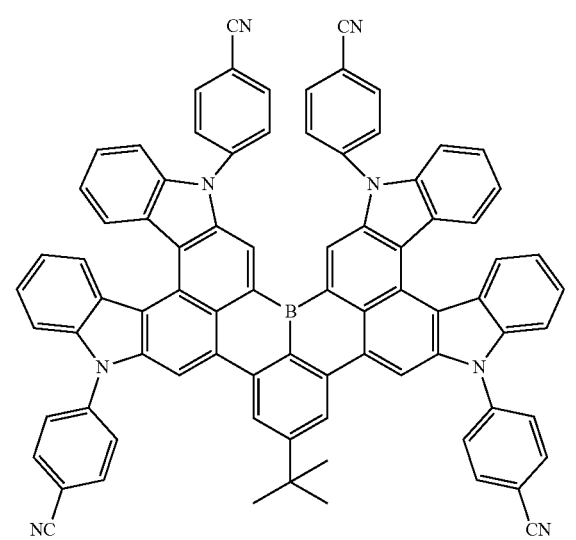
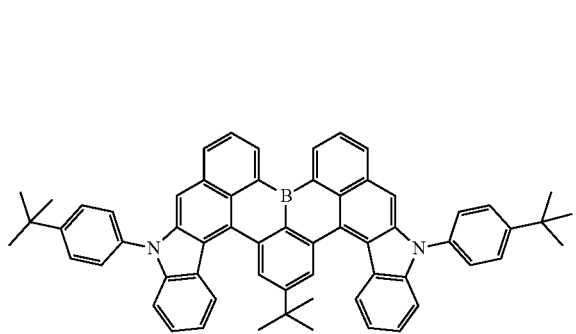
158
-continued
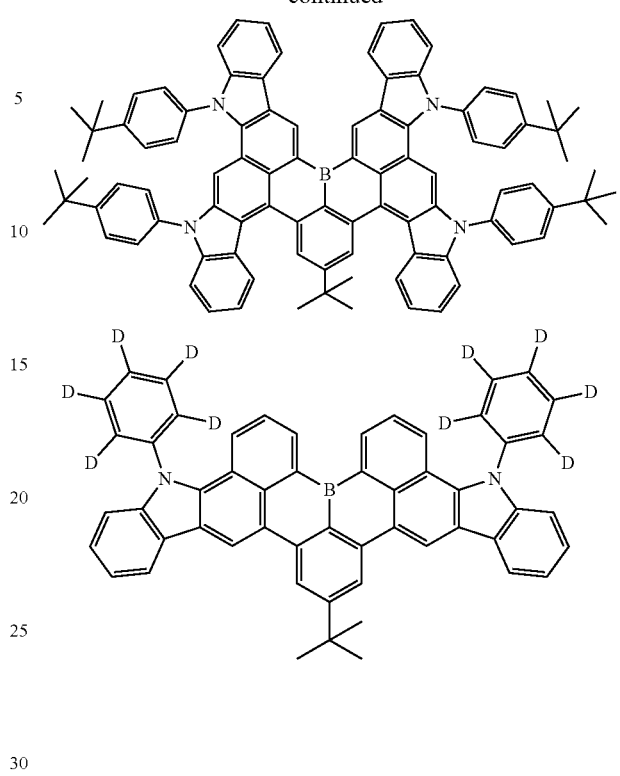
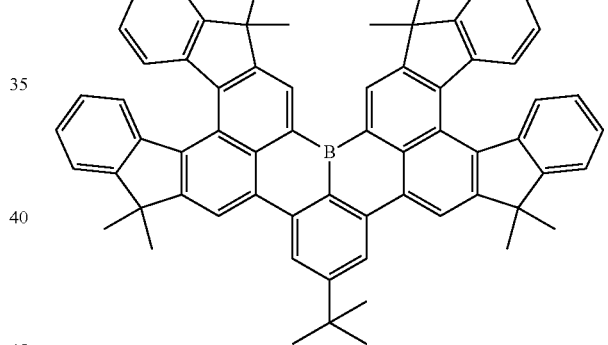
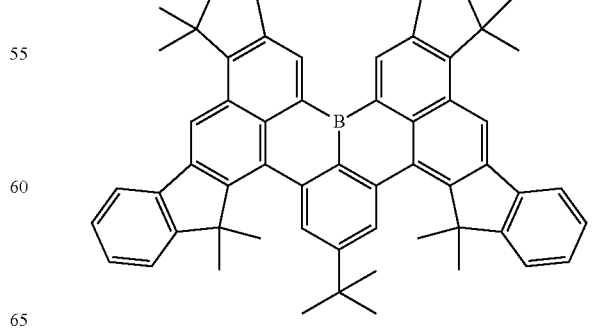

159
-continued
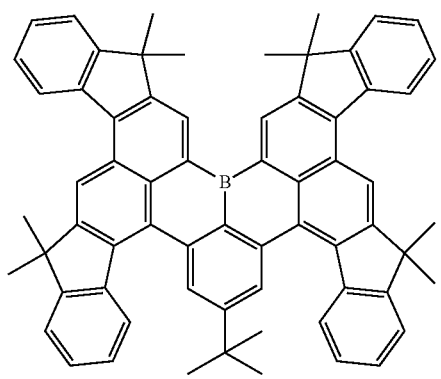
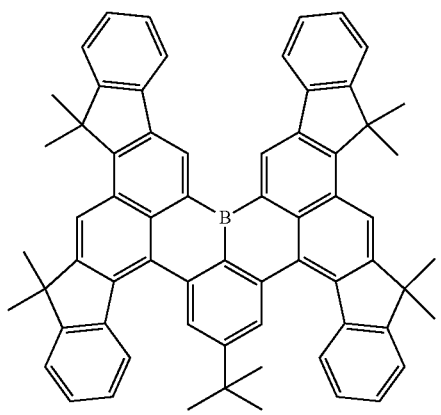
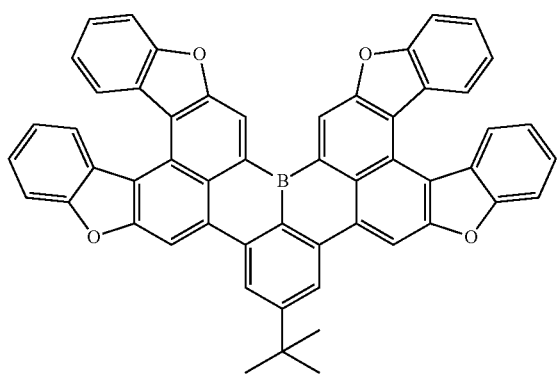
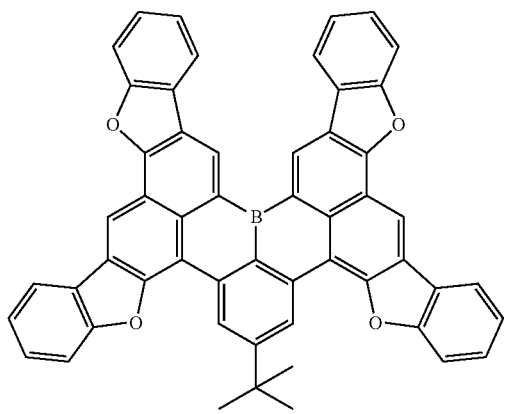
160
-continued
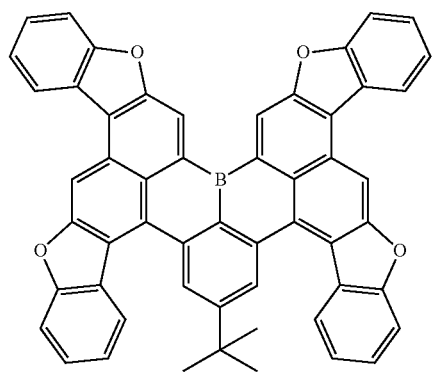
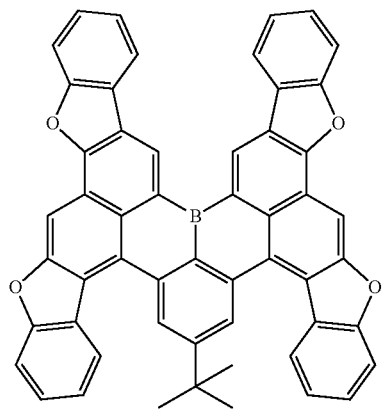
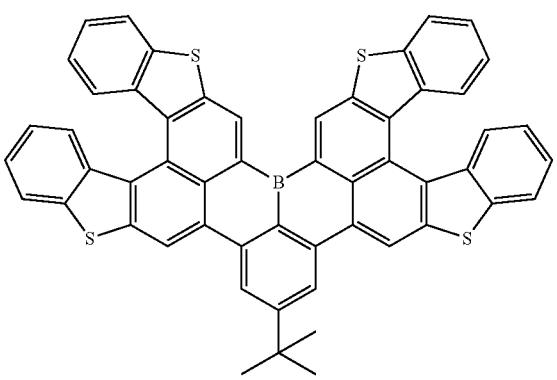
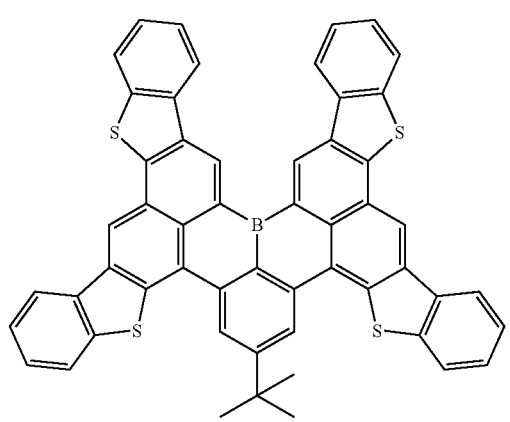

161
-continued
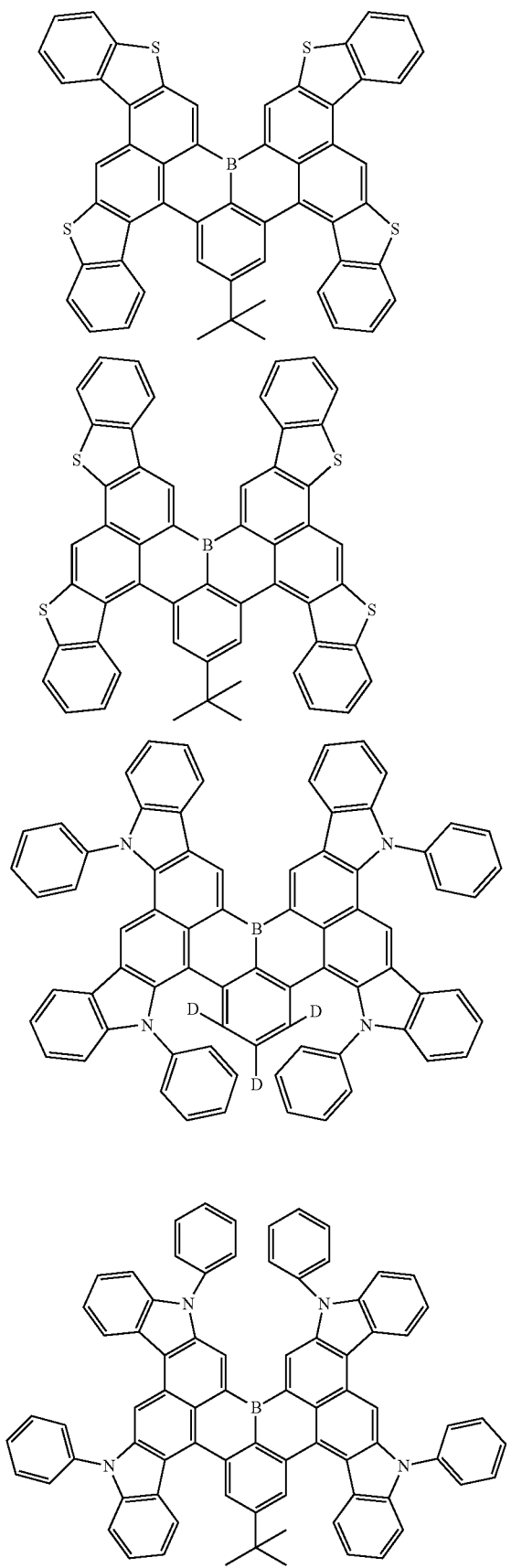
162
-continued
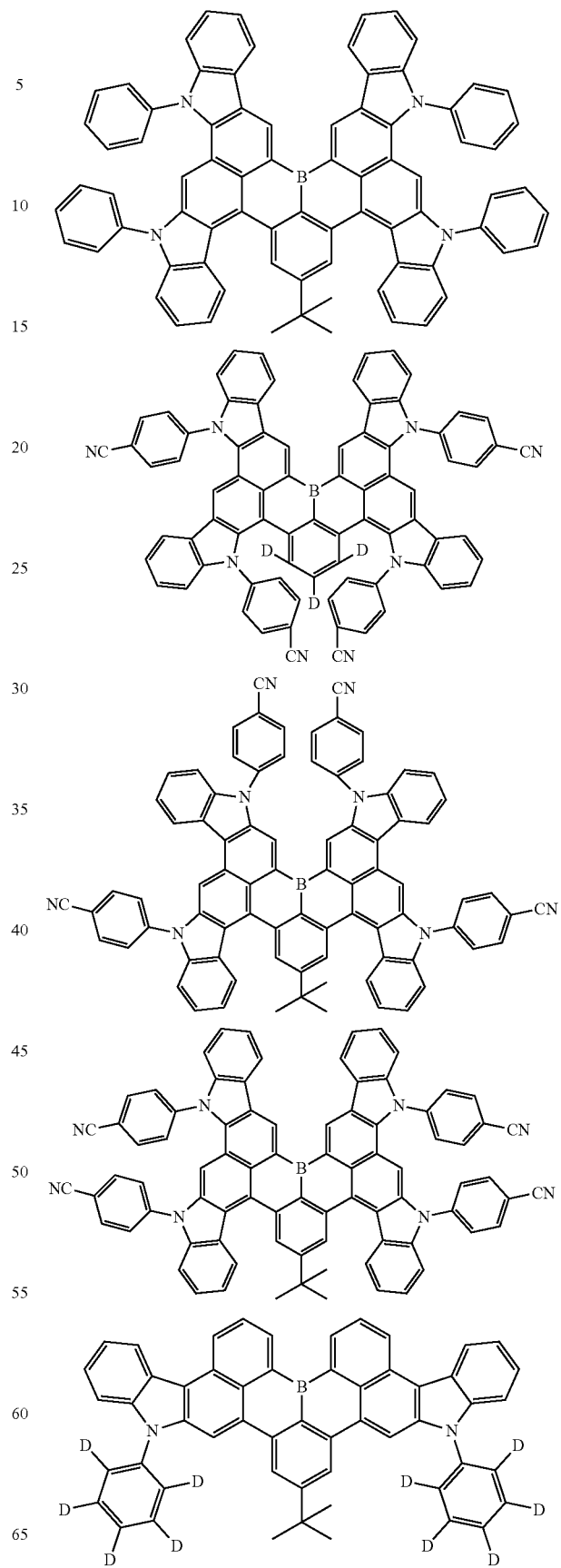

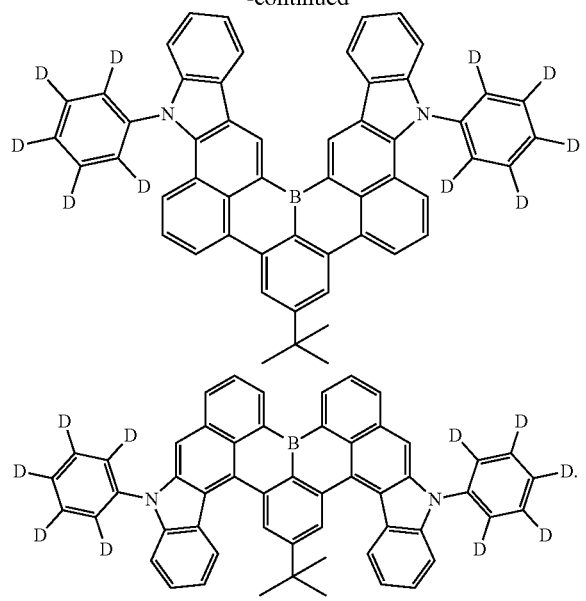

8. An organic light emitting device comprising:
a first electrode;
a second electrode facing the first electrode; and
at least one organic material layer interposed between the first electrode and the second electrode,
wherein the at least one organic material layer comprises the compound of claim 1.

9. The organic light emitting device of claim 8, wherein:
the organic material layer comprises a light emitting layer, and
the light emitting layer comprises the compound.

10. The organic light emitting device of claim 8, wherein:
the organic material layer comprises an electron injection layer, an electron transport layer or an electron injection and transport layer, and
the electron injection layer, the electron transport layer or the electron injection and transport layer comprises the compound.

11. The organic light emitting device of claim 8, wherein:
the organic material layer comprises a hole injection layer, a hole transport layer or a hole injection and transport layer, and
the hole injection layer, the hole transport layer or the hole injection and transport layer comprises the compound.

* * * * *